(12) United States Patent
Maly

(10) Patent No.: US 8,259,286 B2
(45) Date of Patent: Sep. 4, 2012

(54) LITHOGRAPHY AND ASSOCIATED METHODS, DEVICES, AND SYSTEMS

(75) Inventor: Wojciech P. Maly, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 381 days.

(21) Appl. No.: 11/793,742

(22) PCT Filed: Dec. 21, 2005

(86) PCT No.: PCT/US2005/046876
§ 371 (c)(1),
(2), (4) Date: Oct. 15, 2007

(87) PCT Pub. No.: WO2006/069340
PCT Pub. Date: Jun. 29, 2006

(65) Prior Publication Data
US 2008/0137051 A1      Jun. 12, 2008

Related U.S. Application Data

(60) Provisional application No. 60/637,795, filed on Dec. 21, 2004, provisional application No. 60/686,011, filed on May 31, 2005.

(51) Int. Cl.
G03B 27/42        (2006.01)
G03B 27/54        (2006.01)
(52) U.S. Cl. ............................................. 355/53; 355/67
(58) Field of Classification Search .................... 355/53, 355/55, 67; 250/548
See application file for complete search history.

(56) References Cited

U.S. PATENT DOCUMENTS 5,343,271 A  *  8/1994  Morishige ...................... 355/53
5,840,451 A     11/1998  Moore
6,016,185 A  *  1/2000  Cullman et al. ................ 355/52
(Continued)

FOREIGN PATENT DOCUMENTS

EP          0 310 357 A2        4/1989
(Continued)

OTHER PUBLICATIONS

Bin Yu et al.: "FinFET Scaling to 10nm gate length", International Electron Devices Meeting 2002. IEDM. Technical Digest. San Francisco, CA, Dec. 8-11, 2002, New York, NY: IEEE, US, Dec. 8, 2002, pp. 251-254, XP010626034 ISBN: 0-7803-7462-2.

(Continued)

*Primary Examiner* — Hung Henry Nguyen
(74) *Attorney, Agent, or Firm* — Dennis M. Carleton; Fox Rothschild LLP

(57) ABSTRACT

An apparatus for forming an energy pattern on a target, comprising a projector including a first row of spaced-apart energy outlets arranged in a first pattern, a second row of spaced apart energy outlets arranged in a second pattern, wherein the first pattern is different than the second pattern, and comprising a platform on which the target can be mounted, a motor and a controller. A method of forming a pattern in a layer of energy-sensitive material, comprising projecting a first energy pattern onto the energy-sensitive material, moving the first energy pattern relative to the layer of energy-sensitive material, projecting a second energy pattern onto the energy-sensitive material, wherein the second energy pattern is different than the first energy pattern, and moving the second energy pattern relative to the layer of energy-sensitive material.

20 Claims, 101 Drawing Sheets

U.S. PATENT DOCUMENTS

| | | | |
|---|---|---|---|
| 6,424,404 B1 * | 7/2002 | Johnson | 355/44 |
| 6,458,662 B1 | 10/2002 | Yu | |
| 6,475,869 B1 | 11/2002 | Yu | |
| 6,498,685 B1 | 12/2002 | Johnson | |
| 6,545,746 B1 * | 4/2003 | Nishi | 355/53 |
| 6,549,270 B1 * | 4/2003 | Ota | 355/55 |
| 6,611,029 B1 | 8/2003 | Ahmed | |
| 6,753,131 B1 | 6/2004 | Rogers et al. | |
| 6,813,000 B1 * | 11/2004 | Nishi | 355/53 |
| 6,818,389 B2 | 11/2004 | Fritze et al. | |
| 6,960,804 B1 | 11/2005 | Yang | |
| 6,998,301 B1 | 2/2006 | Yu | |
| 7,388,663 B2 * | 6/2008 | Gui | 356/401 |
| 7,414,701 B2 * | 8/2008 | Kochersperger | 355/55 |
| 7,965,380 B2 * | 6/2011 | Bleeker et al. | 355/69 |
| 2002/0106588 A1 | 8/2002 | Lai | |
| 2004/0110092 A1 | 6/2004 | Lin | |
| 2004/0145019 A1 | 7/2004 | Dakshina-Murthy | |
| 2004/0209463 A1 | 10/2004 | Kim | |
| 2005/0014318 A1 | 1/2005 | Manger | |
| 2005/0104091 A1 | 5/2005 | Tabery | |
| 2005/0145843 A1 | 7/2005 | Yin | |
| 2005/0145938 A1 | 7/2005 | Lin | |
| 2005/0153485 A1 | 7/2005 | Ahmed | |
| 2005/0156202 A1 | 7/2005 | Rhee | |
| 2005/0224786 A1 | 10/2005 | Lin | |
| 2005/0253193 A1 | 11/2005 | Chen | |
| 2005/0263821 A1 | 12/2005 | Cho | |
| 2006/0003526 A1 | 1/2006 | Brederlow | |
| 2006/0084211 A1 | 4/2006 | Yang | |

FOREIGN PATENT DOCUMENTS

| | | |
|---|---|---|
| EP | 0 310 357 A3 | 4/1989 |
| EP | 0310357 A | 4/1989 |
| EP | 0 347 332 A2 | 12/1989 |
| EP | 0 347 332 A3 | 12/1989 |
| EP | 0347332 A | 12/1989 |
| EP | 0 670 597 A2 | 9/1995 |
| EP | 0 670 597 A3 | 9/1995 |
| EP | 0670597 A | 9/1995 |
| EP | 1 045 288 A2 | 10/2000 |
| EP | 1 045 288 A3 | 10/2000 |
| EP | 1045288 A2 | 10/2000 |
| EP | 1045288 A3 | 5/2001 |
| EP | 1643560 A1 | 4/2006 |
| WO | WO-99/46769 | 9/1999 |
| WO | WO 9946769 | 9/1999 |

OTHER PUBLICATIONS

PCT "Notification Concerning Transmittal of International Preliminary Report on Patentability" for International Application No. PCT/US2007/011630, mailed Nov. 27, 2008.
PCT "International Preliminary Report on Patentability" for International Application No. PCT/US2007/011630, mailed Nov. 27, 2008.
PCT "Written Opinion of the International Searching Authority" for International Application No. PCT/US2007/011630, mailed Nov. 27, 2008.
PCT "Notification of Transmittal of The International Search Report and the Written Opinion of the International Searching Authority, or the Declaration" for International Application No. PCT/US2007/011630, mailed May 13, 2008.
PCT "International Search Report" for International Application No. PCT/2007/011630, mailed May 13, 2008.
PCT "Written Opinion of the International Seaching Authority" for International Application No. PCT/2007/011630, mailed May 13, 2008.
PCT "Invitation to Pay Additional Fees" for International Application No. PCT/US2007/011630, mailed Jan. 14, 2008.
PCT "Notification Concerning Transmittal of International Preliminary Report on Patentability" for International Application No. PCT/US2005/046876, mailed Jul. 5, 2007.
PCT "International Preliminary Report on Patentability" for International Application No. PCT/US2005/046876, mailed Jul. 5, 2007.
PCT "Written Opinion of the International Searching Authority" for International Application No. PCT/US2005/046876, mailed Jul. 5, 2007.
PCT "Notification of Transmittal of the International Search Report and the Written Opinion of the International Searching Authority, or the Declaration" for International Application No. PCT/US2005/046876, mailed Aug. 17, 2006.
PCT "International Search Report" for International Application No. PCT/US2005/046876, mailed Aug. 17, 2006.
PCT "Written Opinion of the International Searching Authority" for International Application No. PCT/US2005/046876, mailed Aug. 17, 2006.
PCT "Notification Concerning Transmittal of International Preliminary Report on Patentability" for International Application No. PCT/US2005/046878, mailed Jul. 5, 2007.
PCT "International Preliminary Report on Patentability" for International Application No. PCT/US2005/046878, mailed Jul. 5, 2007.
PCT "Written Opinion of the International Searching Authority" for International Application No. PCT/US2005/046878, mailed Jul. 5, 2007.
PCT "Notification of Transmittal of the International Search Report and the Written Opinion of the International Searching Authority, or the Declaration" for International Application No. PCT/US2005/046878, mailed Aug. 18, 2006.
PCT "International Search Report" for International Application No. PCT/US2005/046878, mailed Aug. 18, 2006.
PCT "Written Opinion of the International Searching Authority" for International Application No. PCT/US2005/046878, mailed Aug. 18, 2006.
"PCT Notification of Transmittal of the International Search Report and the Written Opinion of the Internatinoal Searching Authority" for International Application No. PCT/US2005/046876, mailed Aug. 17, 2006.
"PCT International Search Report" for International Application No. PCT/US2005/046876, mailed Aug. 17, 2006.
"PCT Written Opinion of the Internatinoal Searching Authority" for International Application No. PCT/US2005/046876, mailed Aug. 17, 2006.
"PCT Notification of Transmittal of the International Search Report and the Written Opinion of the Internatinoal Searching Authority" for International Application No. PCT/US2005/046878, mailed, Aug. 18, 2006.
"PCT International Search Report" for International Application No. PCT/US2005/046878, mailed, Aug. 18, 2006.
"PCT Written Opinion of the Internatinoal Searching Authority" for International Application No. PCT/US2005/046878, mailed Aug. 18, 2006.

* cited by examiner

Fig. 26

Fig. 29

20×29 = 580    580/8 = 72.5

Fig. 68

Fig. 72

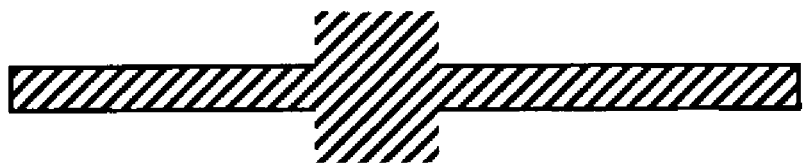
Fig. 75

LITHOGRAPHY AND ASSOCIATED METHODS, DEVICES, AND SYSTEMS

CROSS-REFERENCE TO RELATED APPLICATIONS

This application is a national stage filing of application Ser. No. PCT/2005/046876, filed Dec. 21, 2005, which claims priority from U.S. Provisional Patent Application Ser. No. 60/637,795, filed Dec. 21, 2004, and U.S. Provisional Patent Application Ser. No. 60/686,011, filed May 31, 2005.

STATEMENT REGARDING FEDERALLY-SPONSORED RESEARCH AND DEVELOPMENT

Not Applicable.

FIELD OF THE INVENTION

The present invention is directed generally to lithography and, more specifically, to methods of performing lithography, devices and systems for performing lithography, and devices and systems which are formed by or which utilize components which are formed by lithography.

BACKGROUND OF THE INVENTION

The fabrication of integrated circuits is typically done by building successive layers on top of each other. Many process steps are involved in fabrication including deposition, oxidation, planarization, etching, diffusion, implantation, and lithography. Lithography is an important part of the fabrication process and is used to transfer a desired pattern onto a surface. Conventional lithography typically uses a mask and photosensitive material known as "photoresist" to create the desired pattern. However, lithography may be used in many different ways, such as with or without photoresist, with or without some other energy-sensitive material, and in fabricating technologies such as semiconductors, liquid crystal displays, and micro-electromechanical systems.

The continuous and significant advances in the semiconductor industry have been due, in part, to many technical advances, such as improved lenses, improved photoresist materials, improved chemical-mechanical polishing, and others. The biggest improvements, however, may be in the area of lithography such as with the use of increasingly shorter wavelengths in the lithographic process. In general, shorter wavelengths provide better resolution but they create other problems and are more expensive to implement. Furthermore, physical limitations are presenting problems for the continued reduction in wavelengths in lithography.

Several solutions are being investigated for continued performance advances in semiconductor fabrication, such as electron projection lithography, immersion lithography, and extreme ultraviolet lithography. However, the proposed solutions require major advances in technology, such as light sources, resist materials, masks, and process controls. Furthermore, the costs of lithography and other fabrication processes and tools have increased dramatically, and the research and development required for major advances in various technologies will add to the costs.

U.S. Pat. No. 6,818,389, issued to Fritze et al, discloses a system and method in which repetitive structures are formed on a substrate and then a trim mask is used to modify the repetitive structure to a desired structure. This teaching, however, has several drawbacks. For example, at column 9, lines 57-67, the process requires a separate photoresist layer for each application of the repetitive structure.

Accordingly, there is a need for improved lithographic processes, particularly for processes which can offer high precision and cost savings. Those and other advantages of the present invention will be described in more detail hereinbelow.

BRIEF SUMMARY OF THE INVENTION

It has been found that new methods, devices, and systems of lithography are possible. These new methods, devices, and systems overcome many of the problems inherent in the prior art. For example, it is possible to produce high precision features and pattern edges and also reduce the overall lithographic cost.

In one embodiment of the present invention, a single photoresist layer can be exposed to two or more different patterns using, for example, a highly repetitive pattern and a subsequent pattern which intentionally modifies the repetitive pattern into a more useful form. The patterns may be formed, for example, with masks, with a maskless process, or with a combination of mask and maskless processes. The highly repetitive pattern may be formed, for example, with a high precision process and the modification pattern may be formed with a less precise process, while still providing high quality pattern edges at the performance-critical locations. The present invention shows promise with relatively simple techniques, high quality pattern edges at the performance-critical locations, the opportunity to reuse some of the patterns, and reduced costs.

In another embodiment, the present invention includes a method which intentionally produces patterns having a plurality of different levels of precision. For example, the method may produce patterns with different precision for different edges of a pattern in order to, for example, decrease processing complexities, design complexities, and cost.

In another embodiment, the present invention includes a method that uses a plurality of different exposure energy sources to produce a pattern. Different exposure energy sources include, but are not limited to, light of different wavelengths, E-beam, x-ray, and other energy sources.

In another embodiment, the present invention includes one or more systems, devices, or components formed utilizing at least one of the methods described herein.

In another embodiment, the present invention includes one or more systems, devices, or components with performance-critical layout edges which are elements of "basic patterns" (also called "B-patterns"). B-patterns may be, for example, formed by the superposition of at least two orthogonal scans of any combination of exposed and unexposed strip shape regions. B-patterns are described in more detail hereinbelow.

In another embodiment, the present invention includes maskless fabrication and associated systems and devices using one or more scans of the same or different patterns to produce B-patterns or other patterns without masks. Maskless fabrication may be performed, for example, with masks and/or scanning projectors including outlets. Many variations of the outlets are possible, such as outlets which are controlled individually or in groups of two or more, outlets of various size, spacing, and other characteristics, and different types of outlets, such as energy outlets or material outlets. Maskless fabrication may include, for example, forming regular patterns and subsequently modifying the regular pattern. Several variations of maskless fabrication will be described herein, including those with constant pitch patterns and those with variable pitch patterns. In addition, fabrication may include selectively applying elements which form the pattern, such as by forming "dashed" elements in the pattern.

In another embodiment, the present invention includes multiple exposure lithography in the form of maskless, orthogonally scanned, lithography patterns. Some variations of the maskless, orthogonally scanned, lithography patterns include multiple scans with different encoded spaces, widths, energies, and other characteristics.

In another embodiment, the present invention includes devices and systems including one or more components utilizing at least one of the methods described herein.

In another embodiment, the present invention includes fabrication devices and systems for performing one or more of the methods described herein.

The present invention has the potential to deliver a minimum feature size which is nearly one generation ahead of the feature size of the newest mask-based lithography. The present invention also has the potential to be less expensive than, for example, mask-based state-of-the-art technology which is currently in a volume production stage of maturity. Although, at least initially, some embodiments of the present invention may result in a density of utilized transistors which is less than that which can be produced by the newest mask-based lithography, the potential cost-savings and other benefits of the present invention offer many advantages over the prior art.

Many variations are possible with the present invention. For example, the B-patterns do not necessarily need to be performed prior to forming the "modification" pattern. Furthermore, more than one B-pattern may be used, more than one modification pattern may be used, and both mask and maskless processed may be used. These and other teachings, variations, and advantages of the present invention will become apparent from the following detailed description of the invention.

BRIEF DESCRIPTION OF THE SEVERAL VIEWS OF THE DRAWING

Embodiments of the present invention will now be described, by way of example only, with reference to the accompanying drawings for the purpose of illustrating the embodiments, and not for purposes of limiting the invention, wherein:

FIGS. 23-38 illustrate process steps for forming a buffer according to the present invention;

FIGS. 67 and 68 illustrate patterns from example number 2 which may utilize the embodiment of the scanning projector illustrated in FIG. 66

FIG. 72 illustrates a desired polysilicon pattern;

FIG. 75 illustrates one example of a pattern that may be formed with the scanning projector illustrated in FIG. 74;

DETAILED DESCRIPTION OF THE INVENTION

Figure 1:
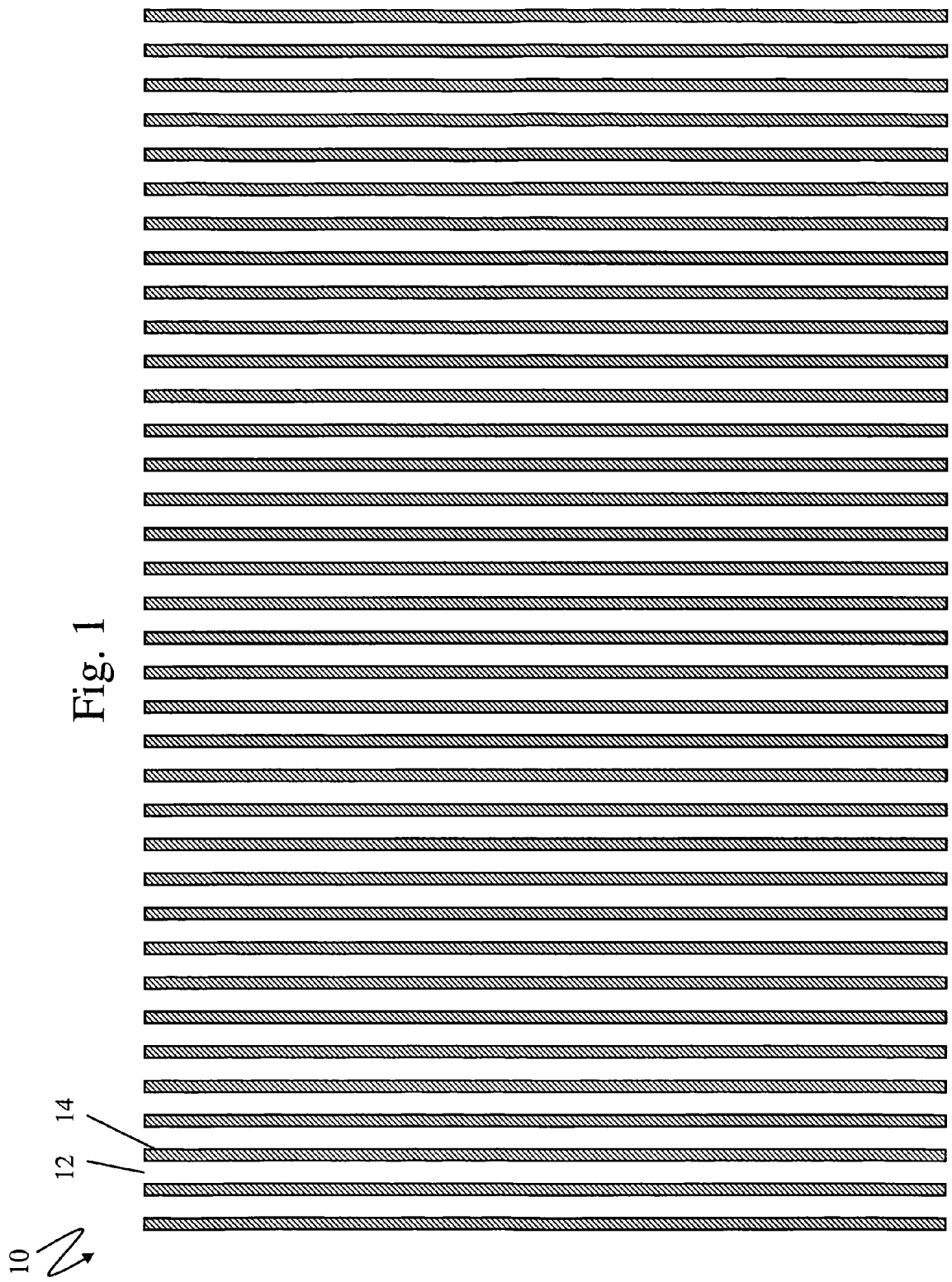
FIGS. 1-3 illustrate examples of B-patterns.

In general, the present invention will be described in terms of the formation of patterns through single and multiple exposure lithography. When used with energy-sensitive material, such as photoresist for example, these are patterns of energy-converted or energy-modified regions in the energy-sensitive material. The patterns of energy-converted or energy-modified regions in the energy-sensitive material may be referred to as "energy patterns". The term "pattern" may be also be used to refer to more general applications. The terms "energy pattern" and "pattern" are also applicable to the energy or other patterns formed by masks and maskless processes and apparatuses, which can be moving or stationary. The present invention will be described in terms of both lithography using masks and "maskless" lithography. To form the various layers of an integrated circuit, process steps other than lithography are required, such as surface cleaning, deposition of various materials, planarization, etching, etc. The details of these processes and other related processes are generally not discussed in detail because they are well known in the prior art.

However, it is anticipated that the present invention will be used in conjunction with such processes and the spirit and scope of the present invention includes such processes. In addition, although the present invention will be generally described in terms of semiconductor wafers, photoresist layers, integrated circuits, and conventional semiconductor fabrication processes, the present invention may also be used with different materials and processes. For example, the present invention may be used with liquid crystal display fabrication, the present invention may be used with microelectromechanical system fabrication, the present invention may be used to form or deposit patterns of materials such as metals, insulators, and dopants, and the present invention may be used with energy-sensitive materials other than photoresist. Those and other variations and modifications of the present invention are possible and contemplated, and it is intended that the specification and claims cover such modifications and variations.

Multiple exposure lithography according to the present invention includes processes in which two or more different patterns are formed into photoresist to produce a composite pattern in the photoresist. For example, one or more repetitive patterns are exposed into photoresist and then one or more subsequent exposures are used to modify or customize the repetitive pattern so as, for example, to make selective disconnects in a repetitive pattern of parallel lines to form circuit interconnects and to assure proper circuit connectivity. The "modifying" steps may be performed, for example, with less precise and less expensive masking techniques while still allowing for high-precision formation of critical pattern edges. In part, because the present invention allows for the use of less precise masks in the "modifying" step, overall costs of the lithography process can be reduced with the present invention.

The present invention may be practiced with masks. For example, one or more masks may be used to form a repetitive pattern, and one or more masks may be used for the "modifying" exposures. For example, high quality masks may be used for the repetitive pattern exposures and lower quality masks may be used for the "modifying" exposures. The term "high quality mask" means a mask which allow for a more precise pattern to be formed, such as a pattern with smaller features, with more consistency, or with other features which allow for a more desirable pattern to be formed. In another example, two or more masks of the same quality may be used for both the repetitive pattern exposure and the "modifying" exposure. It is also possible for higher quality masks to be used for the "modifying" exposure. Alternatively, the present invention may be practiced using "maskless" processes for some or all of the exposures. A "maskless" process may still use a mask of some form, but it is "maskless" in the sense that it does not use a mask in the same sense that conventional semiconductor processes use masks. For example, a projector according to the present invention may be used as a "maskless" process, but the projector may include a mask to assist in the projection of energy patterns onto the photoresist layer or other target. Several examples of maskless techniques are described below. Other techniques that may also be used with the present invention include the use of different wavelengths, E-beam, x-ray, other projection techniques, and combinations of techniques. Two or more different techniques may also be used to form a pattern in a single layer of photoresist.

The repetitive patterns referred to above will be called "basic patterns" or "B-patterns". A small number of B-patterns in combination with "modification" patterns may be used to print a wide variety of integrated circuit patterns. Several examples will be described in which B-patterns and modification patterns will be used to form integrated circuits. The B-patterns are not necessarily specific to a particular integrated circuit, but rather they are patterns that may be used for a wide range of applications in the fabrication of integrated circuits. The B-patterns are modified for use in a particular integrated circuit through the use of "modification" patterns. As such, the B-patterns can be used and reused many times, and thereby offer the potential for significant reductions in costs for the lithographic process.

The present invention can offer cost savings over prior art fabrication processes in a number of ways. For example, B-patterns are highly repetitive, which makes them less expensive to design and fabricate than masks and patterns which are typically used in semiconductor fabrication. This is because, as a general rule, the more repetitive a mask or pattern, the less expensive it is to design and fabricate. In addition, the repetitiveness of B-patterns also increases their precision, thereby providing for an inexpensive yet precise pattern. Furthermore, the present invention allows the modification pattern to be formed with a less precise and less expensive process than would otherwise be required for its particular application. This is because all of the edges of a lithographic pattern do not require same precision in the lithographic process. As a result, the edges requiring higher precision can be formed with the B-pattern, while the modification patterns can be used in areas where lower precision is acceptable. This multiple exposure approach works because different edges of a single lithographic pattern may be produced by different exposure steps. Accordingly, the present invention uses multiple exposures with different pattern precision to provide high precision printing of critical edges and also providing for overall cost savings.

Figure 2:
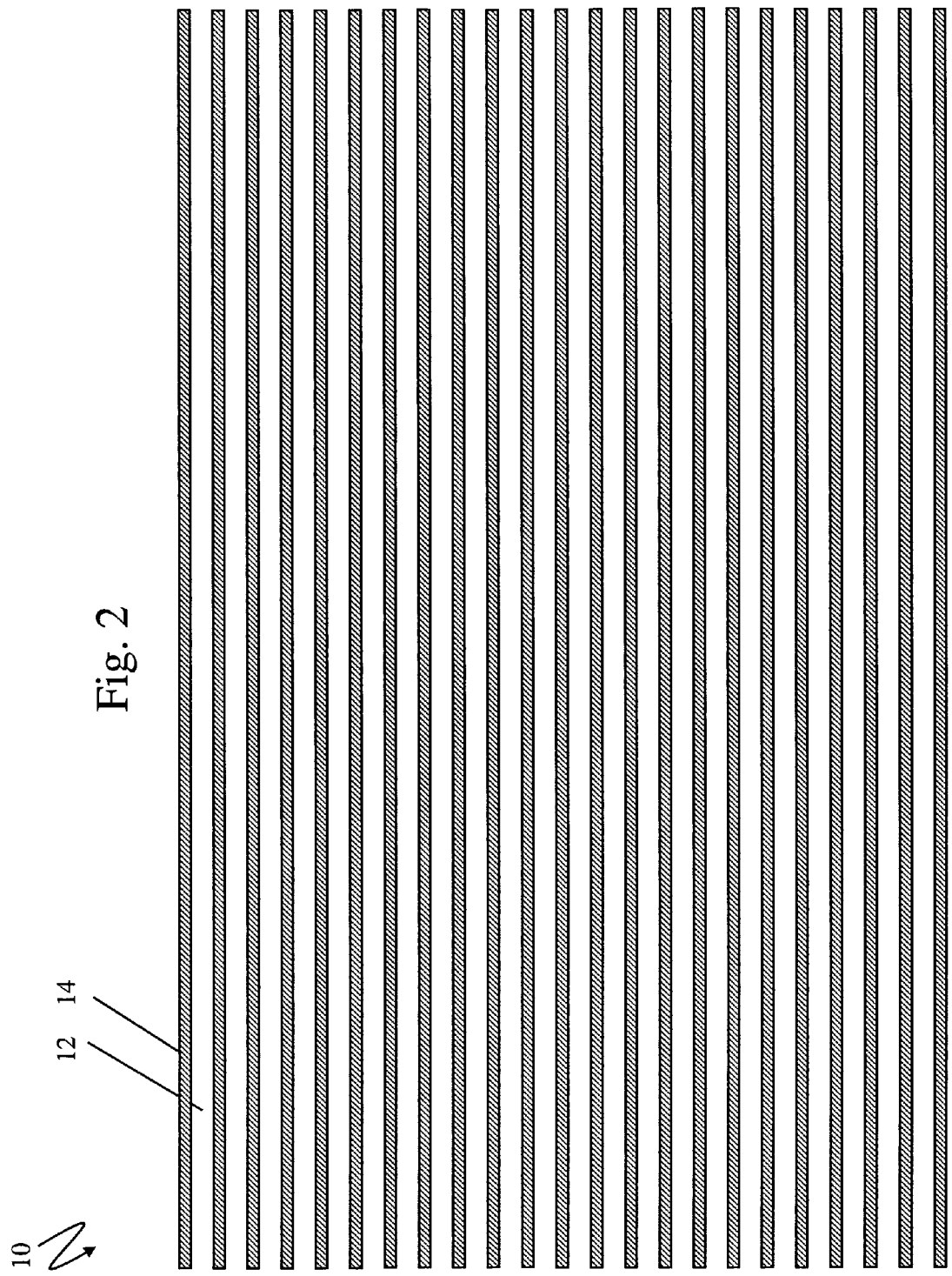
Figure 3:
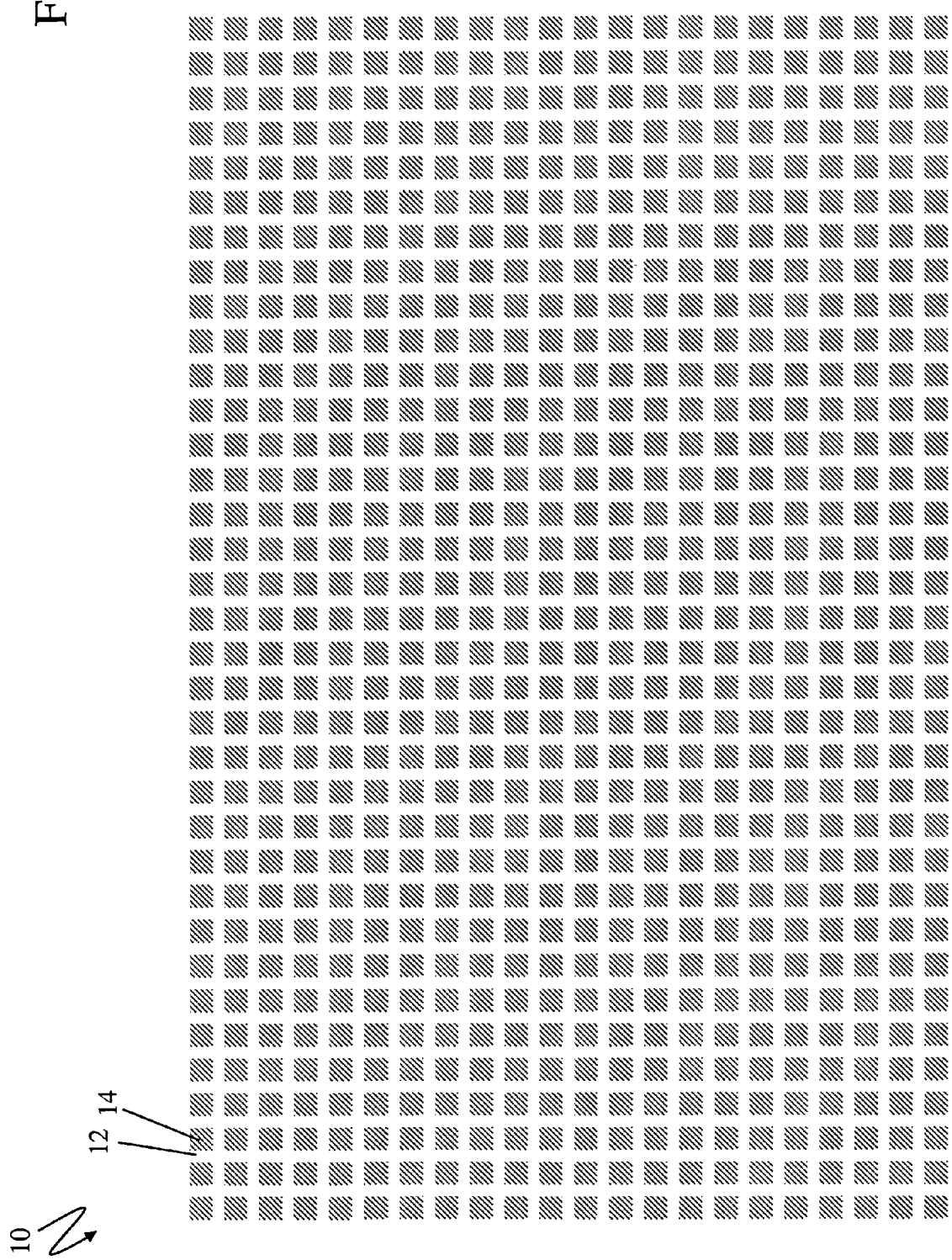

FIGS. 1, 2, and 3 illustrate examples of "B-patterns" 10 formed in a layer of photoresist that may be used in accordance with the present invention. The "B-patterns 10" are formed from exposed 12 and unexposed 14 patterns in the photoresist. In this example, FIG. 1 illustrates a vertical B-pattern 10, FIG. 2 illustrates a horizontal B-pattern 10, and FIG. 3 illustrates an orthogonal B-pattern 10. Although three B-patterns 10 are illustrated, more or less B-patterns 10 may be used. The B-patterns 10 may be formed with conventional masks and lithographic processes and, because the illustrated B-patterns 10 exhibit highly repetitive patterns, they are relatively easy and inexpensive to design and fabricate. As a result, the B-patterns 10 can be made more precisely and less expensively than the patterns that are typically used to form photoresist patterns in conventional semiconductor fabrication. As discussed hereinbelow, the B-patterns 10 may also be formed with maskless processes.

The B-patterns 10 illustrated in FIGS. 1-3 may be formed with three different masks, or they may be formed with only one mask. For example, the B-patterns 10 in FIGS. 1 and 2 may be formed with the same mask rotated by 90 degrees. The B-pattern 10 in FIG. 3 may be formed, for example, by a double exposure of the B-patterns 10 illustrated in FIGS. 1 and 2, which may be formed with a single mask rotated 90 degrees. Other variations are also possible.

Generally, B-patterns 10 are not useful in their original form. However, B-patterns 10 can be modified or customized to form a desired pattern for a particular integrated circuit. As will be described in more detail hereinbelow, the modification or customization of the B-patterns 10 can often be performed using less precise and less expensive masks, patterns, or other processes, including maskless processes. Furthermore, although the processes will generally be described in terms of the B-patterns 10 being formed prior to the "modification" patterns, and although the B-patterns 10 and modification patterns will sometimes be described as "first pass" patterns and "second pass" patterns, respectively, the order in which the patterns are formed may be reversed or alternated. For example, it is possible to form a modification pattern followed by a B-pattern. In another example, it is possible to form a first B-pattern, followed by a modification pattern, and followed by a second B-pattern. Other variations are also possible.

EXAMPLE NUMBER 1

Figure 4:
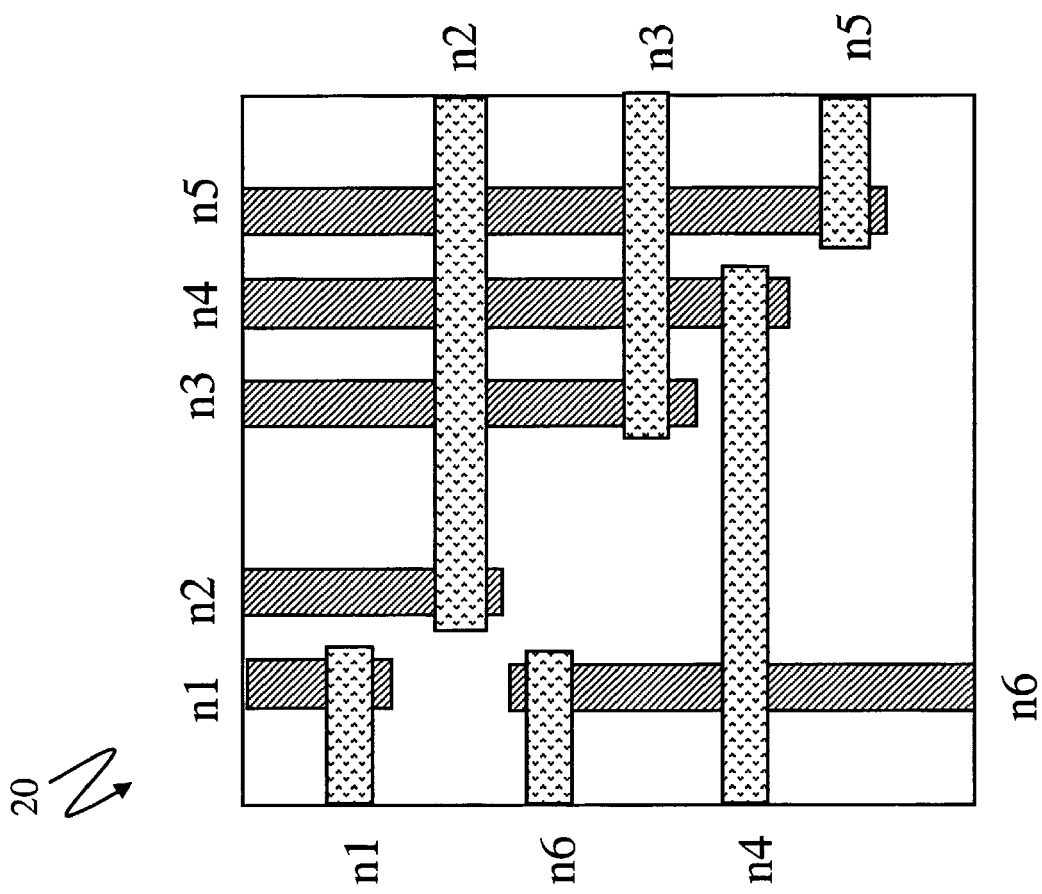
FIG. 4 illustrates one embodiment of an integrated circuit that may be fabricated according to the present invention.

FIG. 4 illustrates one embodiment of an integrated circuit 20 that may be fabricated according to the present invention. The fabrication may use a multiple exposure lithographic process in which a desired pattern is formed by exposing a photoresist layer to two or more different patterns, such that the desired pattern is formed as a composite of the two or more different patterns. Furthermore, the two or more patterns may be formed with different levels of precision. In some embodiments, one or more patterns may be formed by the superposition of at least two orthogonal scans or patterns. In other embodiments, the scans may be oriented at angles other than orthogonal. Many variations and combinations are possible with the present invention as will be illustrated hereinbelow.

Figure 5:
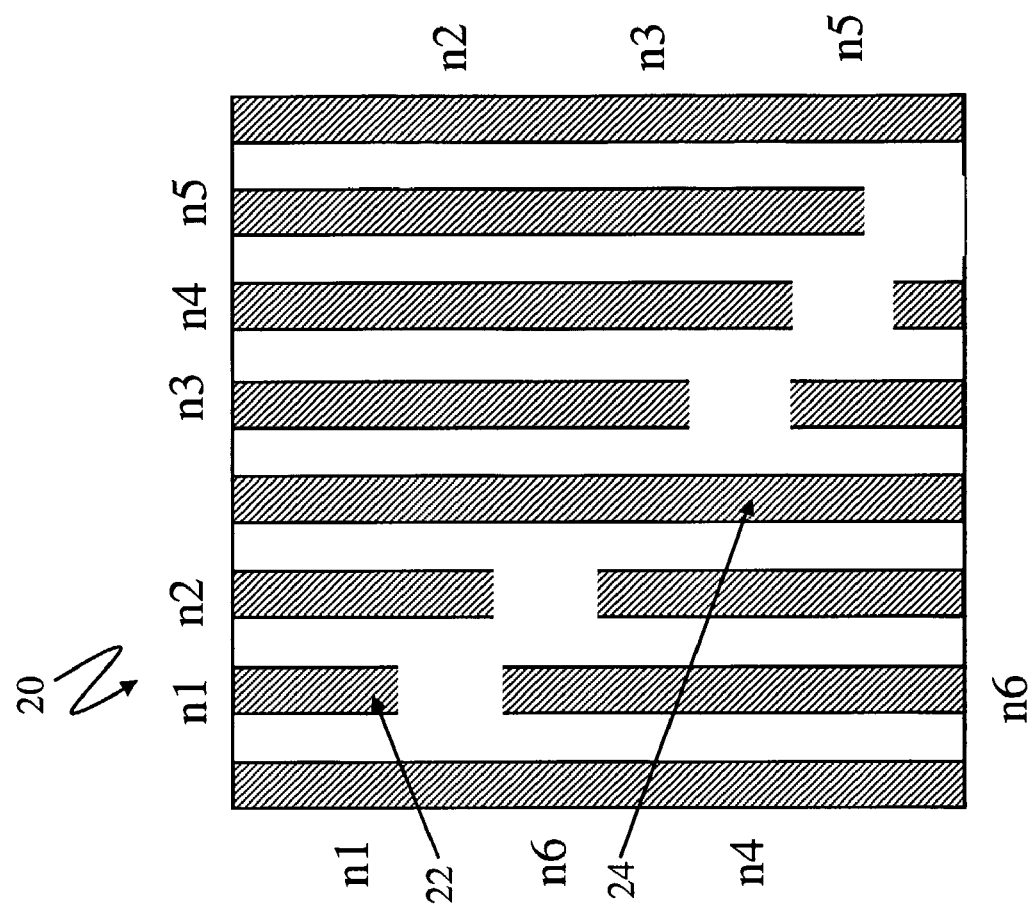
FIGS. 5-11 illustrate process steps for forming the metal 1 in the integrated circuit illustrated in FIG. 4.

FIG. 5 illustrates a metal 1 pattern which can be used for part of the integrated circuit of FIG. 4. The metal 1 pattern includes required or "needed" connections 22 and connections which are "not needed" 24. It is possible to form the metal 1 pattern without the connections that are not needed 24, although there are certain advantages to the "not needed" connections 24 which will be discussed hereinbelow.

Figure 6:
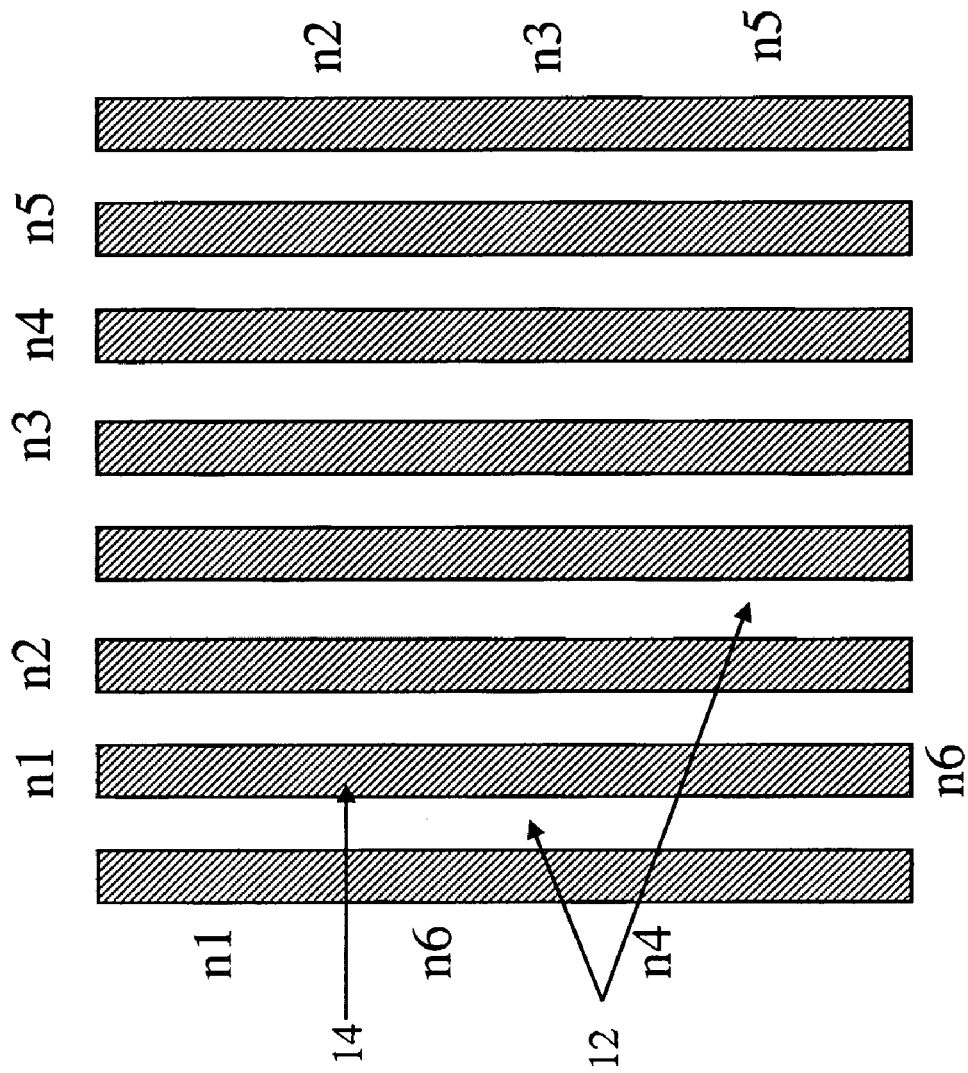

FIG. 6 illustrates the "vertical 1" B-pattern 10 formed on a layer of photoresist and which will be used to form the desired metal 1 pattern. This example uses positive photoresist, although the pattern can also be formed with negative photoresist. As mentioned above, the B-pattern 10 is precise, inexpensive, and will be modified to create the desired pattern.

Figure 7:
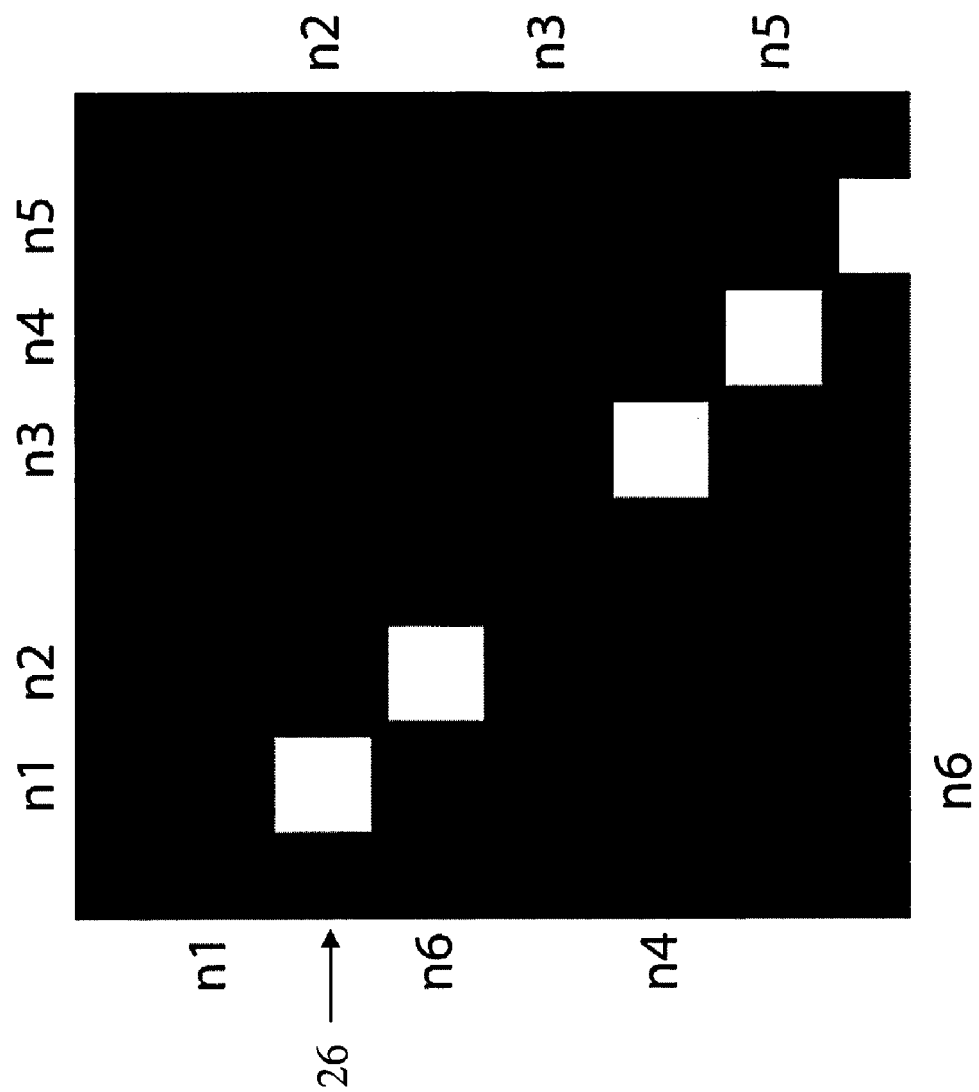

FIG. 7 illustrates an example of a "modification" mask or pattern 26 that can be used to modify or customize the "vertical 1" B-pattern 10 of FIG. 6. The modification mask 26 changes the B-pattern 10 to make it more useful for fabricating semiconductors. In the present example, the modification mask 26 will be used to change the "vertical 1" B-pattern 10 of FIG. 6 into the desired metal 1 pattern of FIG. 5.

Figure 8:
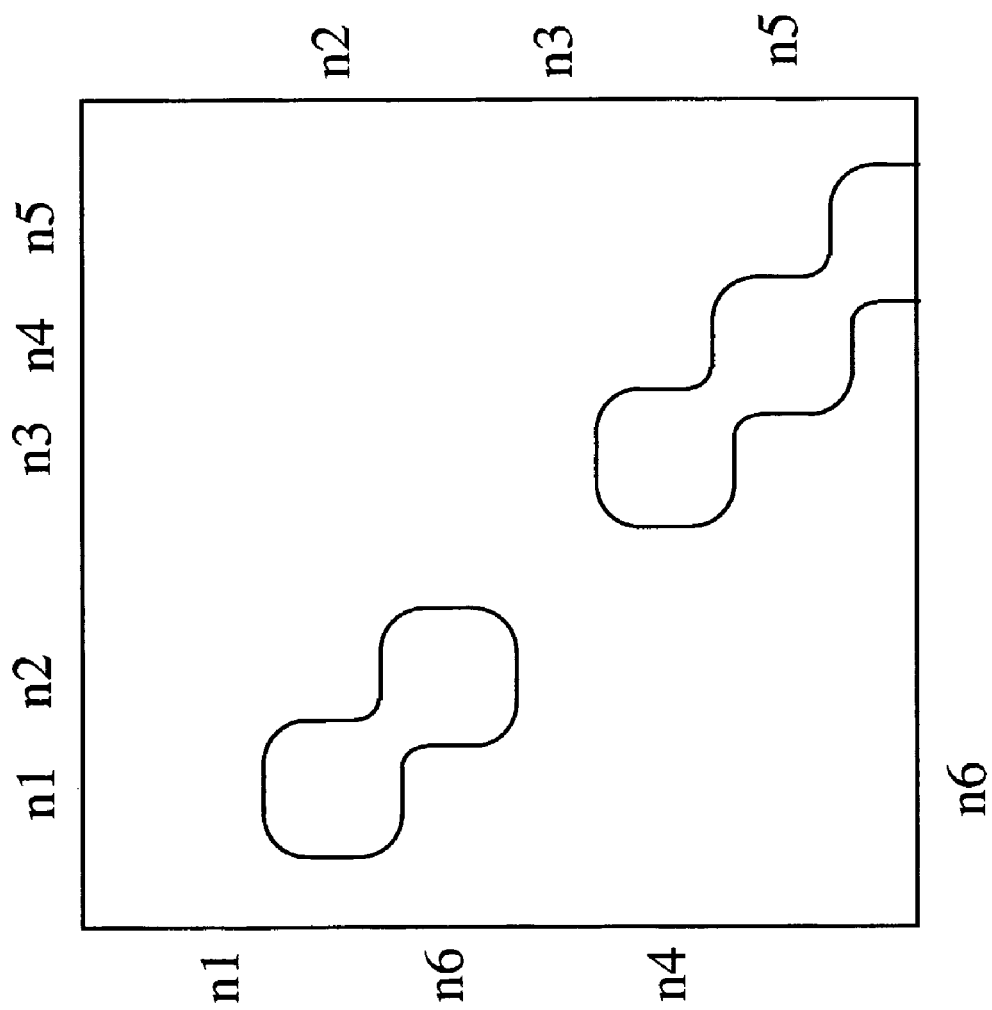

FIG. 8 illustrates an example of a pattern that may be formed in a layer of photoresist when using a modification mask 26 in the pattern shown in FIG. 7. In this example, the low pattern transfer quality shown in FIG. 8 is the result of the use of a relatively low quality, inexpensive mask. The desired pattern includes square features which are separated from each other as illustrated in FIG. 7. In contrast, the pattern produced on the photoresist has rounded corners and several of the features overlap each other as illustrated in FIG. 8. However, the present invention can tolerate the imprecision of the modification pattern as will be described in more detail hereinbelow.

Figure 9:
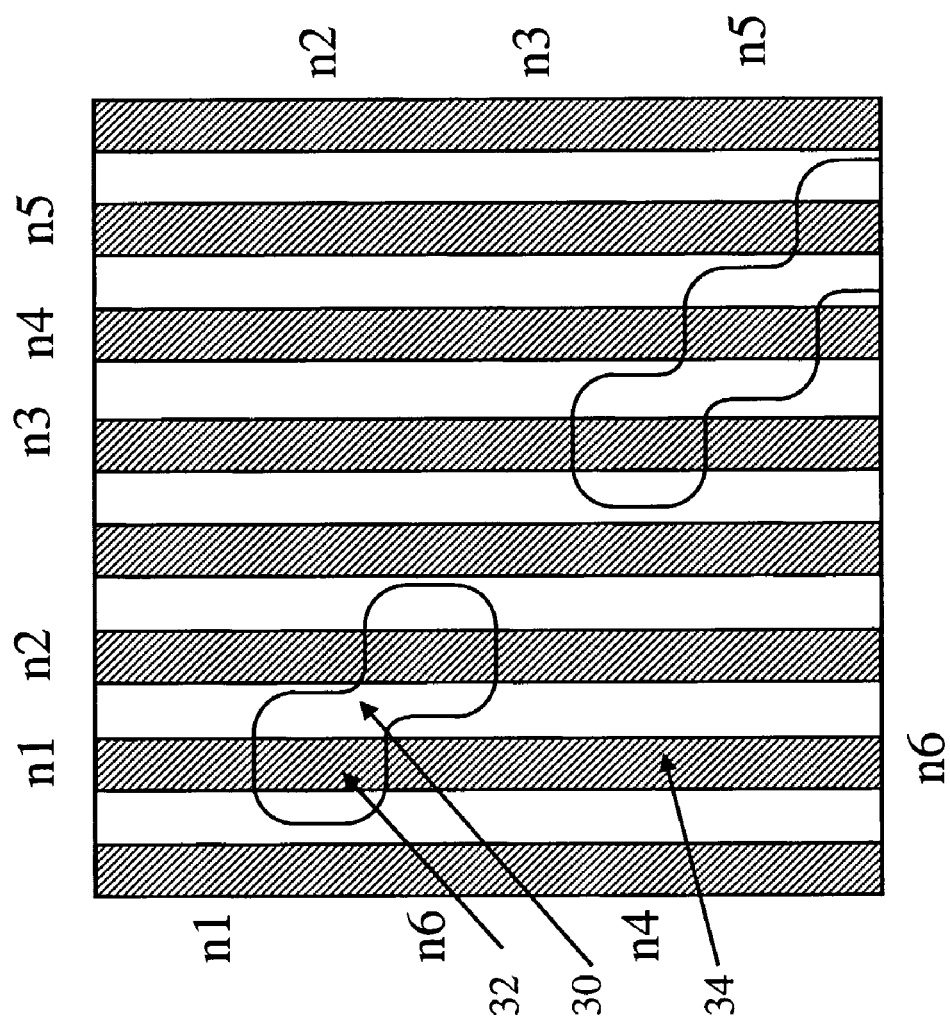
Figure 10:
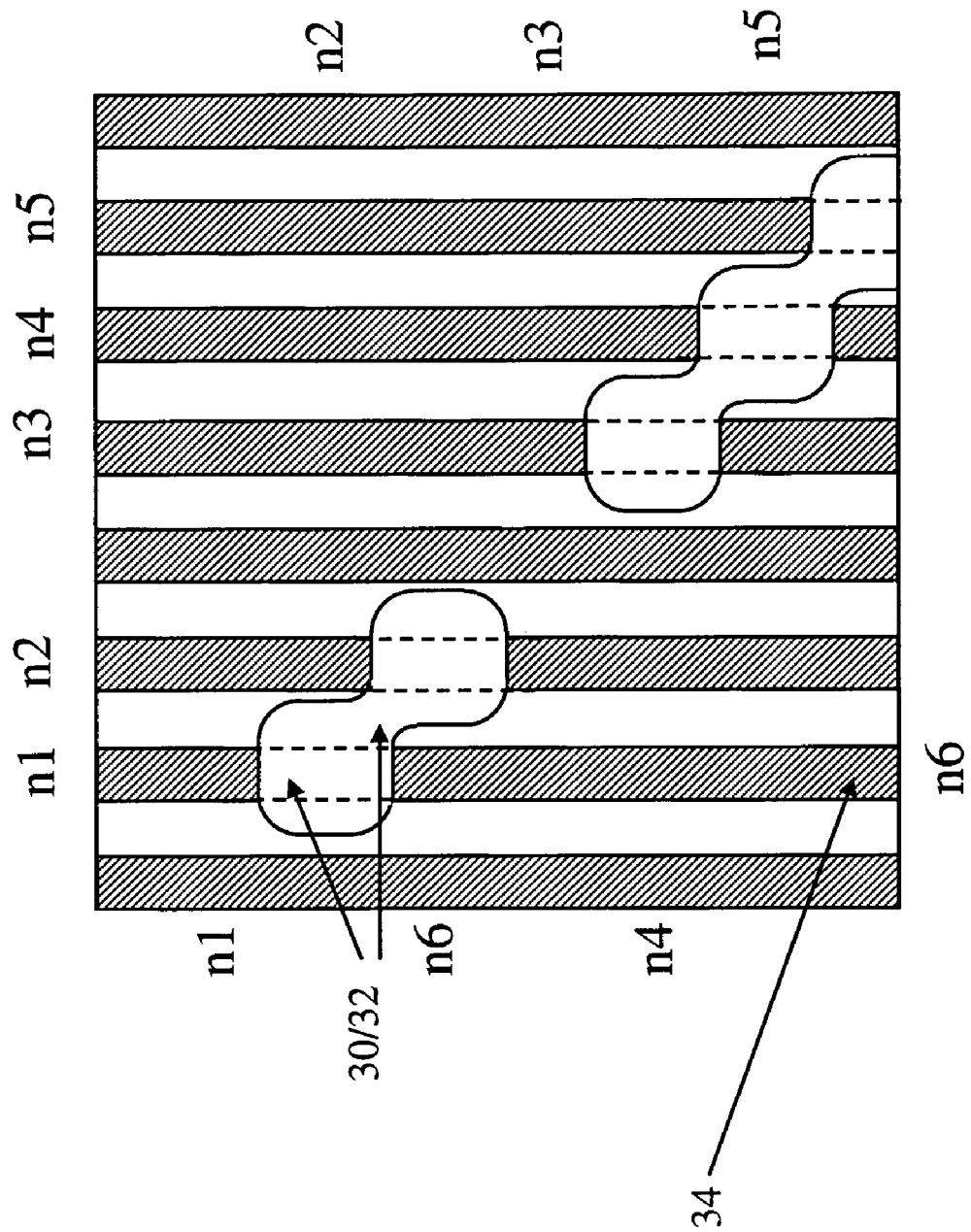

FIGS. 9 and 10 illustrate examples of a multiple exposure lithographic process in which a B-pattern and a modification pattern are used to form a desired composite pattern in a layer of photoresist. Some areas of photoresist are exposed twice 30, once with each pattern, while other areas are exposed only once 32, and some areas are not exposed at all 34. It is possible for some areas of photoresist to be exposed more than twice if more than two exposures are performed. In the illustrated example, the modification mask 26 creates openings or breaks in the vertical lines of the B-pattern. These openings are required for proper connectivity within the integrated circuit.

Figure 11:
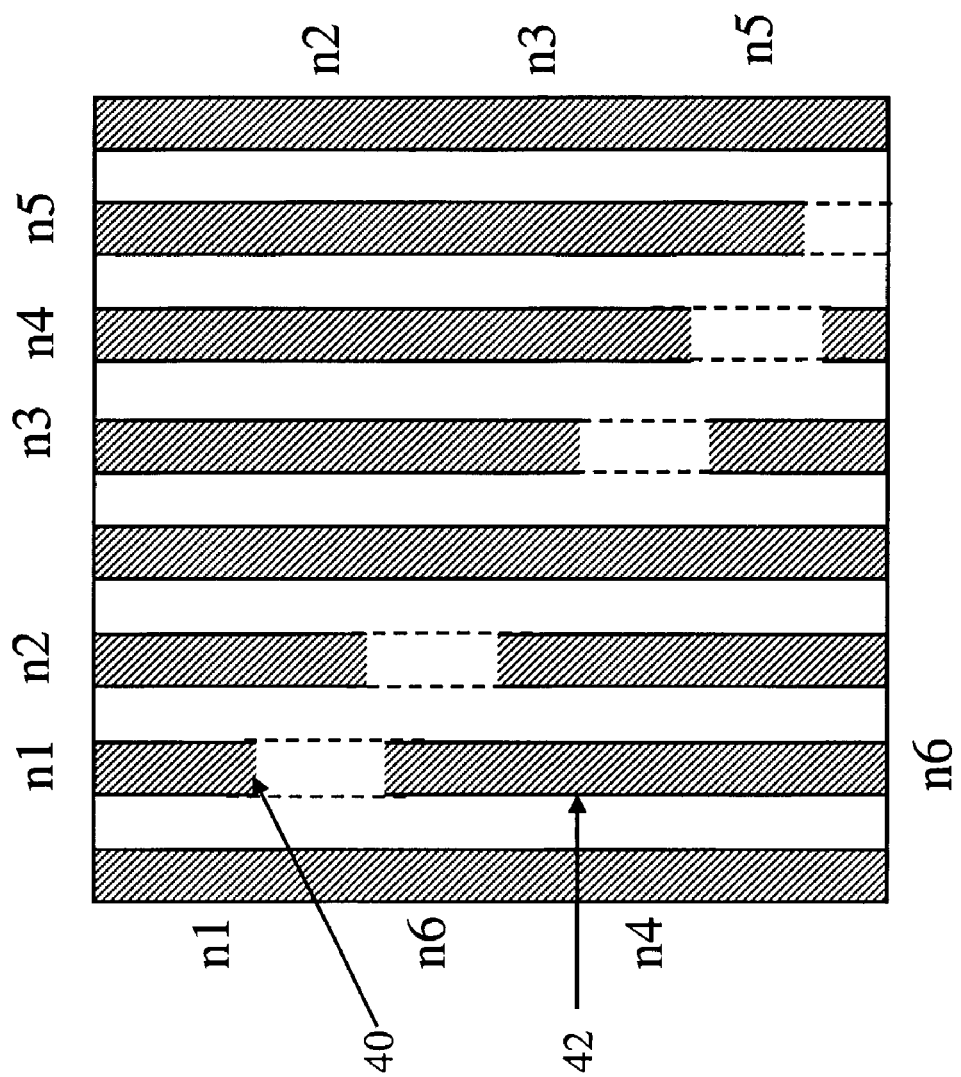

FIG. 11 illustrates the resulting pattern. The pattern includes vertical lines from the B-pattern with several breaks or openings formed by the modification pattern. The breaks in the B-pattern may, for example, allow one line in the B-patterns to be used for several separate connections, to prevent signal shorts or contention, or for other purposes. The imprecision of the modification pattern results in a lower quality edge 40 where the modification pattern features overlap the B-pattern features. However, these edges can be limited to non-critical edges of the pattern, thereby minimizing their effect. In the illustrated example, the majority of pattern retain the high quality edges 42 of the B-pattern, while the edges formed by the modification patterns are limited to non-critical edges. Subsequent conventional processing steps can be used to form the actual metal 1 structure in the form illustrated in FIG. 11.

The pattern illustrated in FIG. 11 offers part of the desired integrated circuit 20 pattern illustrated in FIG. 4. To achieve the entire structure, additional steps are required, and those steps can be performed by using B-patterns and modification masks, as described in more detail hereinbelow.

Figure 12:
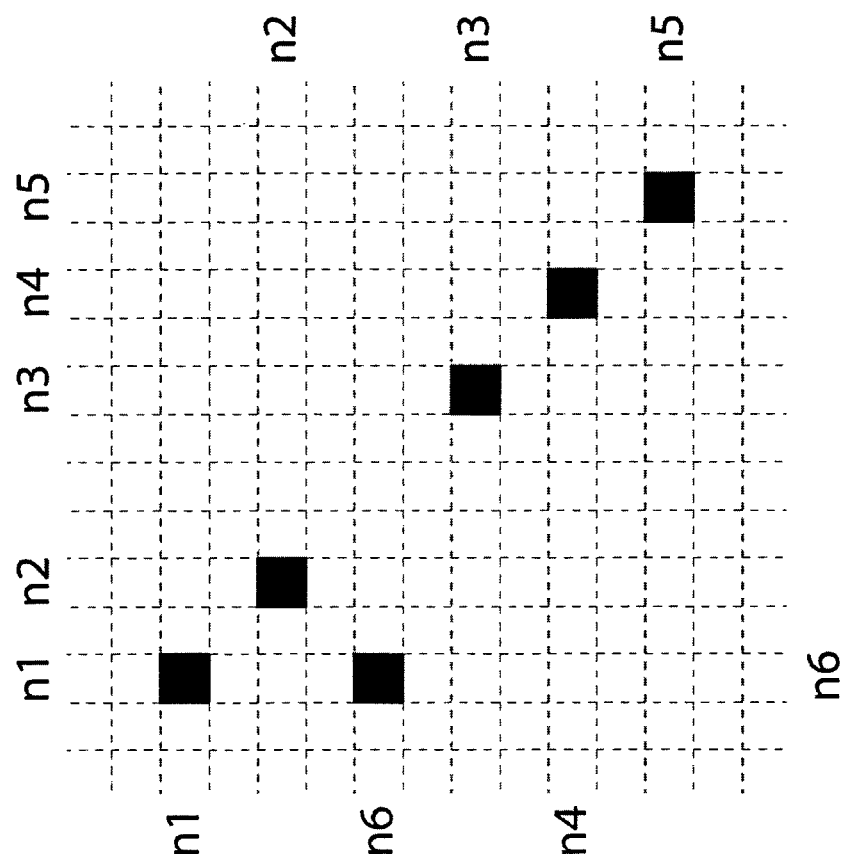
FIGS. 12-18 illustrate process steps for forming the vias in the integrated circuit illustrated in FIG. 4.

FIG. 12 illustrates a desired pattern for vias which can be used for connecting the components in the integrated circuit 20 illustrated in FIG. 4. Before beginning to form the vias, one or more processing steps may occur, such as cleaning and planarizing the surface. Thereafter, a new layer of photoresist may be formed on the surface.

Figure 13:
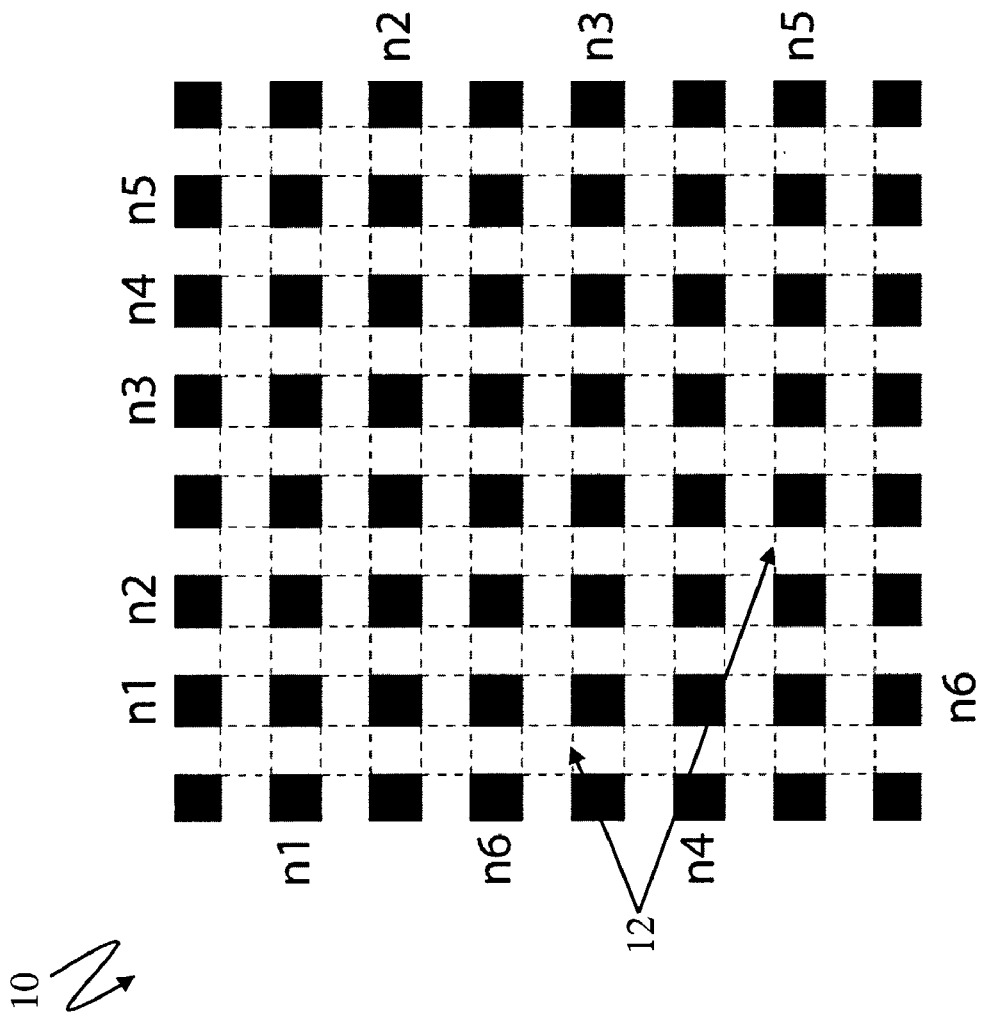
Figure 14:
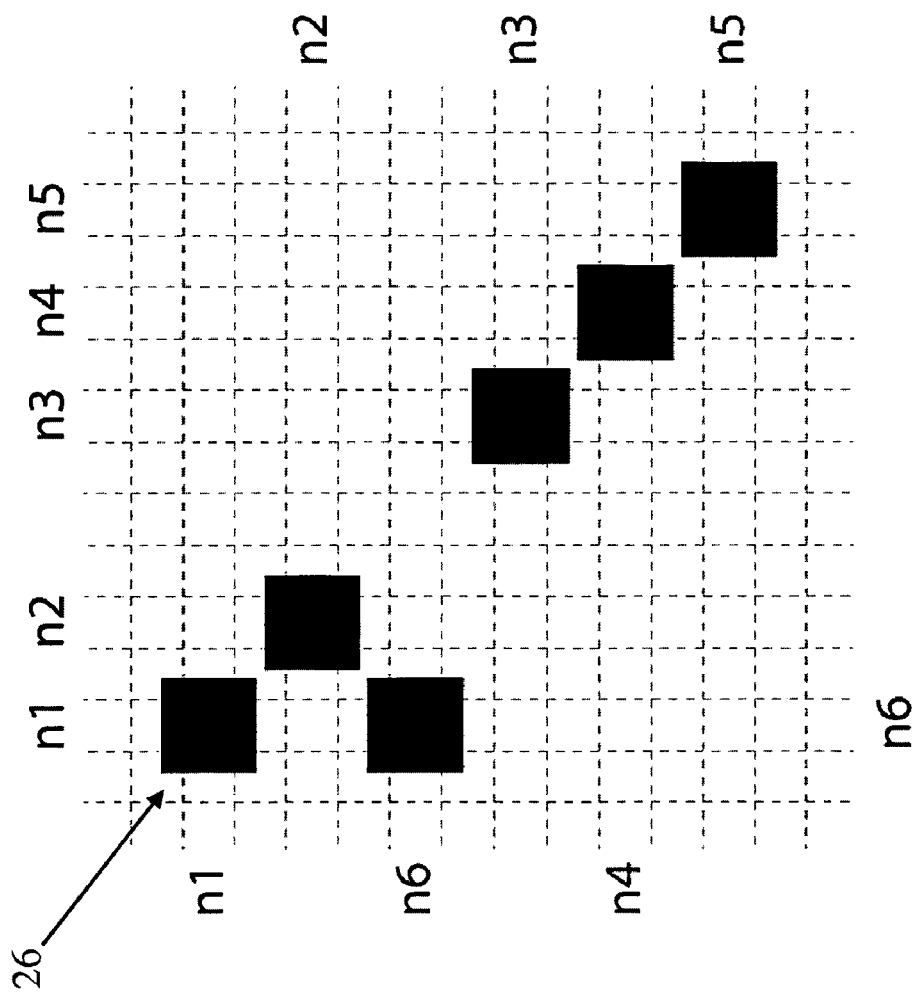
Figure 15:
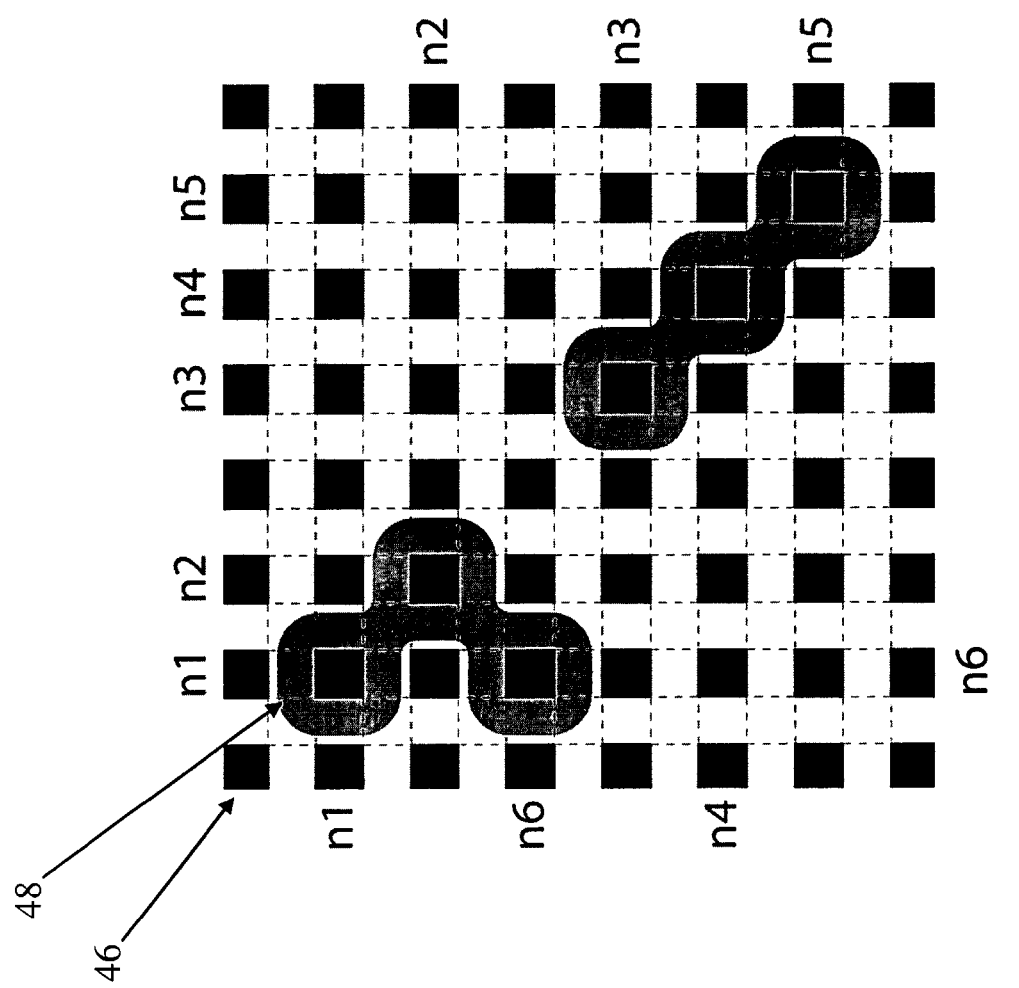
Figure 16:
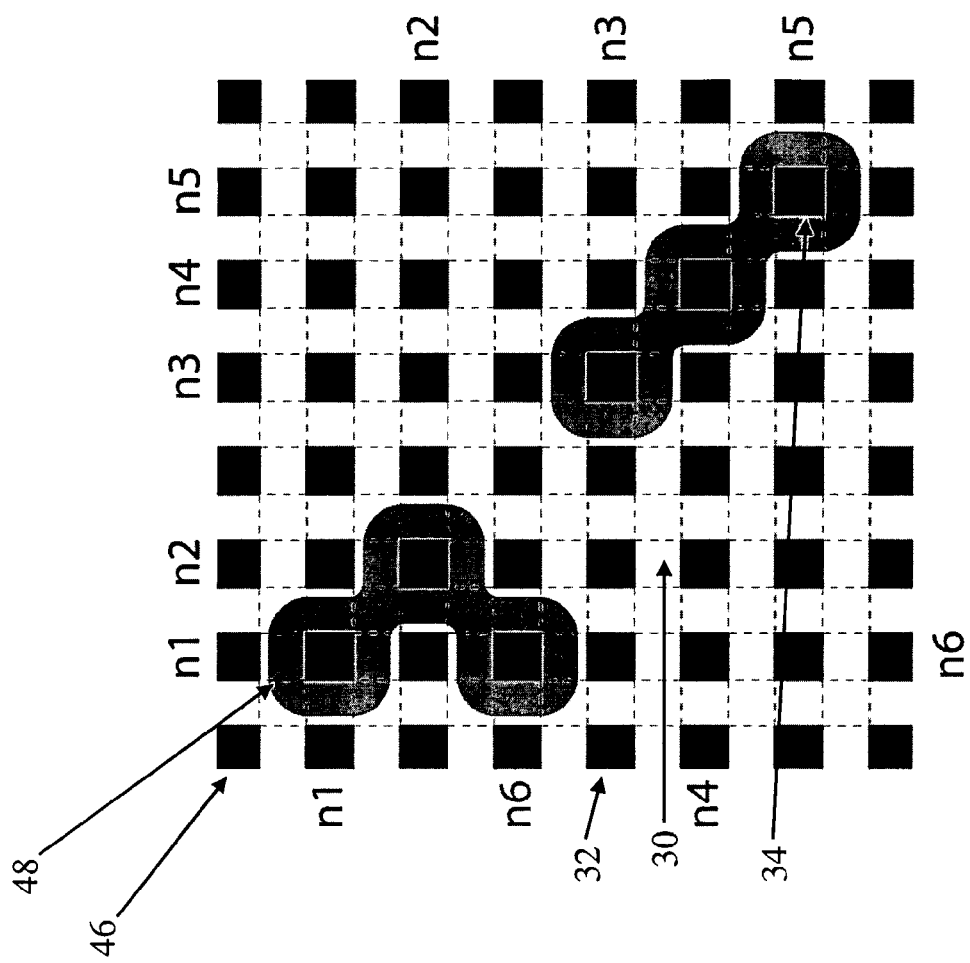
Figure 17:
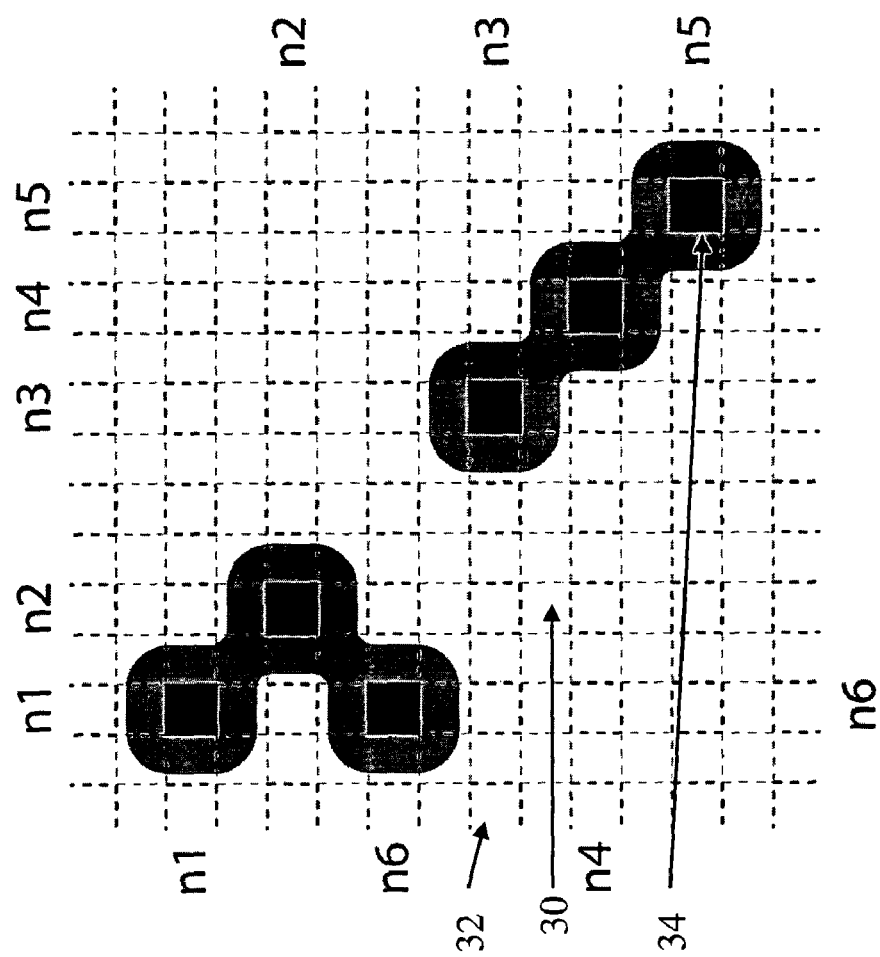
Figure 18:
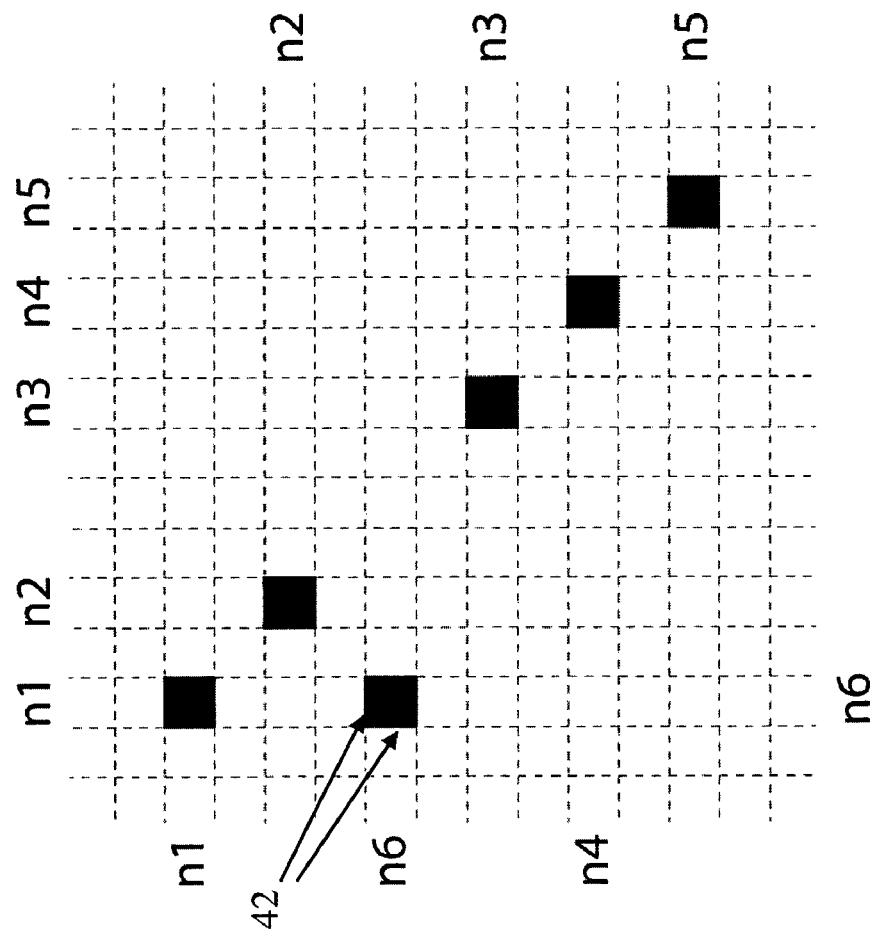

FIG. 13 illustrates an orthogonal B-pattern 10 formed in negative photoresist which may be used in the creation of the vias. FIG. 14 illustrates a modification pattern 26 which may be used to select the portions of the B-pattern which will form the vias. FIGS. 15 and 16 illustrate the multiple exposures of the photoresist, showing portions 46 of the photoresist that are exposed by the B-pattern and portions 48 of the photoresist that are exposed by the modification mask. FIG. 16 also illustrates the portions of the photoresist that are exposed once 32, twice 30, and not at all 34. FIG. 17 illustrates the final photoresist pattern overlaid with the modification mask pattern that is used in conjunction with the orthogonal B-pattern to select the final photoresist pattern. FIG. 18 illustrates the final photoresist pattern for the vias. In this embodiment, the combination of B-patterns and modification masks results in a final pattern in which all of the edges exhibit the high quality 42 of the B-pattern. Subsequent conventional processing steps can be used to form the vias from the final photoresist pattern illustrated in FIG. 18.

Figure 19:
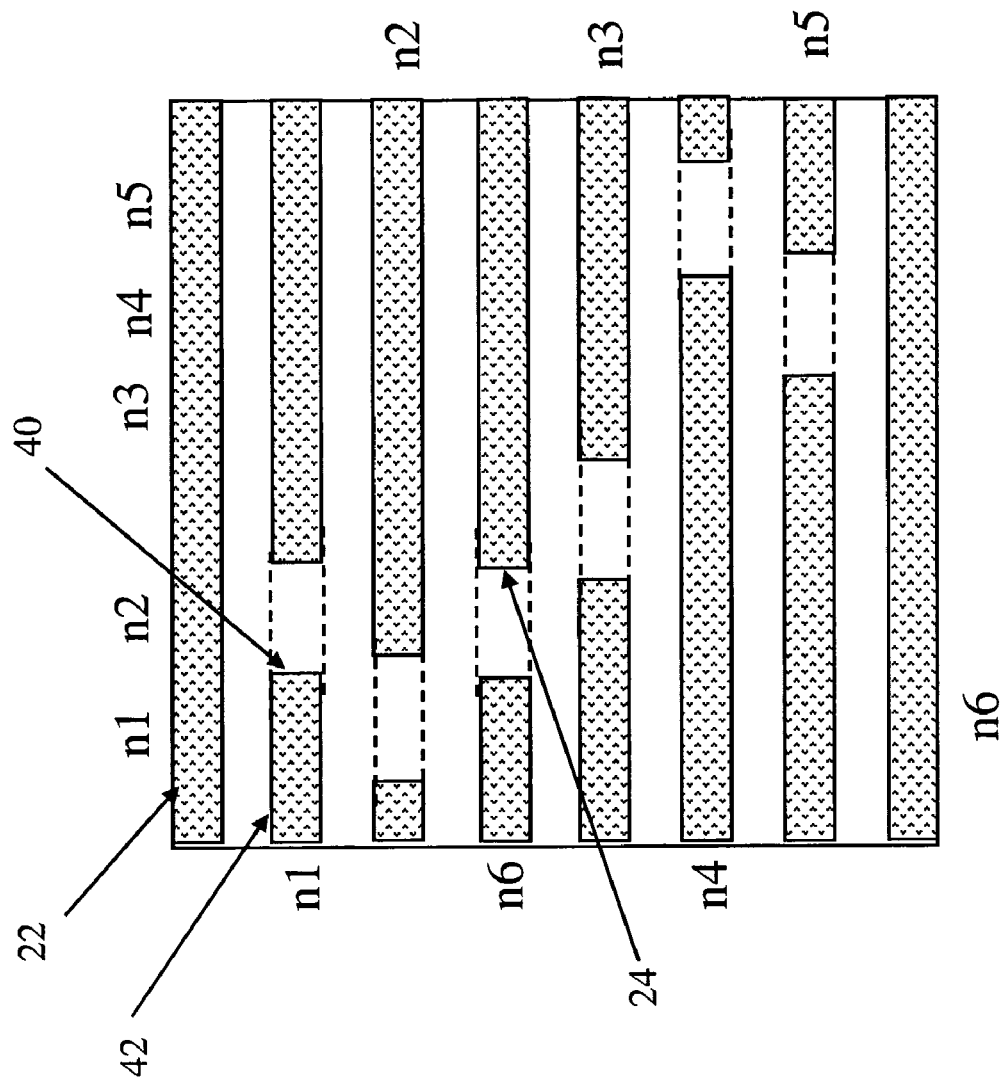
FIGS. 19-21 illustrate process steps for forming the metal 2 in the integrated circuit illustrated in FIG. 4.
Figure 20:
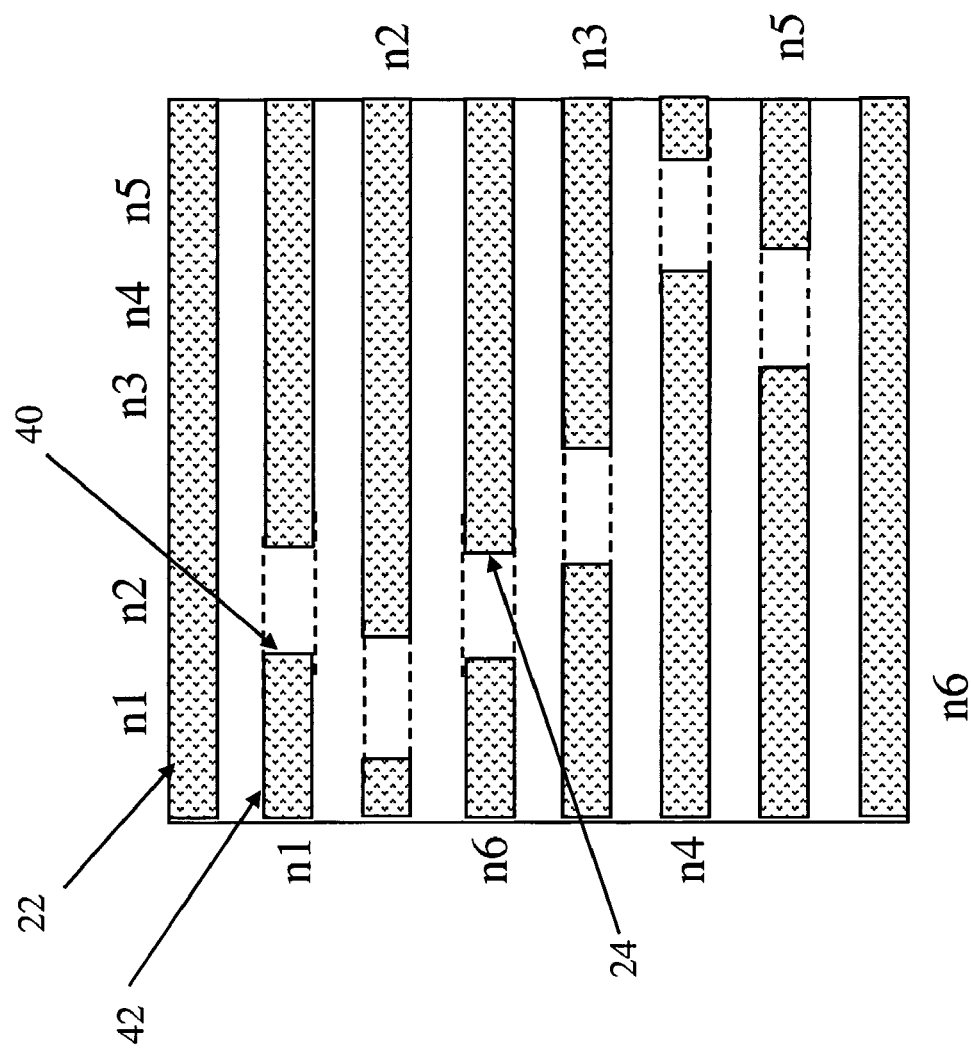

FIGS. 19 and 20 illustrate horizontal components that can be formed by a B-pattern and a modification pattern in a manner analogous to that described hereinabove to form a metal 2 layer. The illustrated example results in both high 42 and low quality 40 pattern edges. In this example, however, the low quality edges 40 are in non-critical locations. The process results in some horizontal components which will be used and some which will not be needed 24. In an alternative embodiment, the modification pattern may be changed to remove all unneeded components. Alternatively, as will be described below, the unneeded components 24 may be allowed to remain and used for other purposes.

Figure 21:
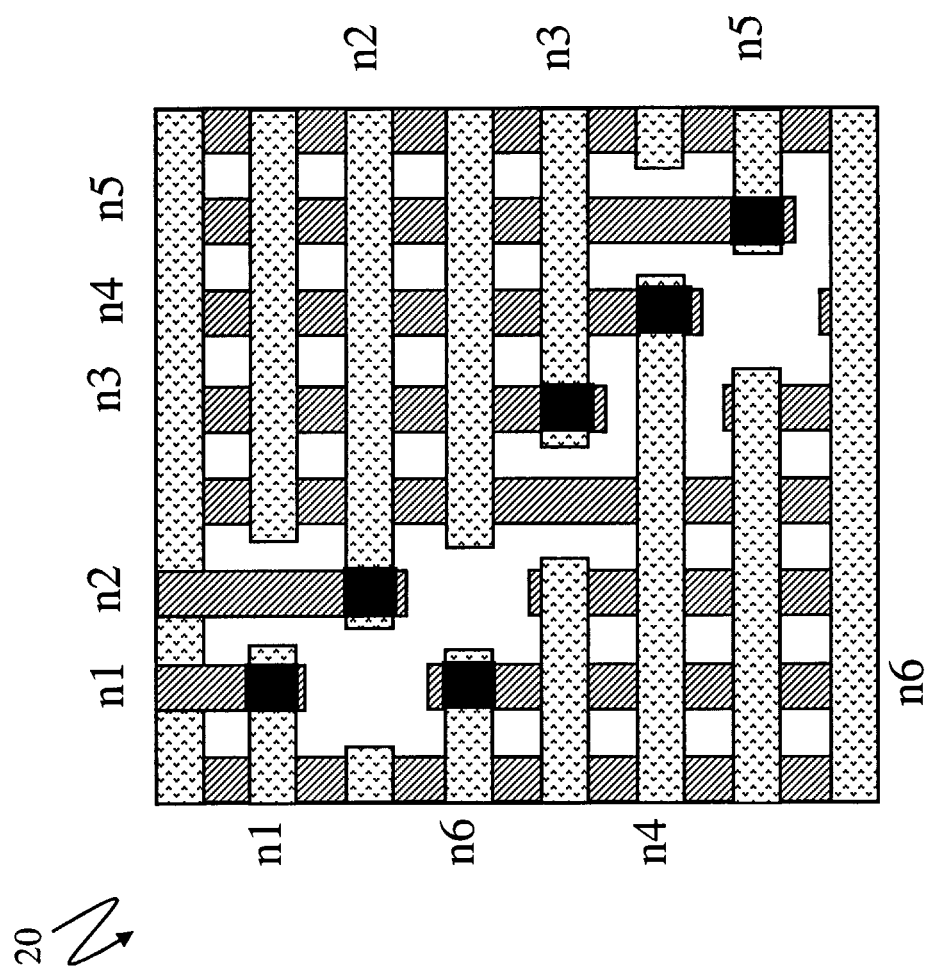

FIG. 21 illustrates the integrated circuit 20 which may be produced with the B-patterns and modification patterns of the present invention, when used along with conventional integrated circuit fabrication processes. This example illustrates a composite of the metal 1, via, and metal 2 layers. The integrated circuit 20 illustrated in FIG. 21 is only one example of what is possible with the present invention. Other types of circuits of different sizes and complexities are also possible, and several additional examples are provided herein.

Figure 22:
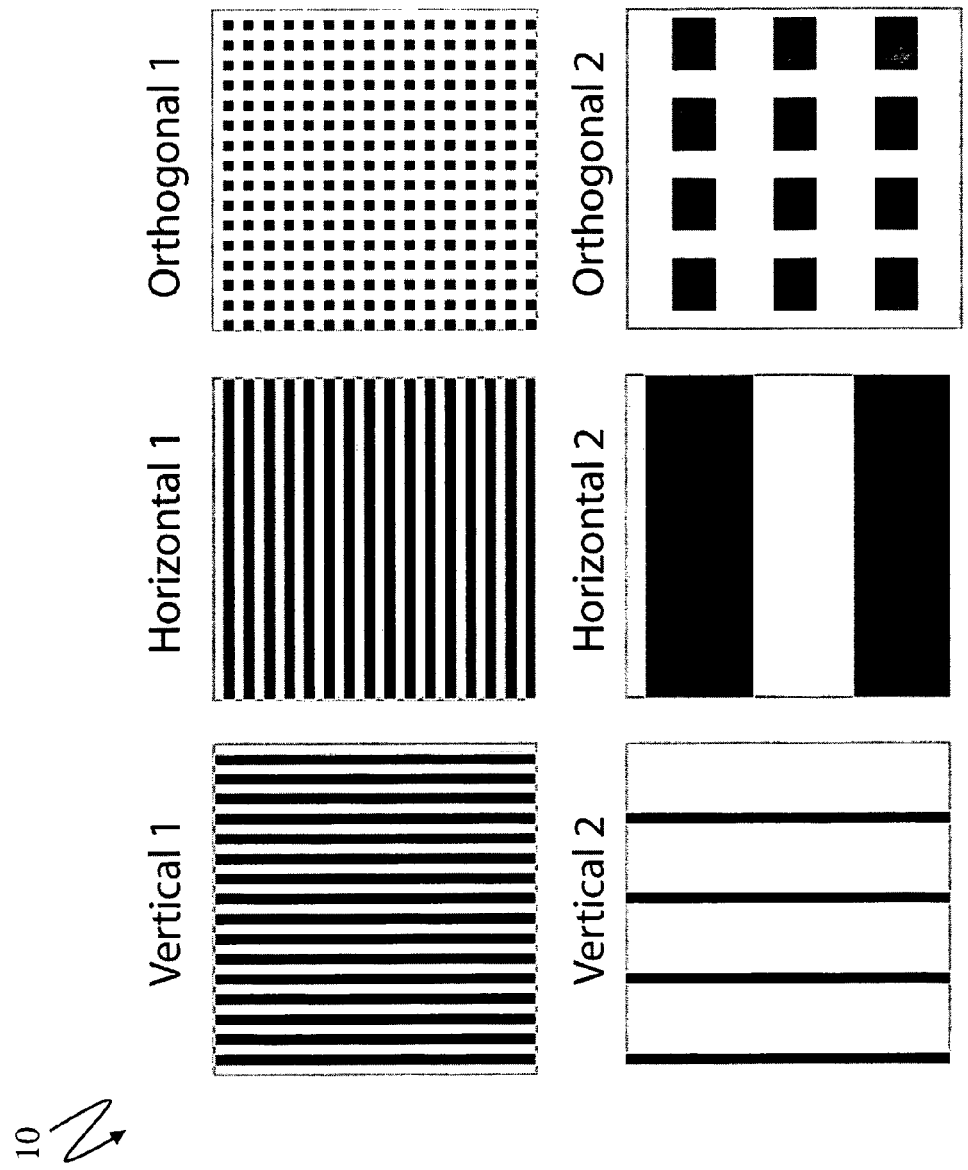
FIG. 22 illustrates a set of six B-patterns.

FIG. 22 illustrates a set of six B-patterns 10 that can be used along with modification patterns and conventional fabrication steps to fabricate integrated circuits in example numbers 2 and 3.

EXAMPLE NUMBER 2

Figure 23:
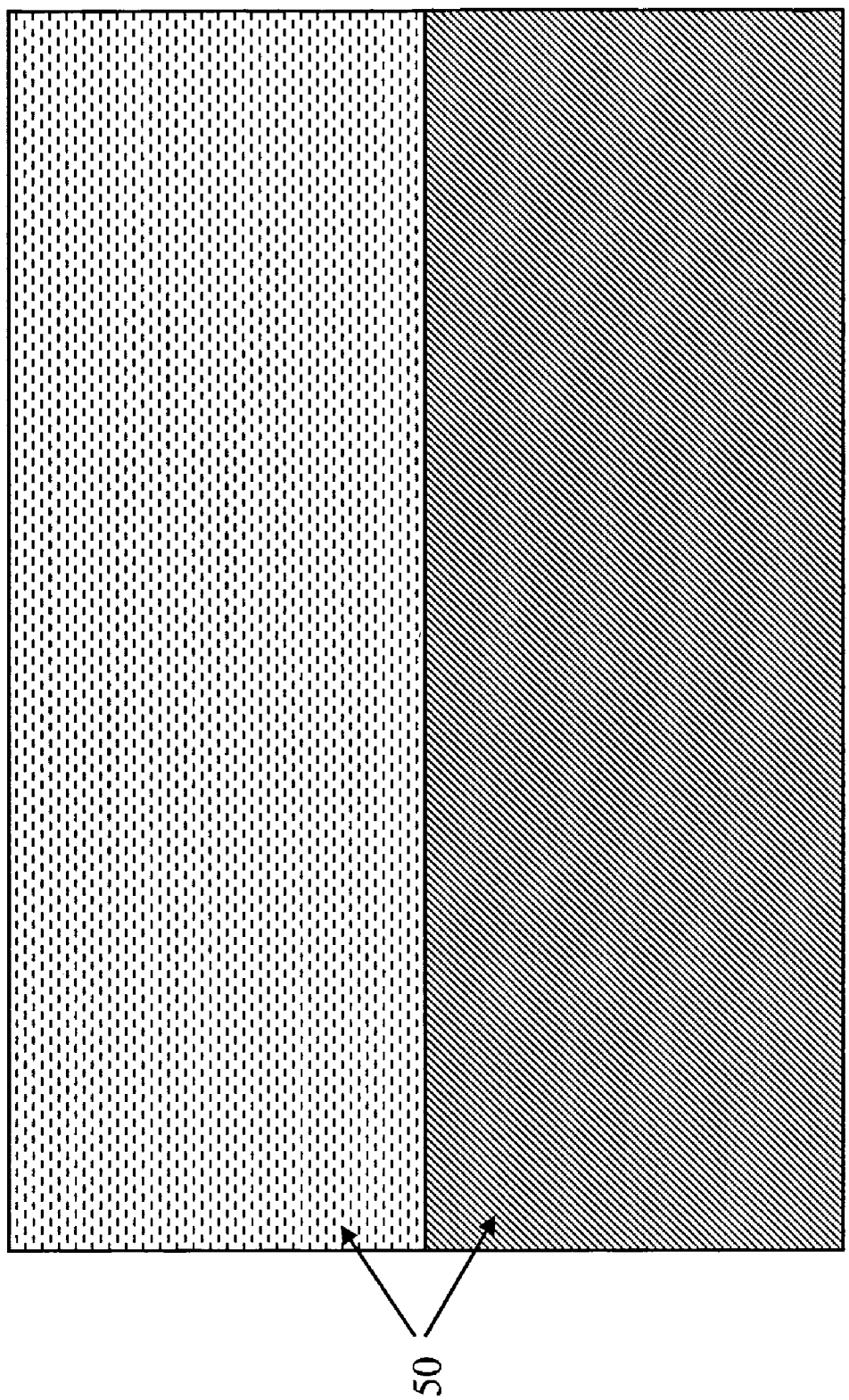
Figure 24:
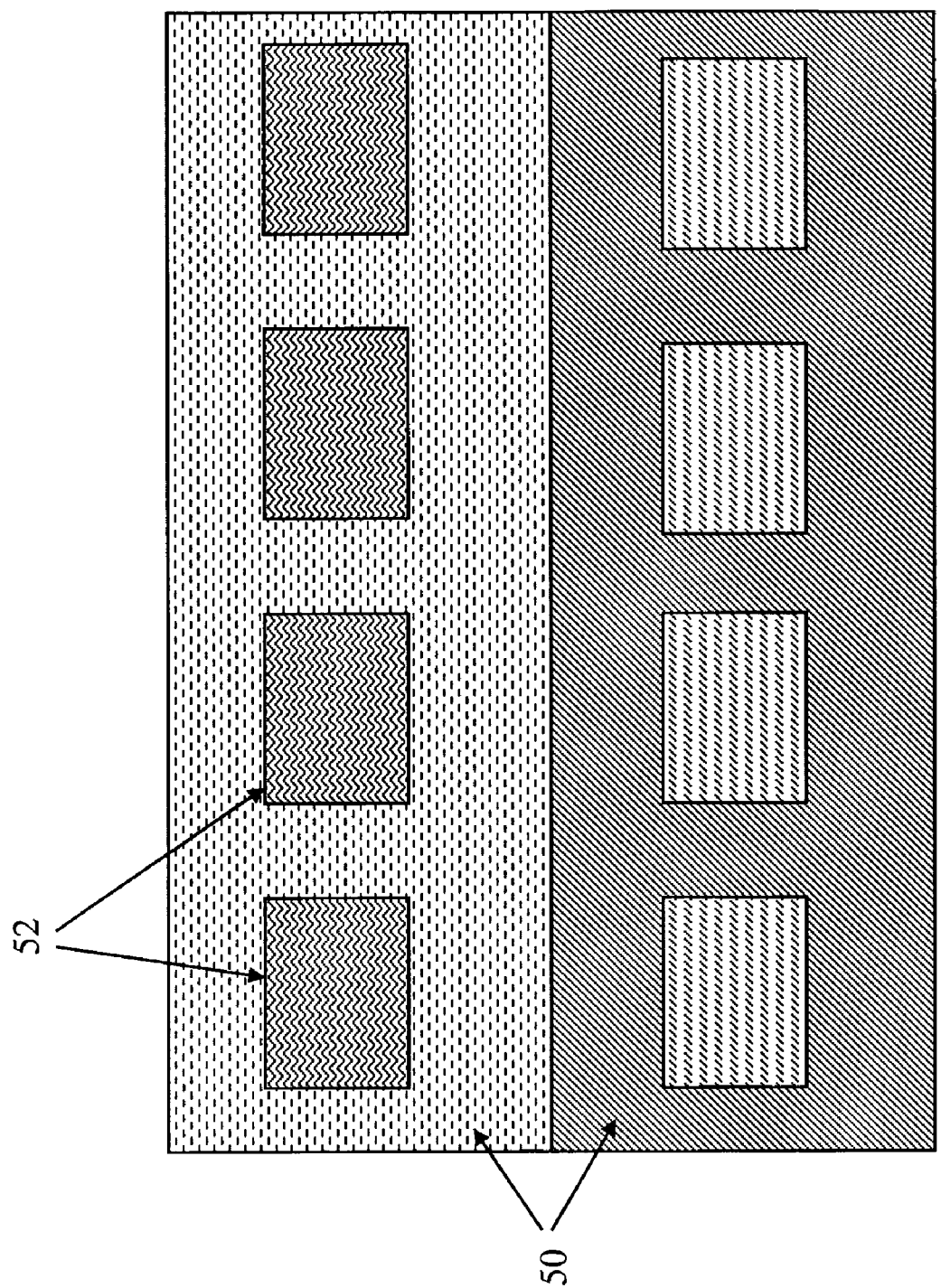
Figure 25:
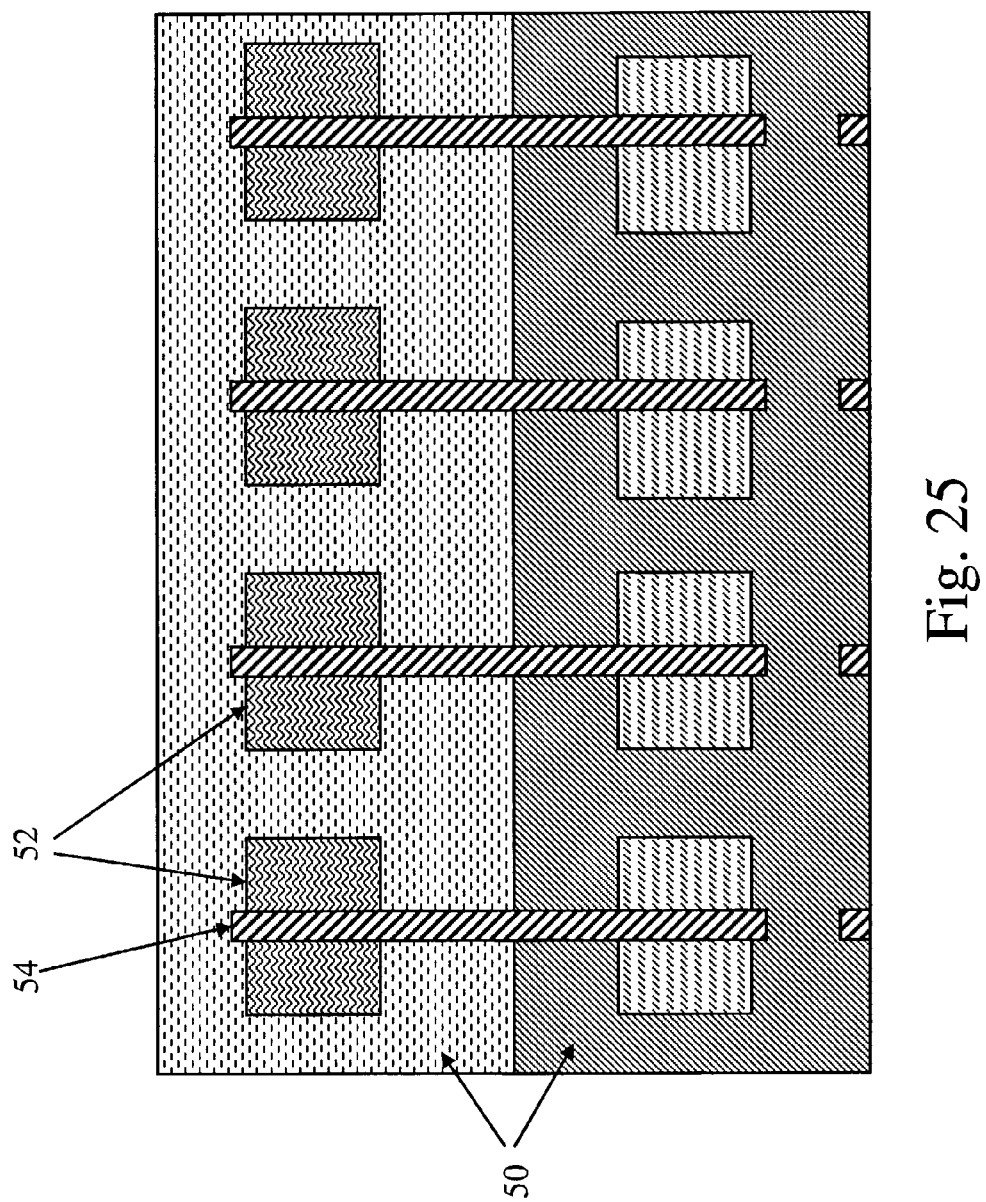

FIGS. 23-38 illustrate process steps for forming a buffer according to the present invention. In each case, a B-pattern is used in combination with a modification pattern, although the modification pattern is not always shown. FIG. 23 illustrates the formation of wells 50 with the "horizontal 2" B-pattern 10 shown in FIG. 22. FIG. 24 illustrates the addition of active areas 52 with the "orthogonal 2" B-pattern 10 shown in FIG. 22. FIG. 25 illustrates the formation of polysilicon 54 with the "vertical 2" B-pattern 10 shown in FIG. 22.

Figure 27:
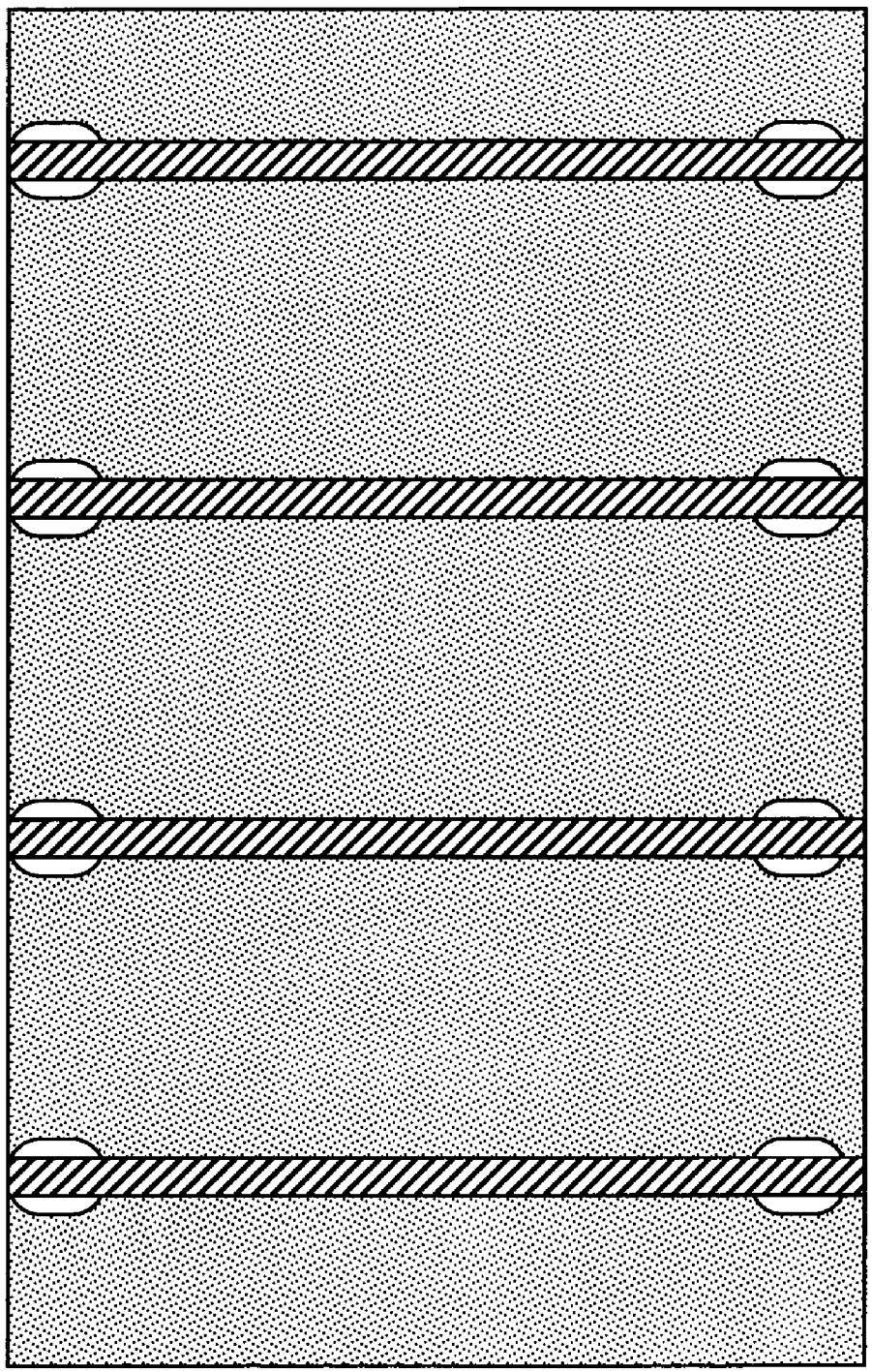
Figure 28:
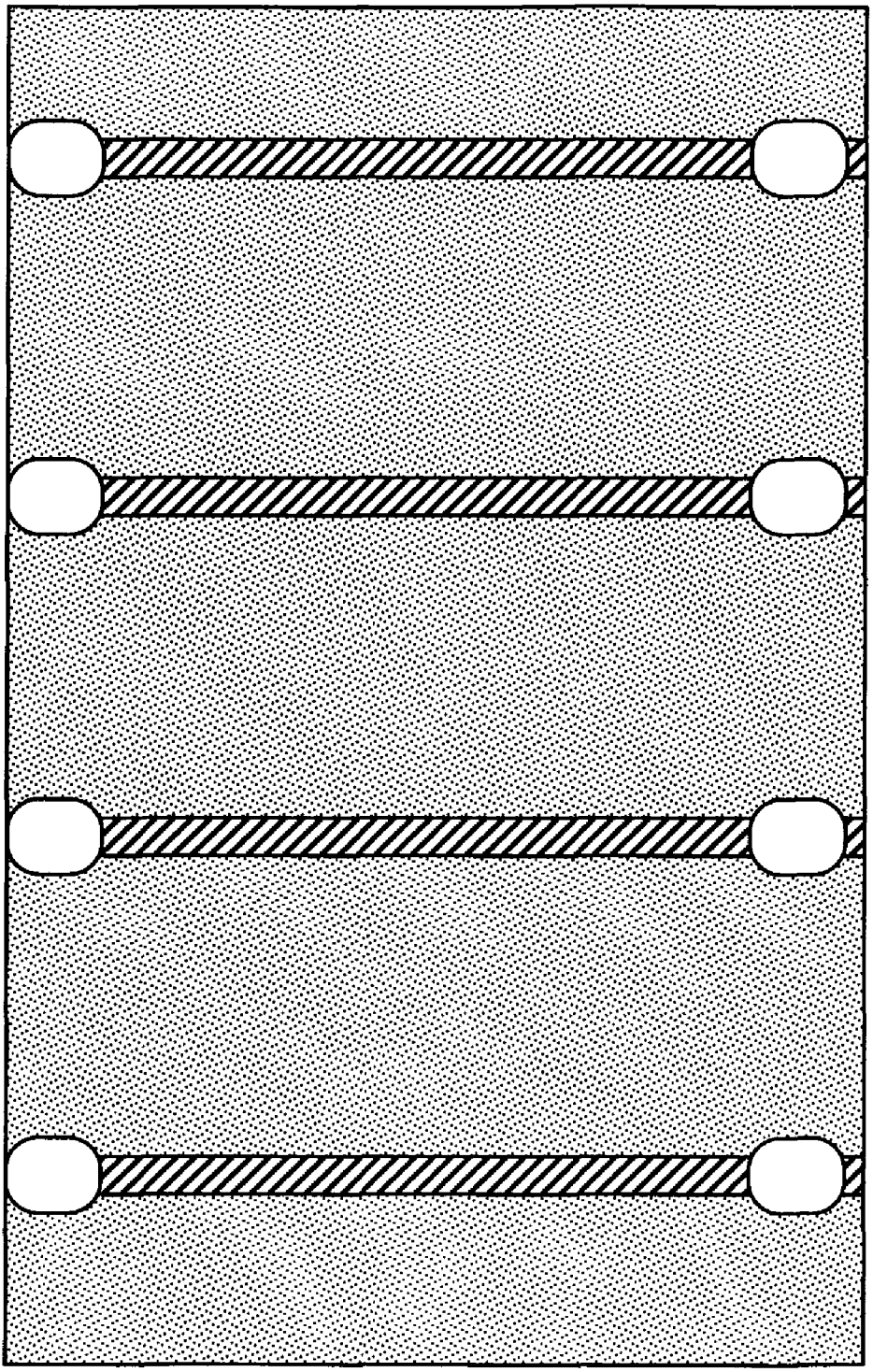

FIGS. 26-29 illustrate an example of the polysilicon formation in more detail. FIG. 26 illustrates the first exposure of the photoresist layer with the "vertical 2" B-pattern. FIGS. 27 and 28 illustrate the overlay of the second exposure with the "modification pattern". FIG. 29 illustrates the resultant photoresist pattern which may be used to form the polysilicon in the same pattern.

Figure 30:
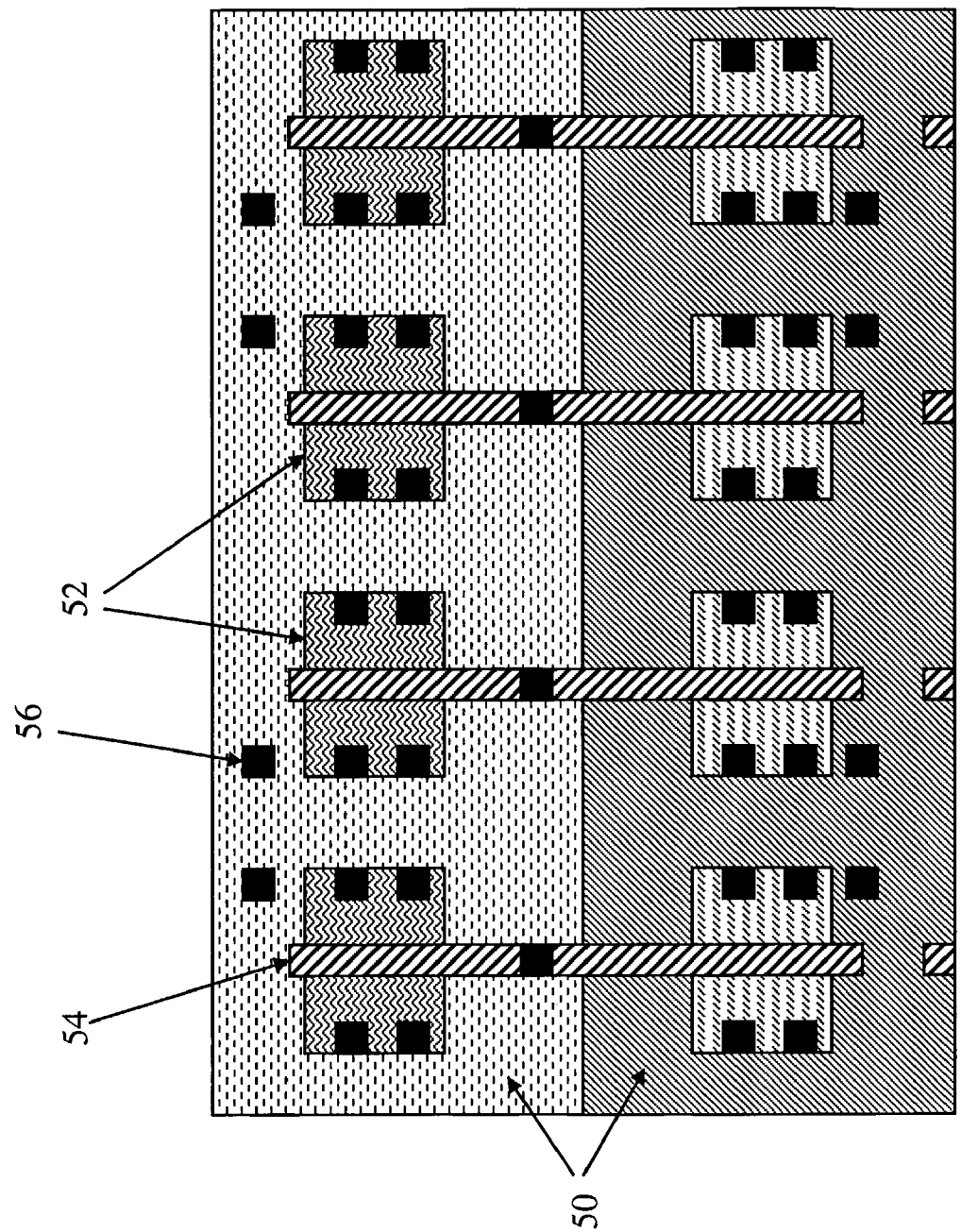
Figure 31:
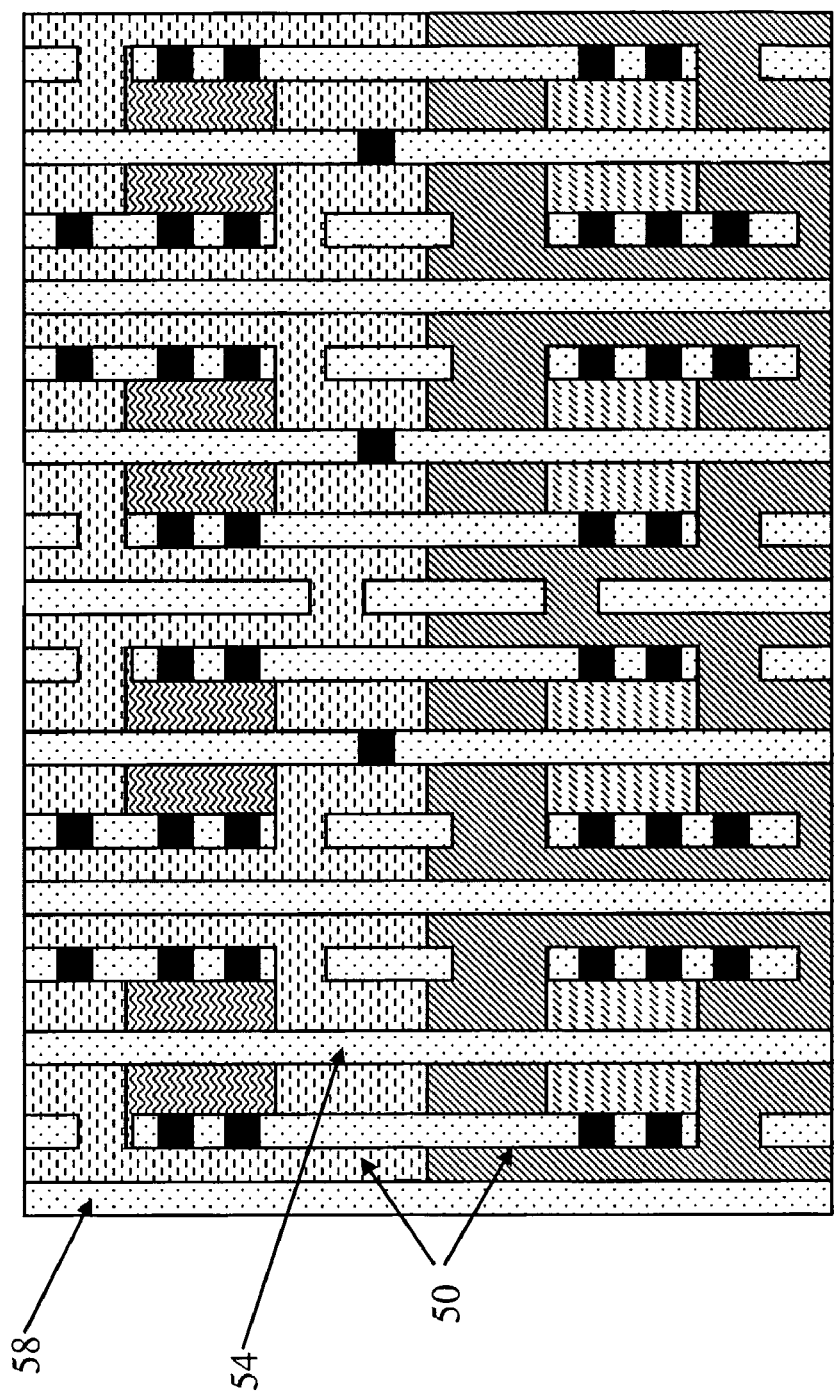
Figure 32:
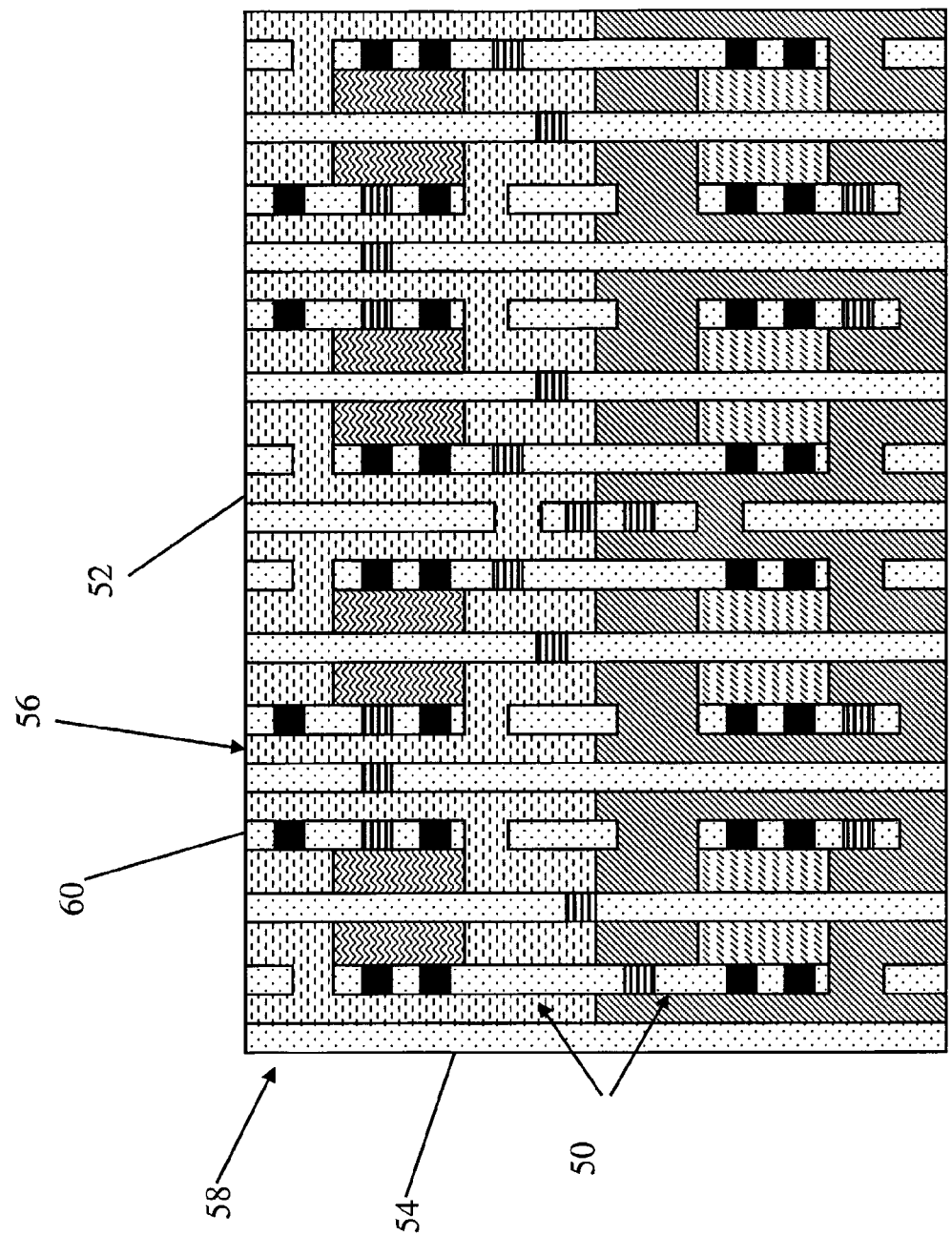
Figure 33:
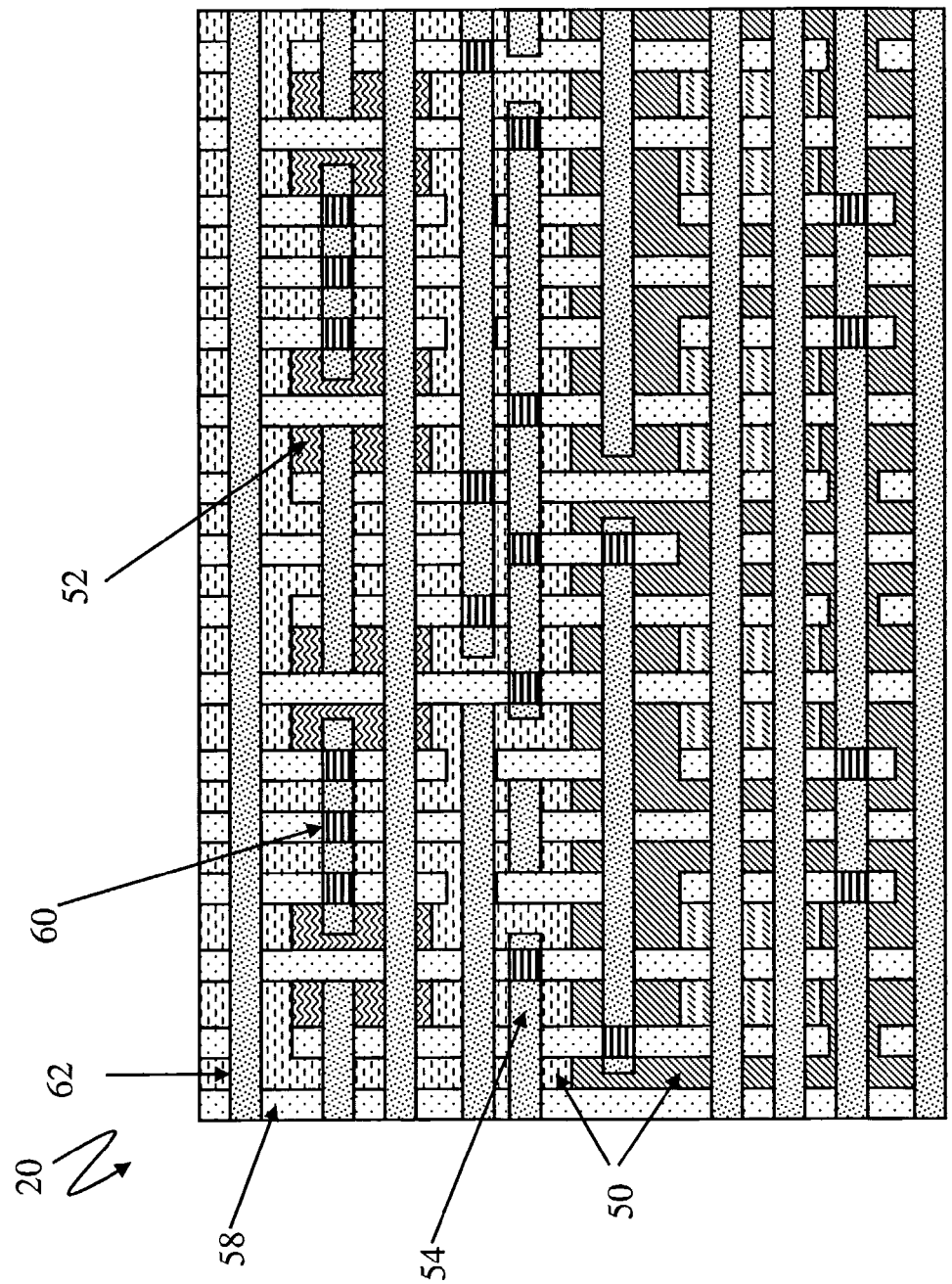

FIGS. 30-33 illustrate the incremental formation of the contacts, metal 1 pattern, vias, and metal 2 pattern. FIG. 30 illustrates the addition of the contacts 56 using the "orthogonal 1" B-pattern. FIG. 31 illustrates the addition of the metal 1 pattern 58 using the "vertical 1" B-pattern. FIG. 32 illustrates the addition of vias 60 using the "orthogonal 1" B-pattern. FIG. 33 illustrates the addition of the metal 2 pattern 62 using the "horizontal 1" B-pattern.

Figure 34:
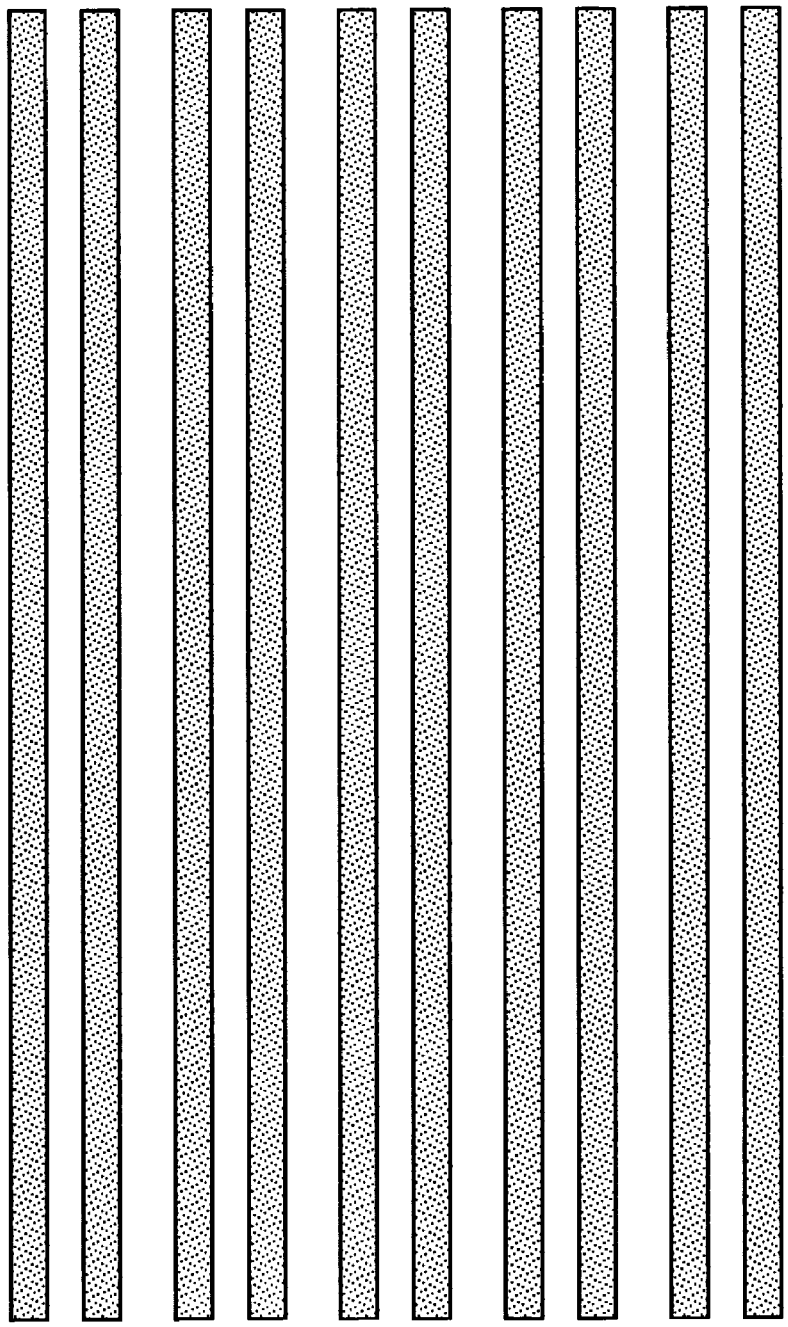
Figure 35:
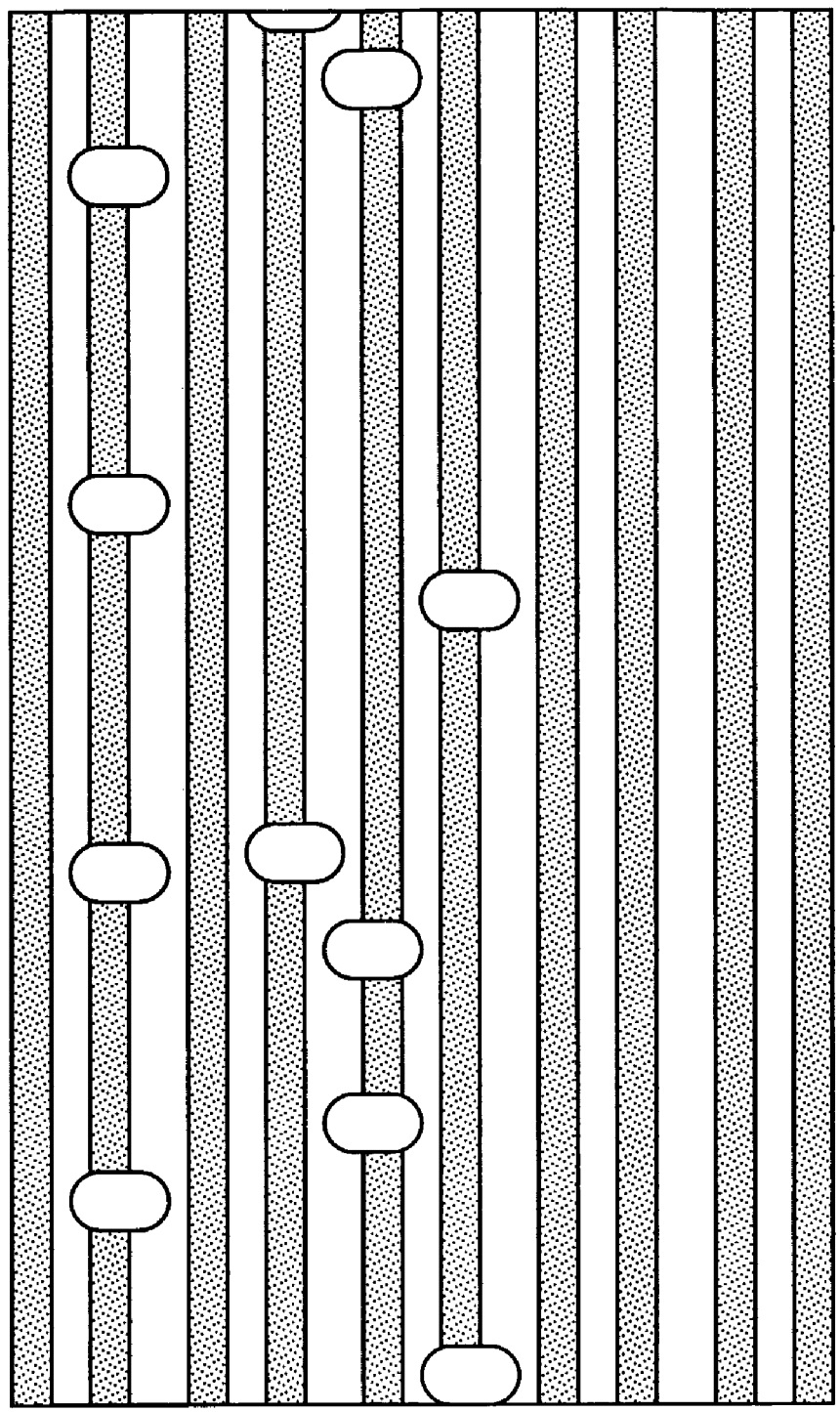
Figure 36:
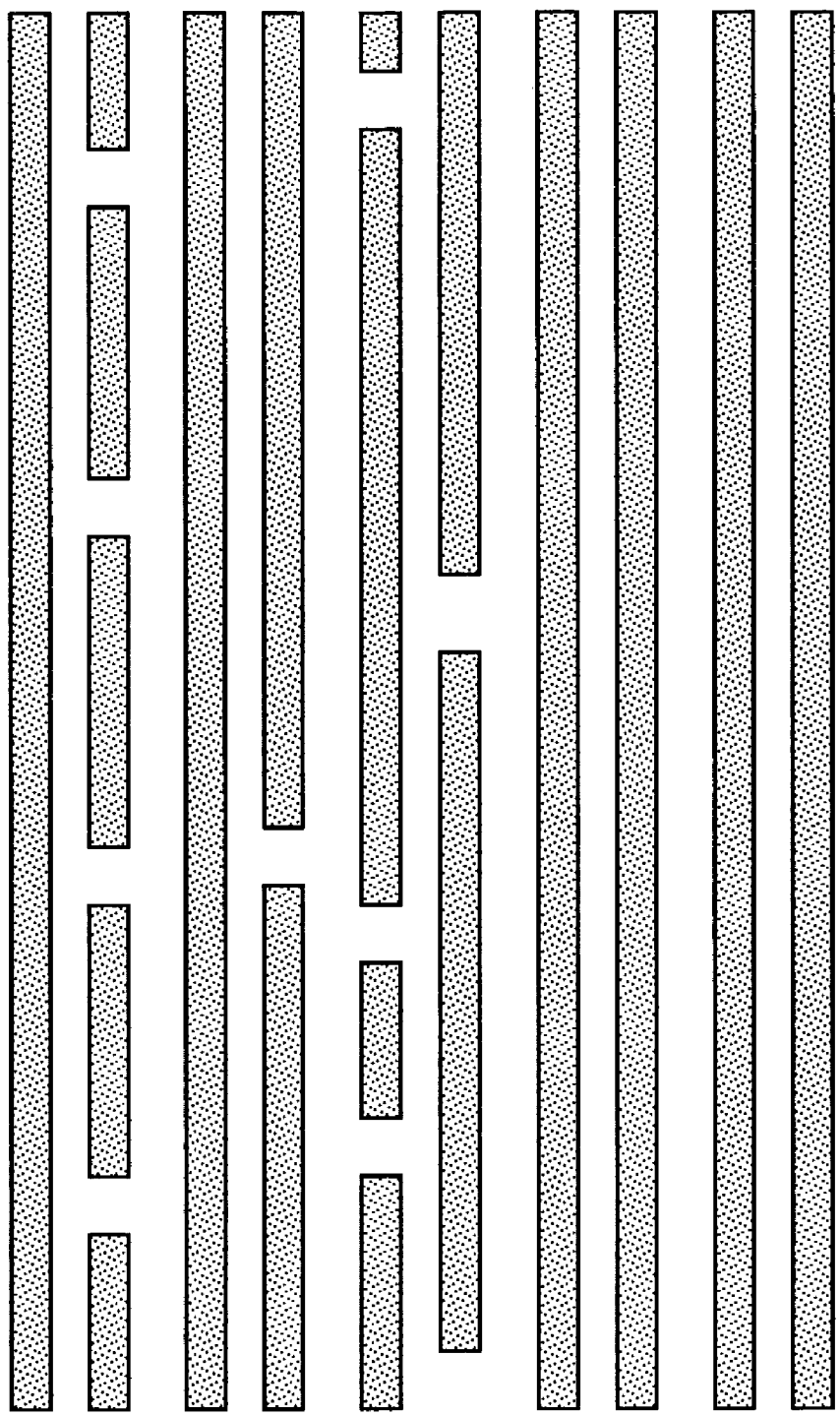
Figure 37:
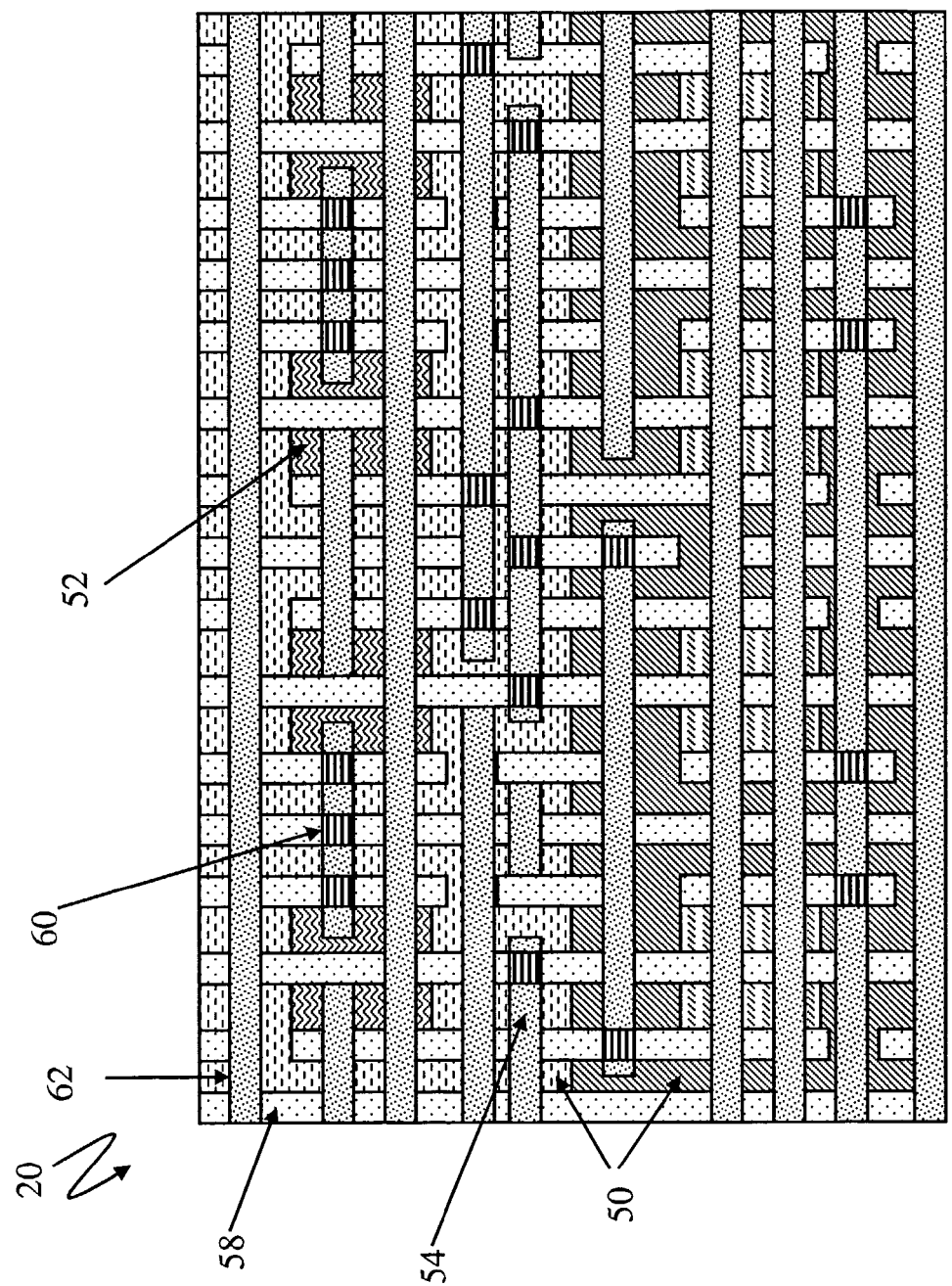

FIGS. 34-37 illustrate an example of the metal 2 pattern formation in more detail. FIG. 34 illustrates the first exposure of the photoresist layer with the "horizontal 1" B-pattern. FIG. 35 illustrates the overlay of the second exposure with the "modification pattern". FIG. 36 illustrates the resultant photoresist pattern which may be used to form the metal 2 pattern. FIG. 37 illustrates the completed integrated circuit 20 including the metal 2 pattern.

Figure 38:
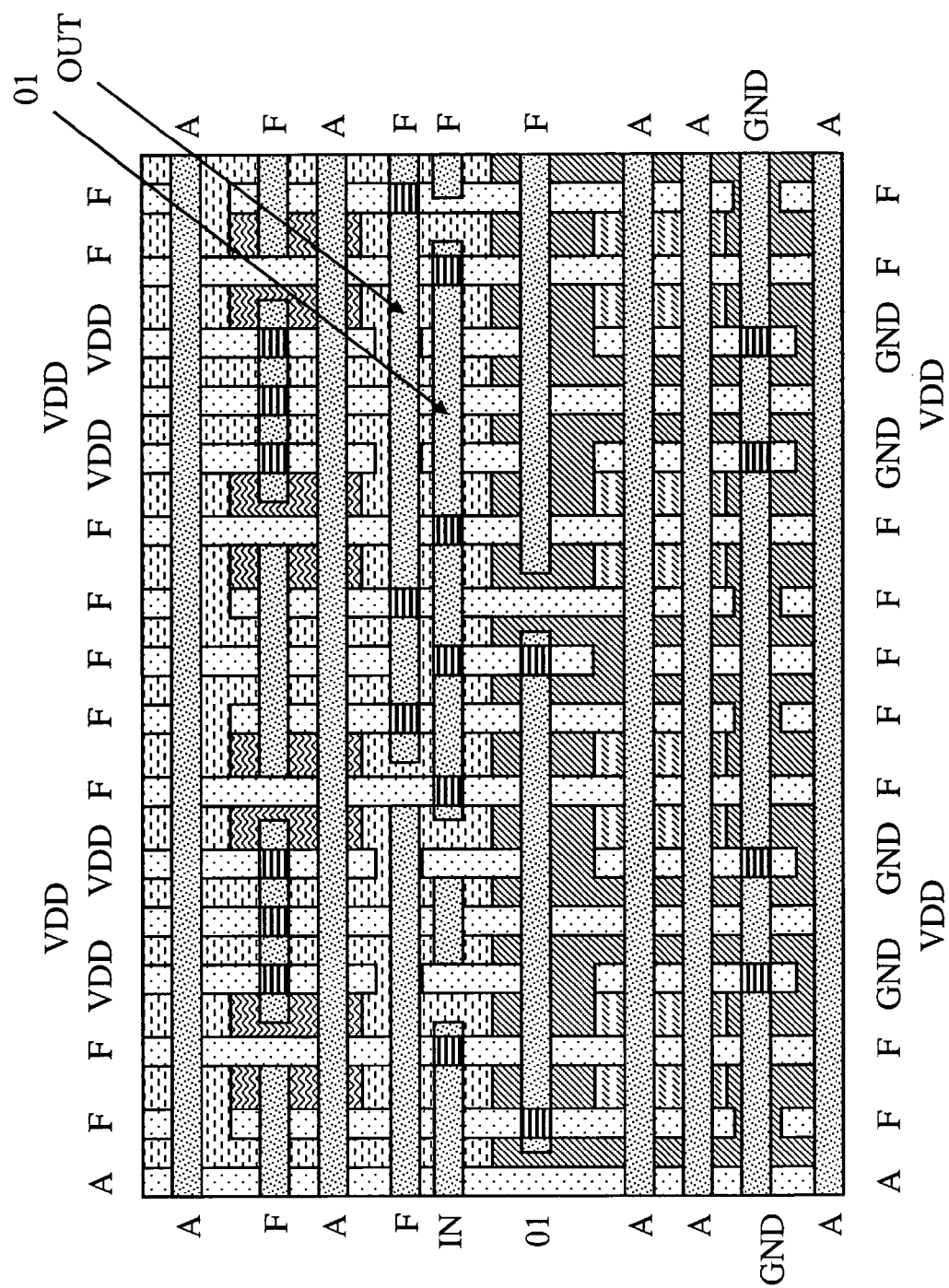

FIG. 38 illustrates the completed integrated circuit 20 with various elements labeled.

EXAMPLE NUMBER 3

Figure 39:
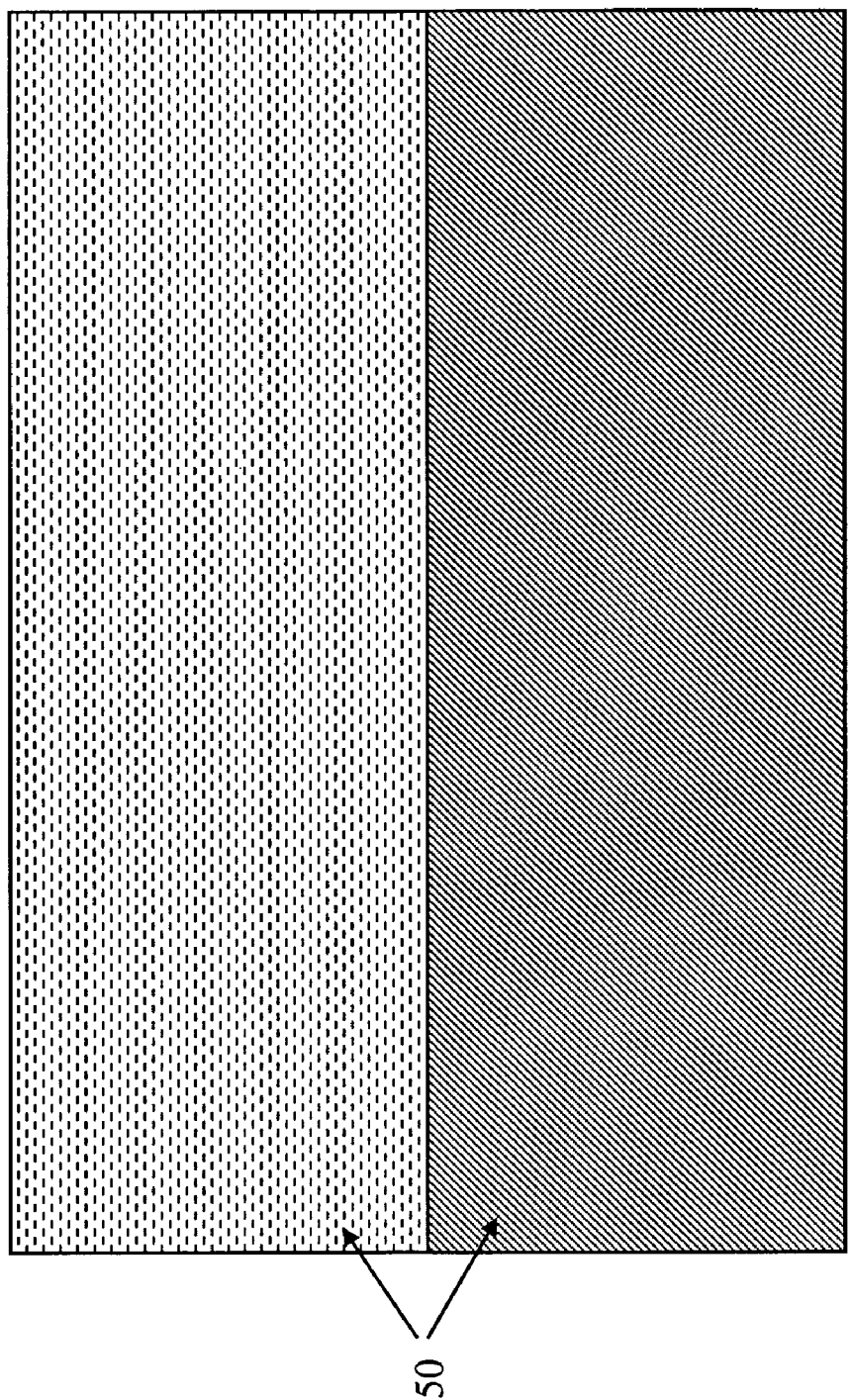
FIGS. 39-46 illustrate process steps for forming NOR and NAND gates according to the present invention.
Figure 40:
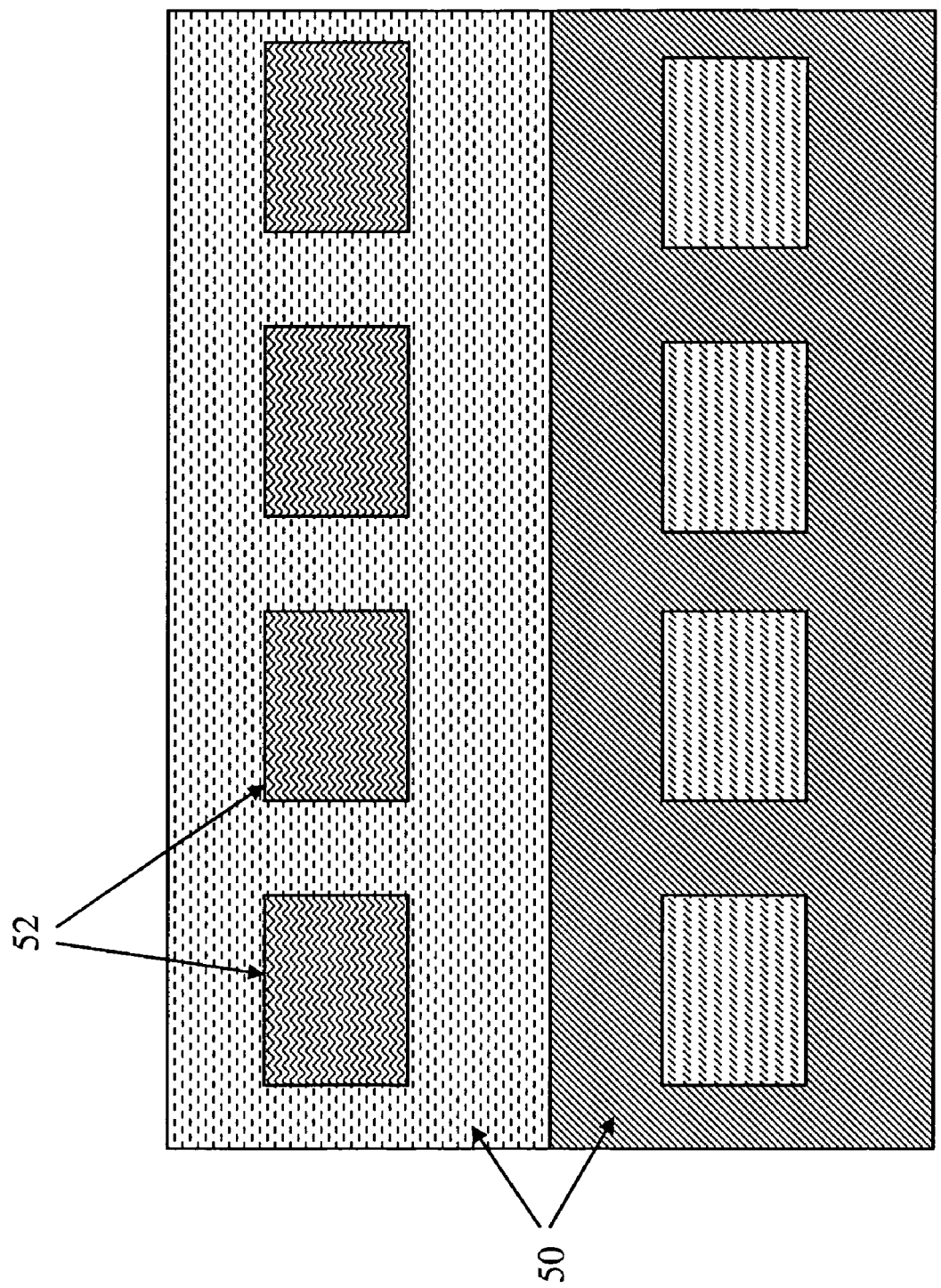
Figure 41:
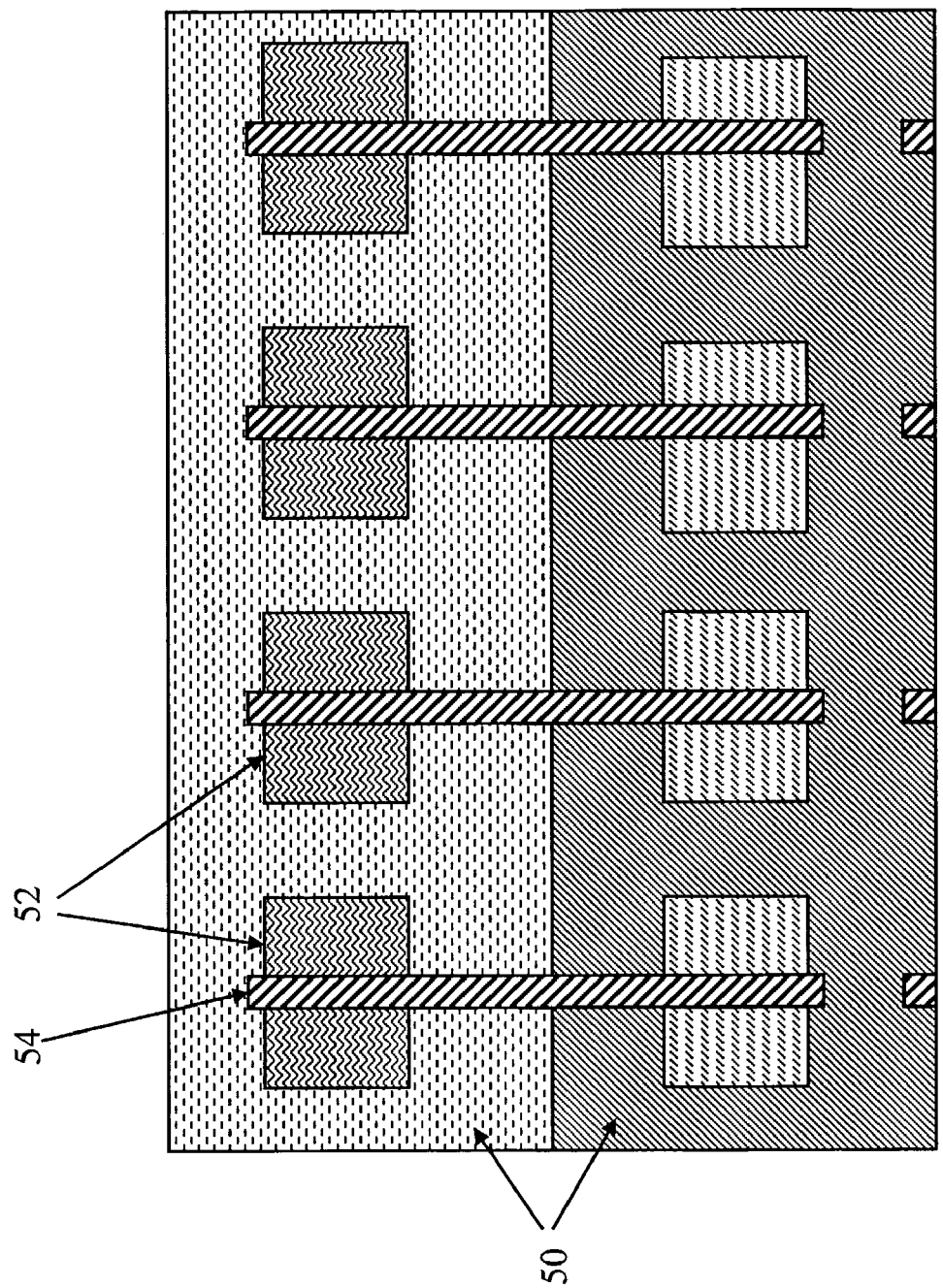
Figure 42:
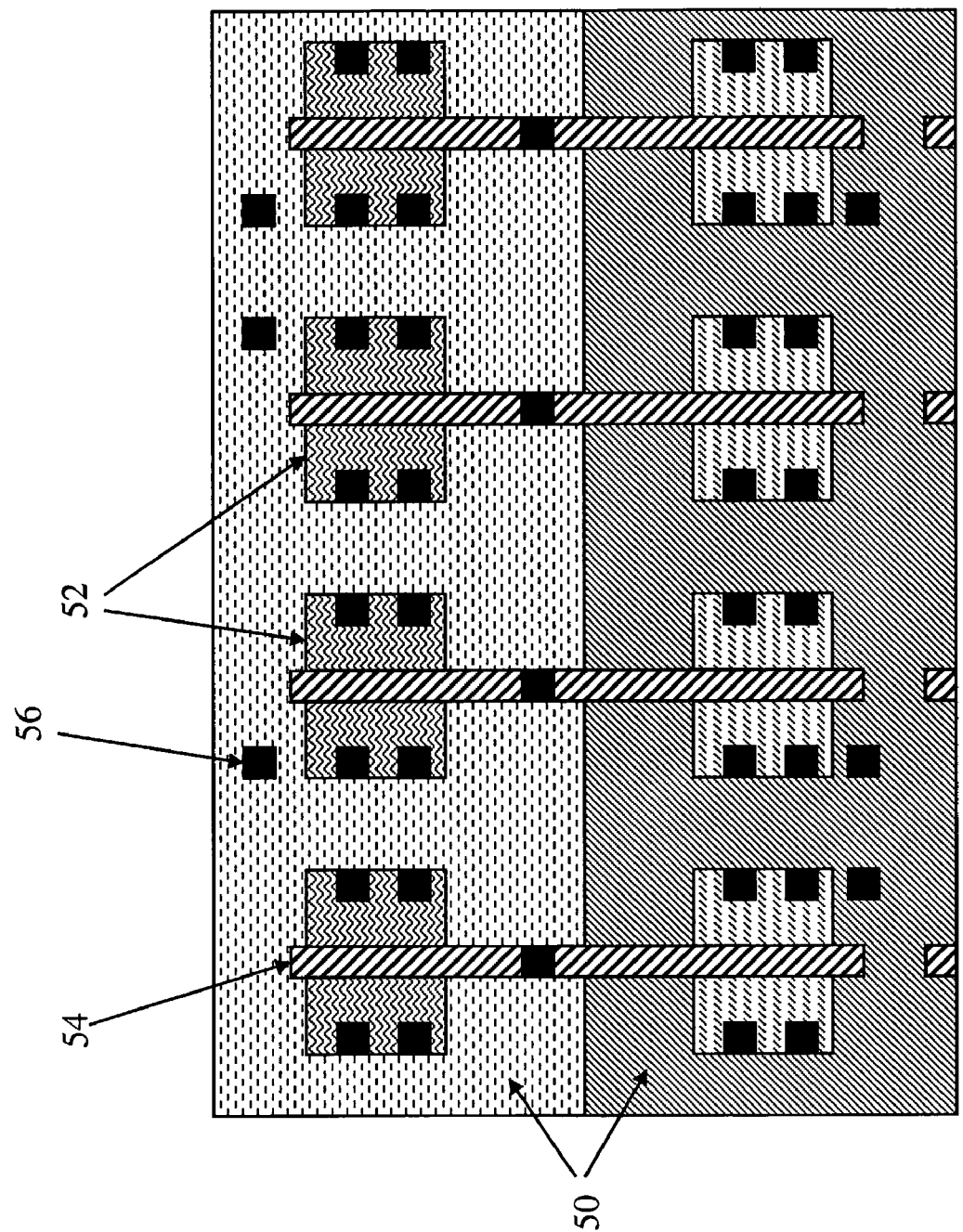
Figure 43:
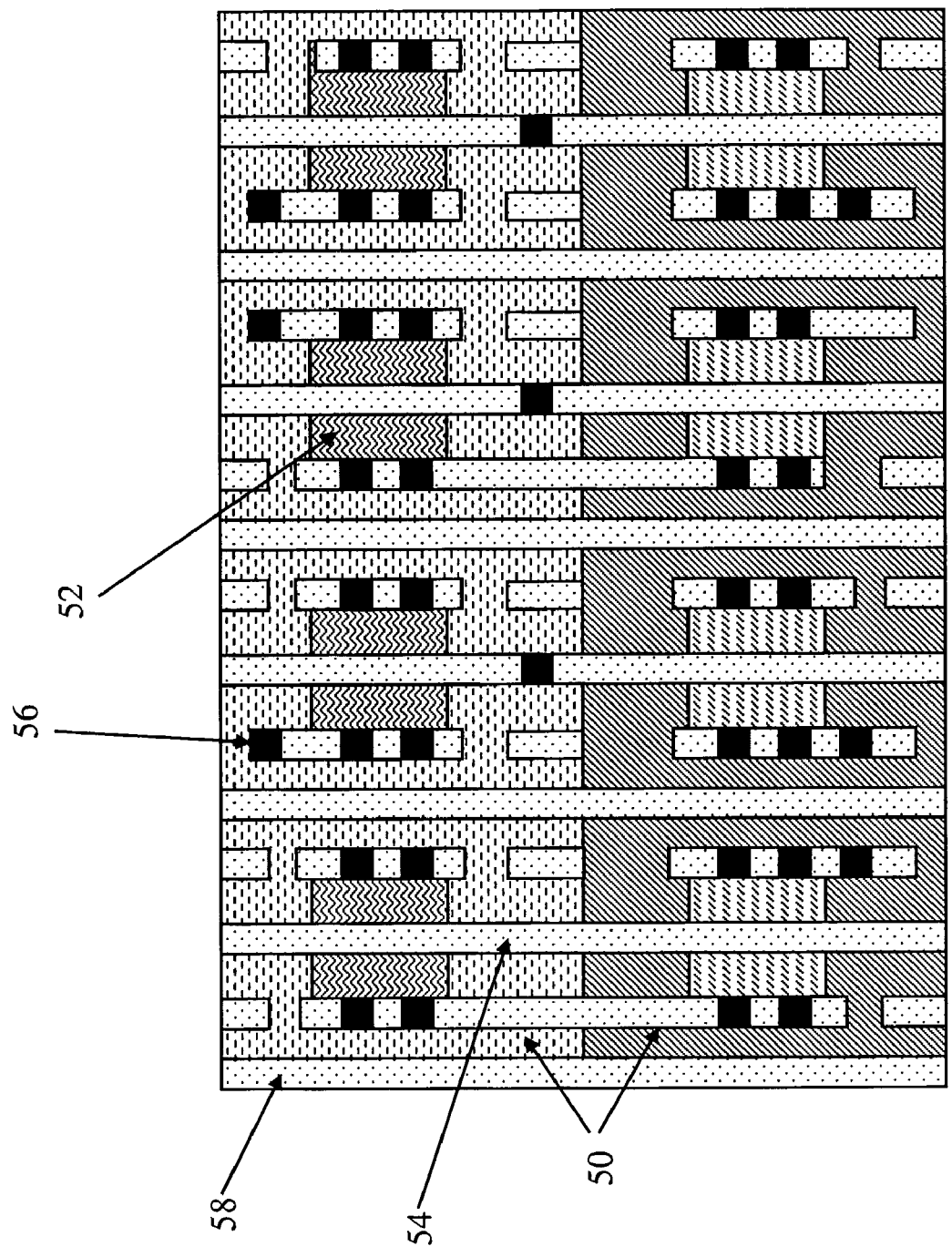
Figure 44:
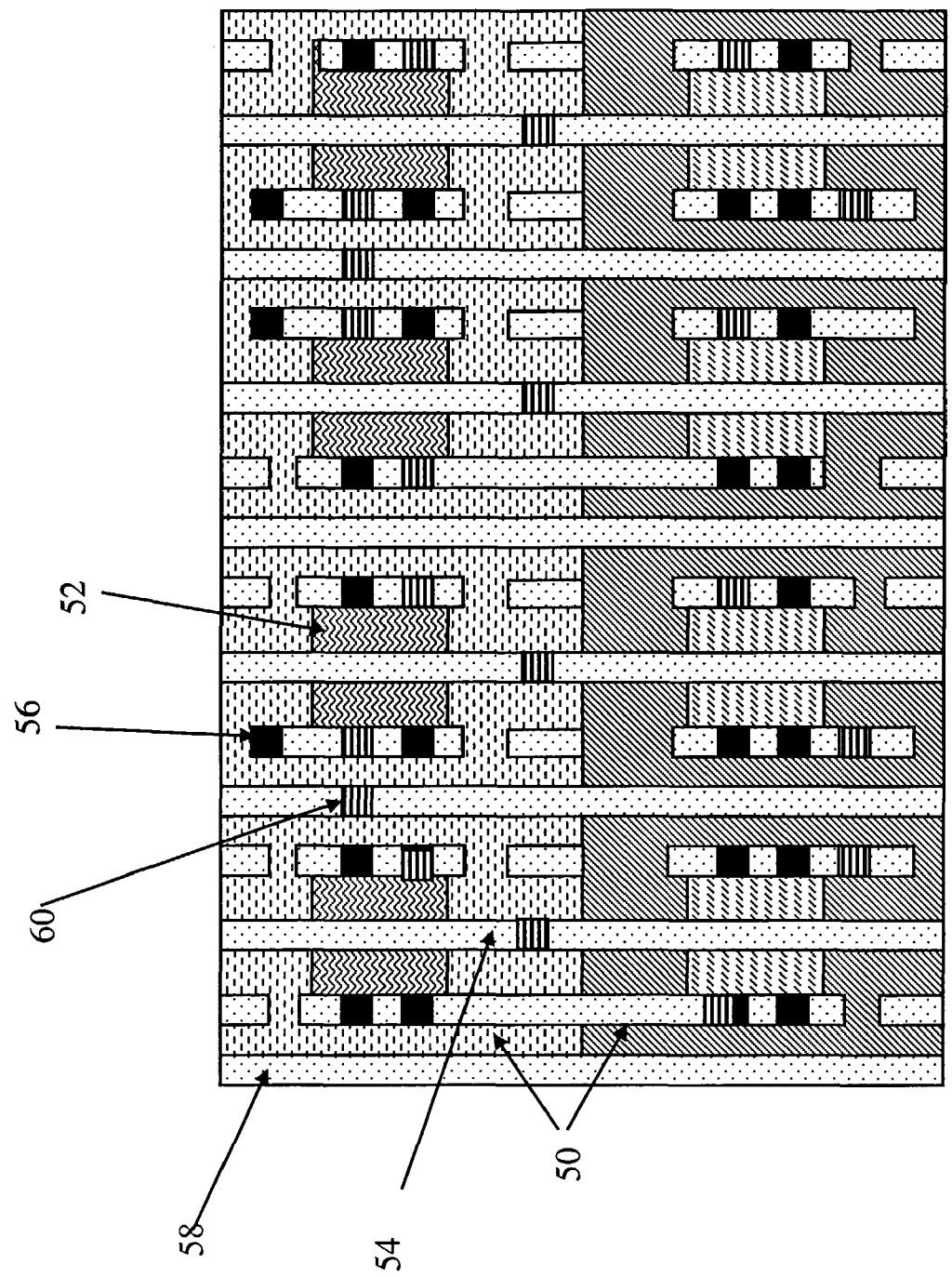
Figure 45:
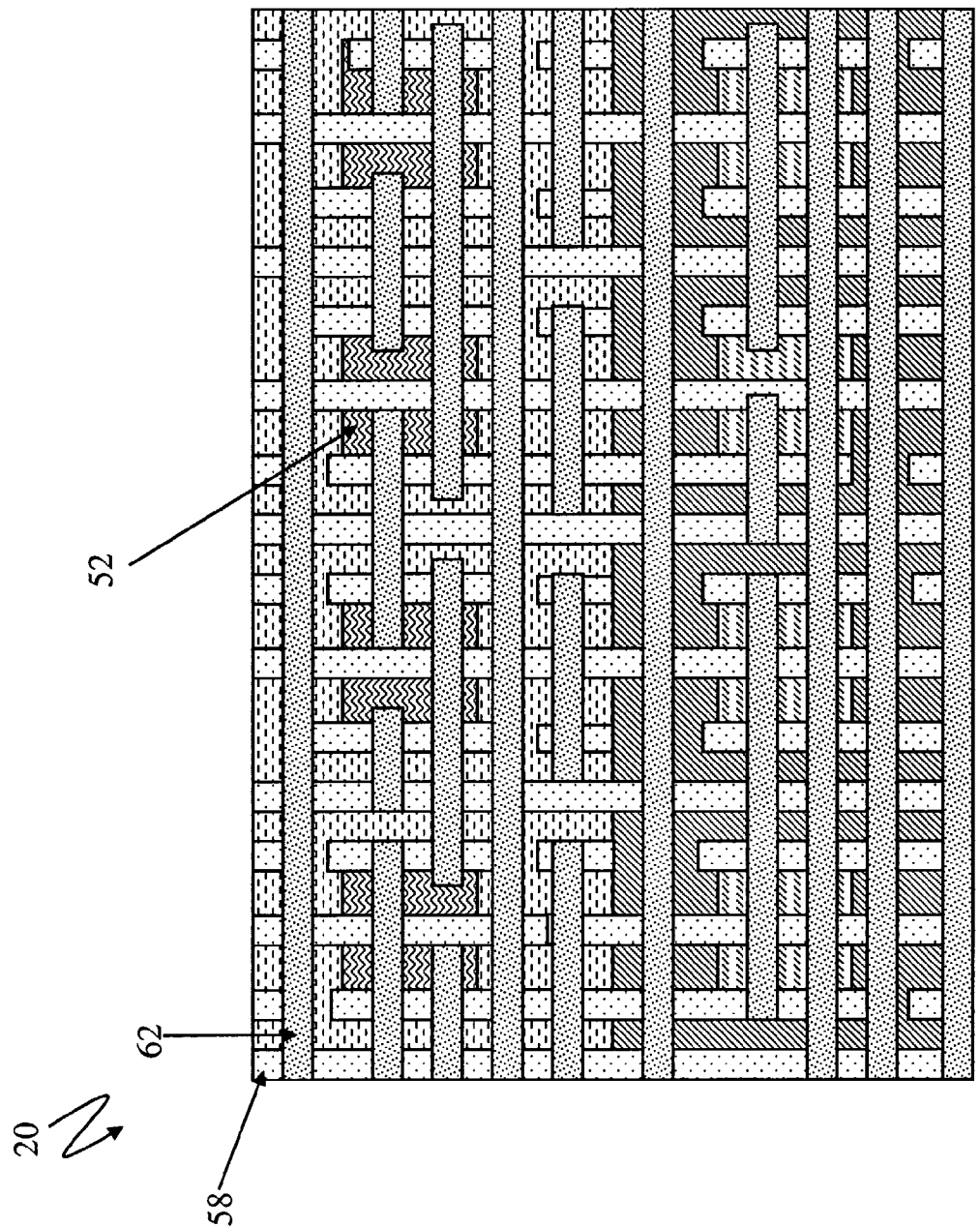
Figure 46:
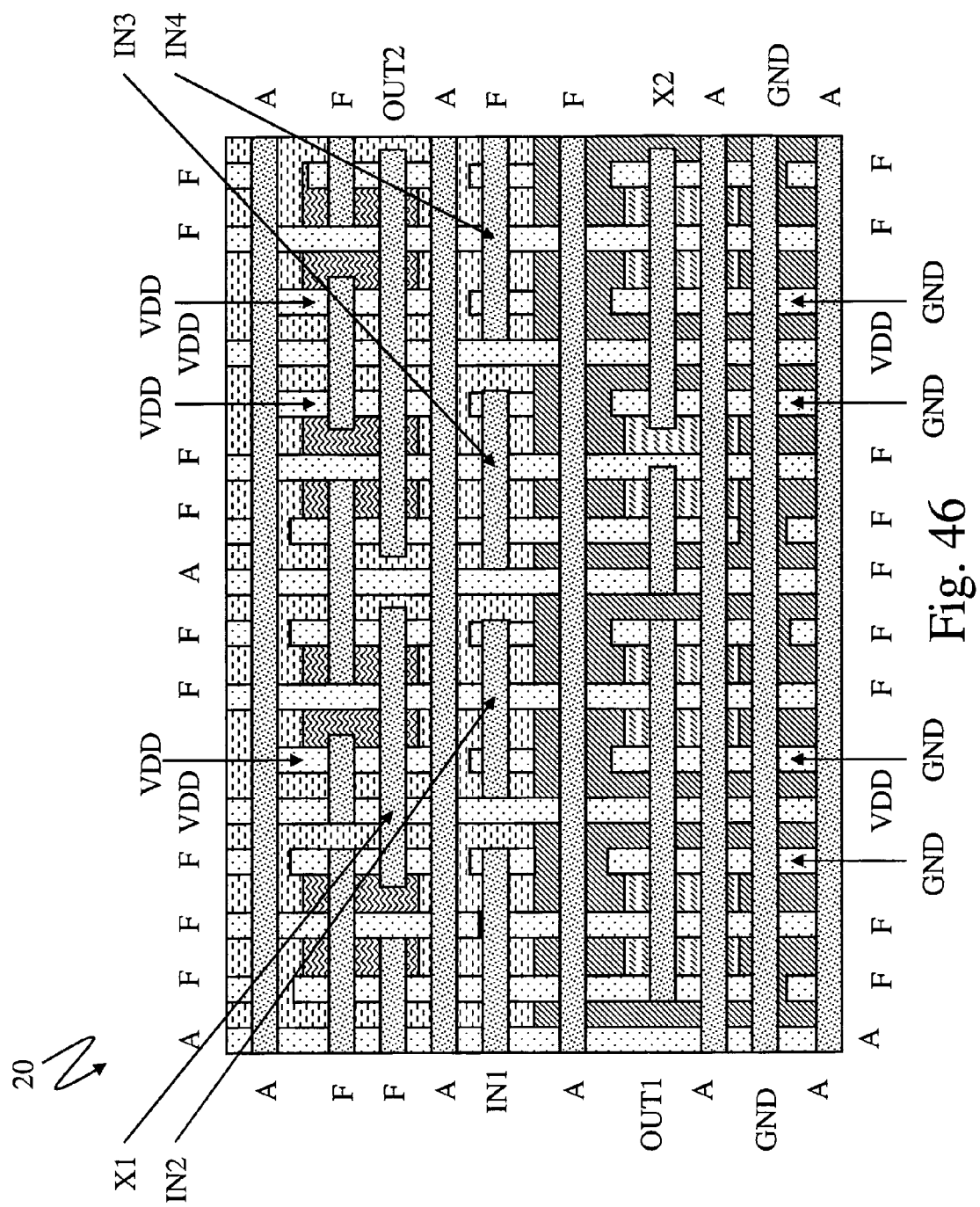

FIGS. 39-46 illustrate process steps for forming NOR and NAND gates according to the present invention. FIG. 39 illustrates the addition of wells 50 with the "horizontal 2" B-pattern. FIG. 40 illustrates the addition of active areas 52 with the "orthogonal 2" B-pattern. FIG. 41 illustrates the addition of polysilicon 54 with the "vertical 2" B-pattern. FIG. 42 illustrates the addition of the contacts 56 using the "orthogonal 1" B-pattern. FIG. 43 illustrates the addition of the metal 1 pattern 58 using the "vertical 1" B-pattern. FIG. 44 illustrates the addition of vias 60 using the "orthogonal 1" B-pattern. FIG. 45 illustrates the addition of the metal 2 pattern 62 using the "horizontal 1" B-pattern. FIG. 46 illustrates the completed integrated circuit 20 with inputs and outputs labeled, wherein "F" is "floating" and "A" is "pass through".

As described herein, six B-patterns can be used to fabricate various cells using multiple exposure lithography according to the present invention. Layout patterns for the described cells are very regular and it is believed that they will have good quality edges for all crucial layout cell components.

The set of six B-patterns 10 illustrated in FIG. 22 were used in the above examples to build several cells and they may be used to build additional cells to create an ASIC-like library of cells. This offers a wide variety of fabrication options from a small number of B-patterns 10. If desired, additional B-patterns may also be used.

Figure 47:
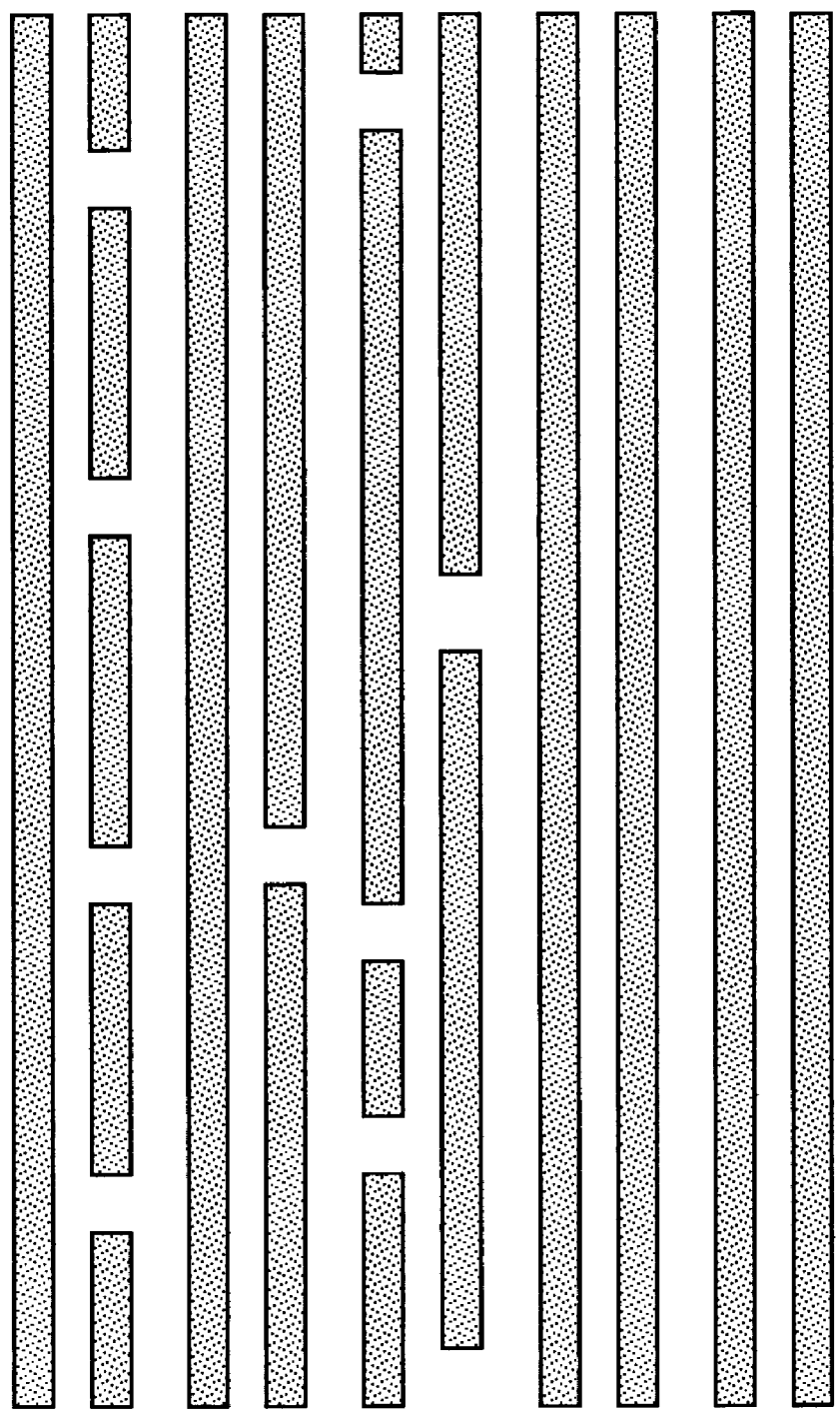
FIGS. 47-49 illustrate examples of pattern density, design density, and transparency.
Figure 48:
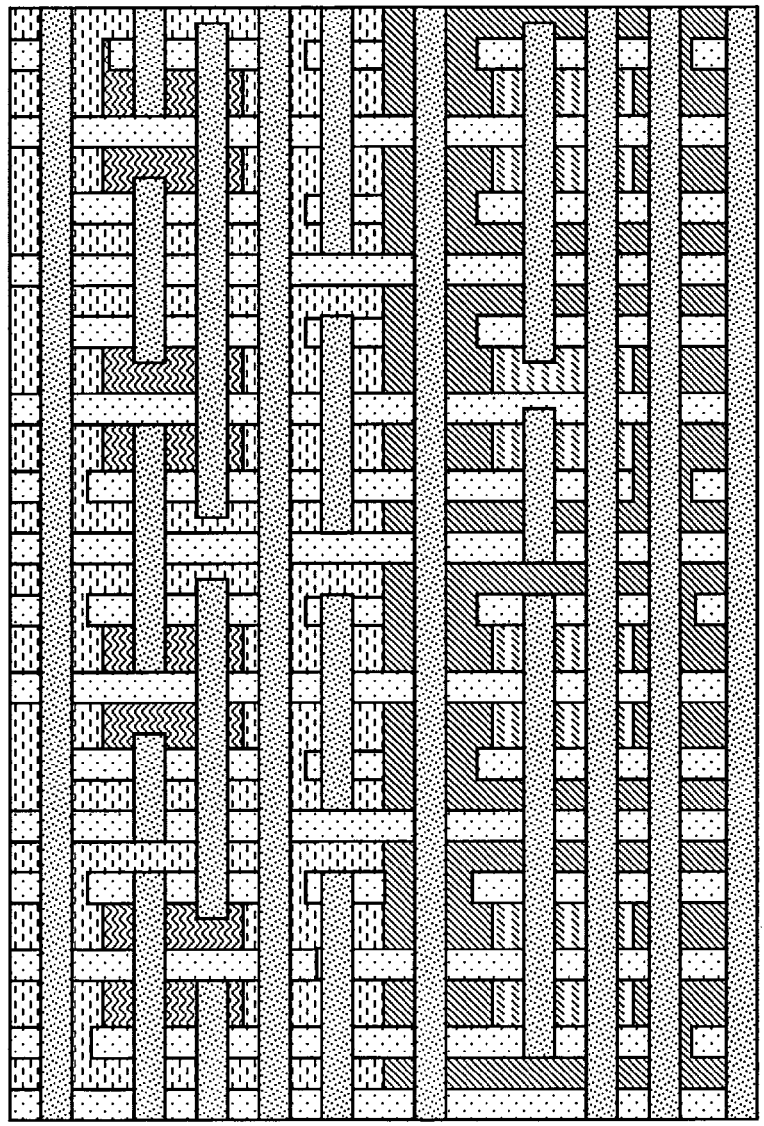
Figure 49:
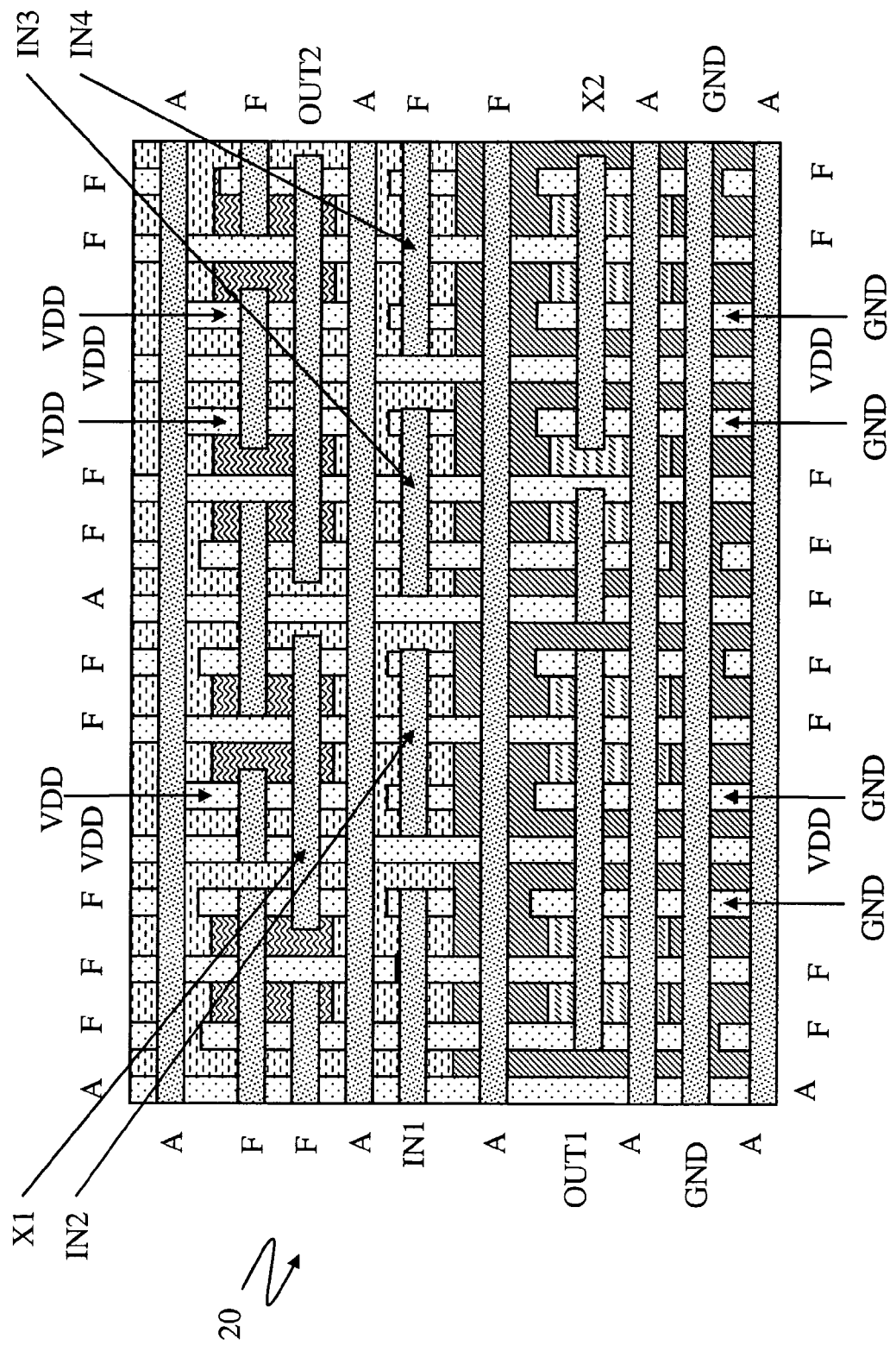

When considering cells, several important characteristics are pattern density, design density, and redundant components. With regard to redundant components, a cell's transparency in metal 1 and metal 2 as well as utilization of redundant tracks are important consideration. Regarding pattern density, polysilicon, metal 1, and metal 2 generally have very uniform pattern density, as illustrated in FIG. 47 which is an example using a "horizontal 1" B-pattern. Regarding design density and cell transparency, FIGS. 48 and 49 illustrate design density and cell transparency using the NOR and NAND gates example described hereinabove. With regard to the utilization of redundant components, "floating tracks" may be used to expand VDD and GND networks, shield sensitive lines, form redundant connections, and provide additional test points, such as through E-beam, electrical contact, or otherwise. Redundant components may also be used to provide extra "observability" of the process and product, to enable circuit level redundancy, or to provide on-line reconfiguration or repair. Redundant components may be, for example, sections of polysilicon or metal, or they may be further processed into transistors or other components.

Maskless Fabrication and Scanning Projectors.

The present invention also includes methods and apparatuses for "maskless fabrication". For example, the present invention may be used to form B-patterns without conventional masks, to modify B-patterns without conventional masks, and to form or modify other patterns and perform other processing steps without convention masks. In some embodiments, the present invention may utilize both conventional masks and maskless fabrication. For example, maskless fabrication may be used for part of the lithographic process, and conventional masks may be used for other parts of the lithographic process.

Figure 50:
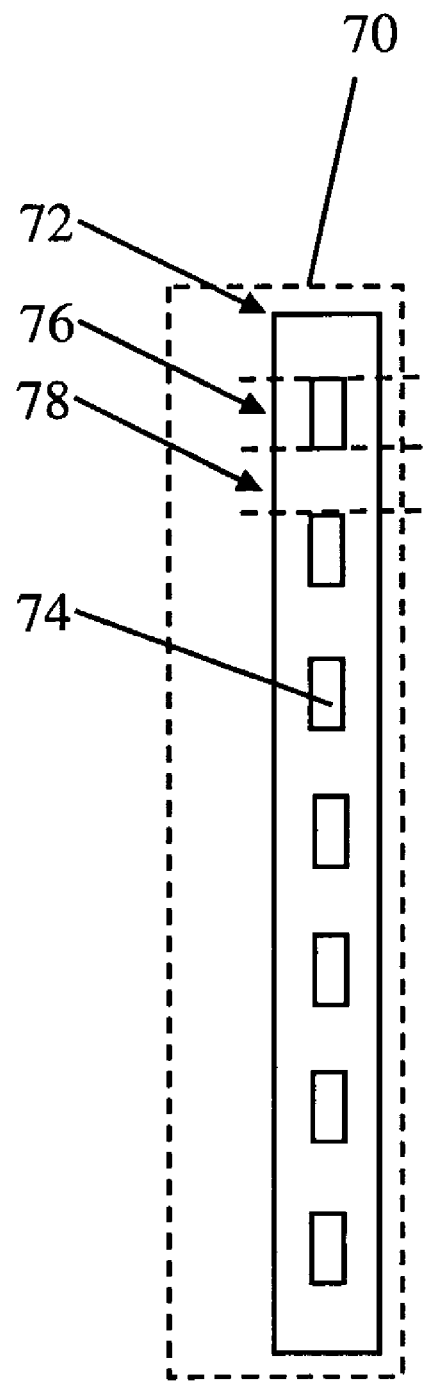
FIG. 50 illustrates one embodiment of a device that may be used with maskless fabrication.
Figure 51:
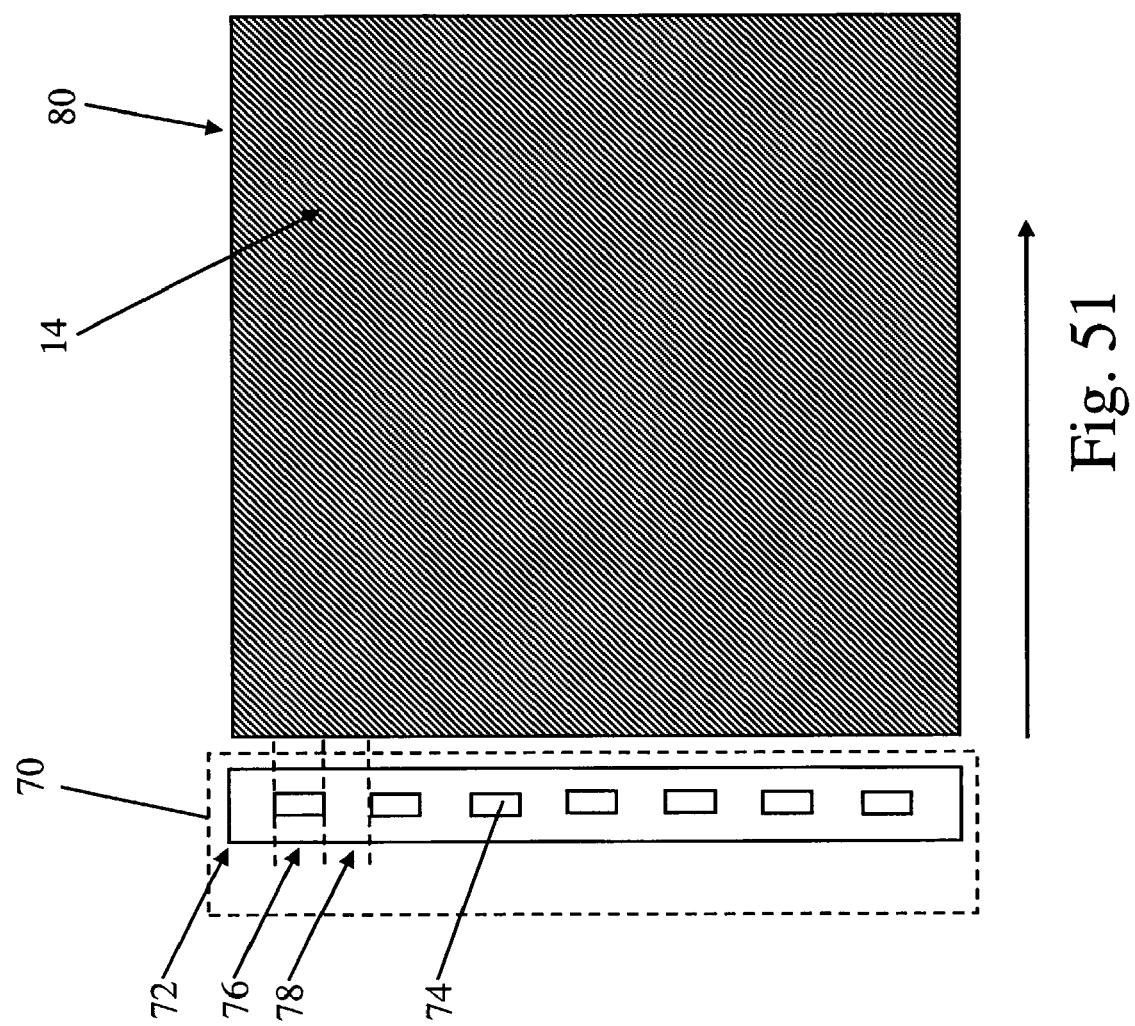
FIGS. 51-59 illustrate a scanning projector moving across a surface.
Figure 52:
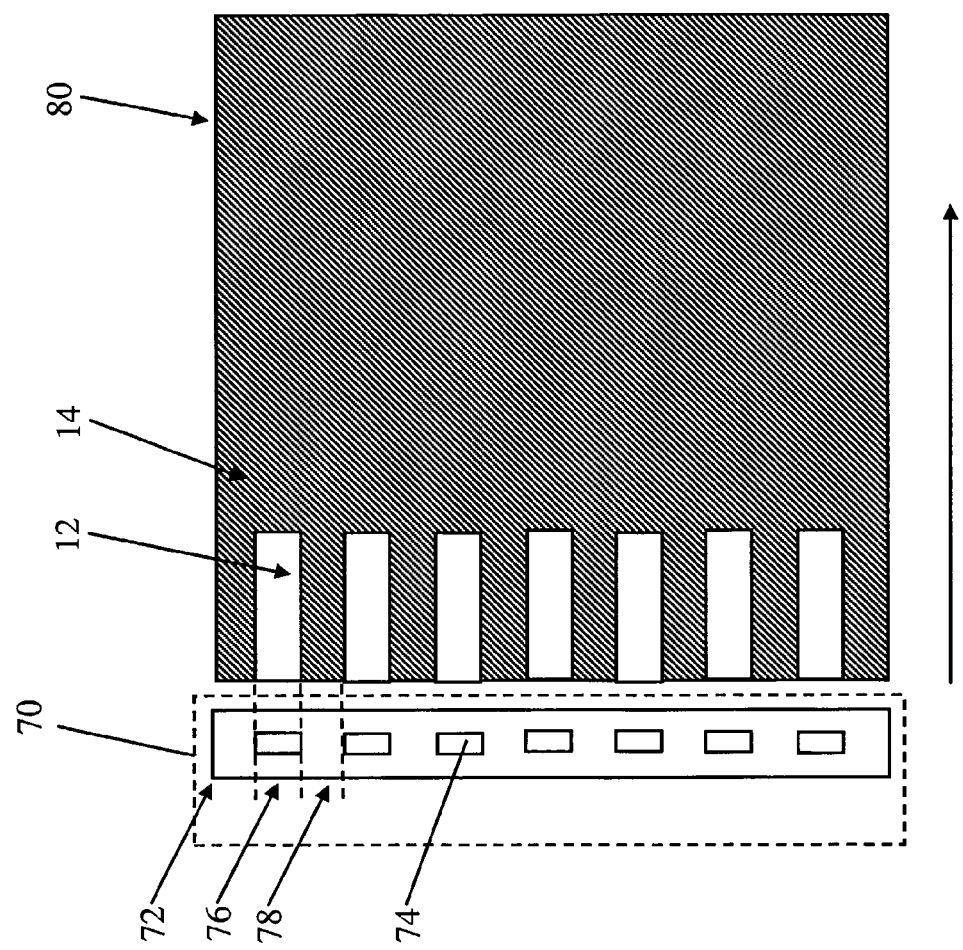
Figure 53:
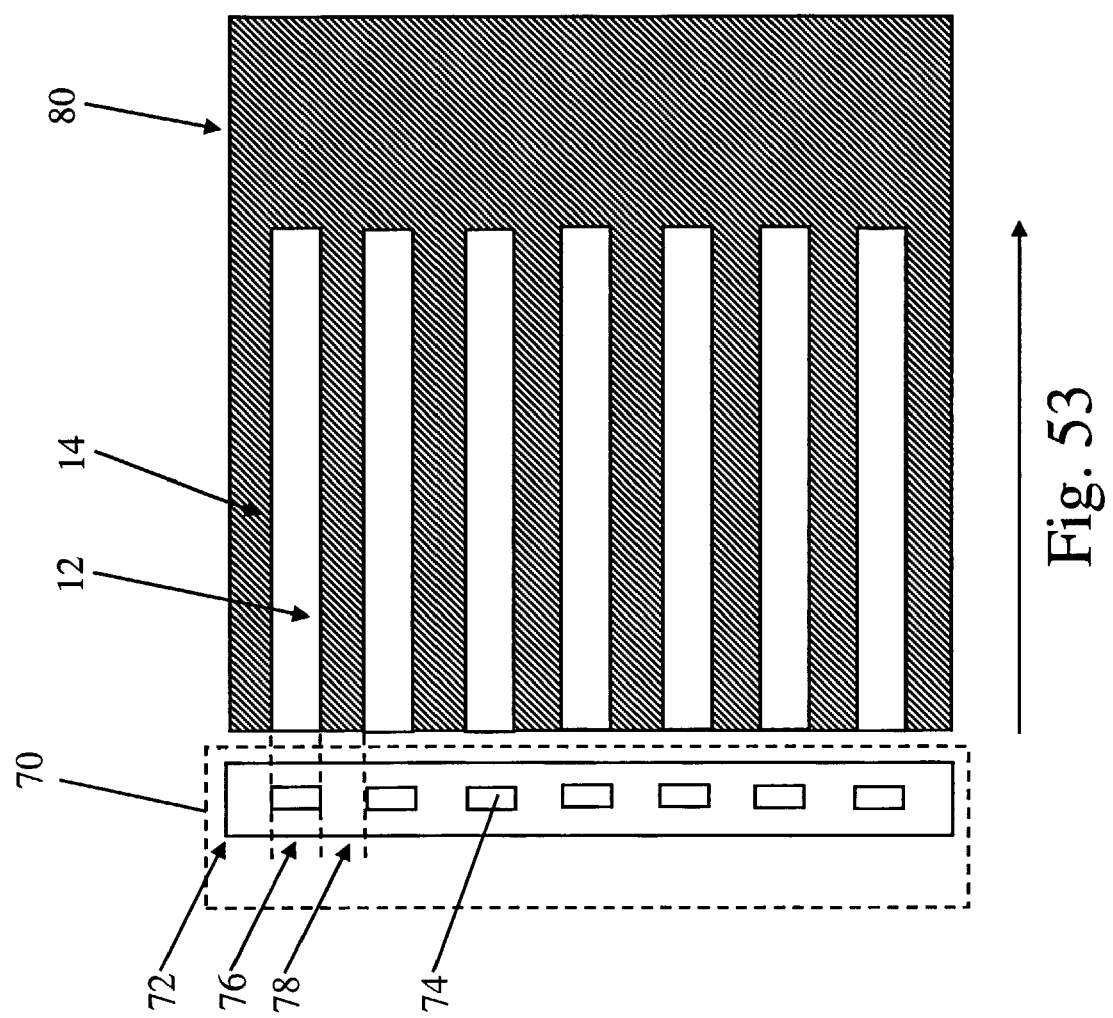
Figure 54:
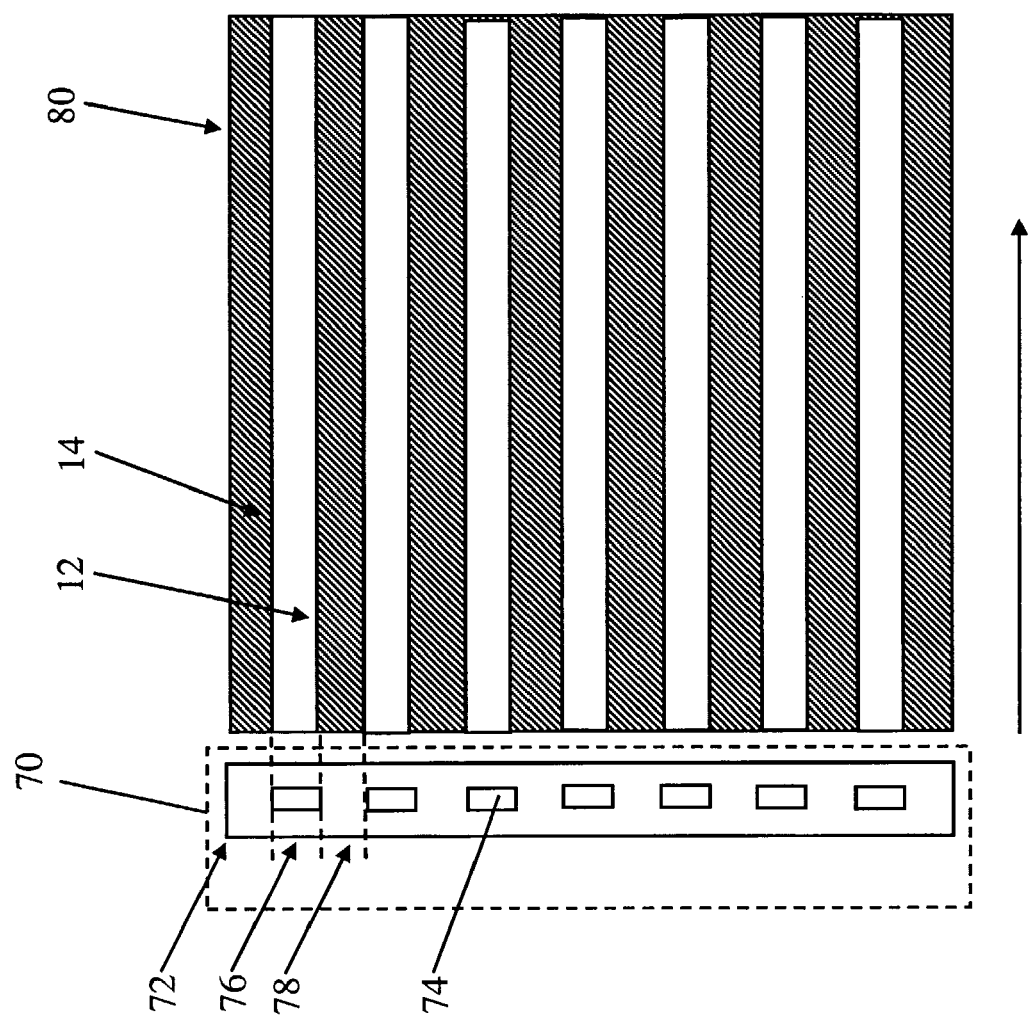

Several embodiments of devices that may be used for maskless fabrication are described herein. FIG. 50 illustrates one embodiment of such a device. The device can be moved or scanned relative to a surface, such as a semiconductor wafer coated with a layer of energy-sensitive material (e.g., photoresist), and will be referred to as a "scanning projector" 70. The scanning projector 70 includes a scanning mask 72 which will be described in more detail hereinbelow. The scanning mask 72 includes one or more "outlets" 74 in the form of openings or elements, and the openings have a width 76 and a spacing 78 relative to adjacent outlets 74. The outlets 74 may take several forms, such as energy outlet, material outlets, or other outlets. For example, energy outlets may project light or other energy onto a photoresist layer or other material. Alternatively, material outlets may project material, such as dopants, conductors, insulators, or other materials onto a surface. The surface, layer, material, or other subject of the outlets 74 can generally be referred to as a "target". The outlets may be fixed or variable in their shape, size, spacing, geometry, offset, and orientation, and other characteristics. For example, the outlets 74 in FIG. 50 are shown as being rectangular, although outlets may have other shapes, such as oval, circular, square, and others. Similarly, the outlets 74 on a scanning projector 70 may be uniform in size, shape, spacing, or other characteristics, or a scanning projector 70 may include outlets 74 that vary in one or more characteristics. In addition, the outlets 74 may include additional elements and devices, such as optical lens, magnetic focusing devices, micro-electromechanical systems, and other elements and devices for focusing, directing, controlling, or otherwise affecting the energy or material passing from the outlets 74. The scanning projector 70 will generally be described in terms of energy outlets used in conjunction with a layer of photoresist. However, as discussed herein, the present invention is also applicable to many variations and modifications. For example, the present invention may be used with material outlets. In addition, the present invention may include energy outlets used with surfaces other than a photoresist layer, such as other materials that can be modified by energy outlets. Furthermore, the present invention may be used with different processes, such as molecular beam lithography. Those and other variations and modification are within the spirit and scope of the present invention.

Energy outlets 74 may be openings through which energy may pass. The energy may come from one or more shared sources, or it may come from discrete sources of energy associated with individual outlets. For example, one or more energy sources may be placed within the scanning projector and oriented so that energy from those sources passes through two or more energy outlets and onto the photoresist layer or other material. Alternatively, each outlet may have its own energy source. In other words, each outlet may include a discrete energy source which provides energy only from that particular outlet. In other embodiments, scanning projectors may include a combination of shared and outlet-specific energy sources. The energy sources may be, for example, lasers, light emitting diodes, x-ray sources, electron beam sources, or other energy sources. A scanning projector may including energy sources of only one type, or scanning projectors may include two or more different types of energy sources.

Material outlets 74, like energy outlets, may be opening through which material from one or more sources may pass. For example, one or more shared material sources may provide material passing through several outlets. Alternatively, outlet-specific sources of material may also be used. Scanning projectors may also use a combination of shared and outlet-specific materials sources. In addition, scanning projectors may include outlets of different types, such as several energy outlets and several material outlets in the same scanning projector.

In general, outlets 74 may form a fixed pattern, similar to a conventional mask which does not change its pattern. Alternatively, some or all of the outlets may be controlled between "on" and "off" states, so as to control the pattern formed by the scanning projector. For example, outlets may be individually controlled so that they can be selectively turned "on" and "off". In other words, individual outlets may be controlled so that sometimes they apply energy or material to an underlying surface (i.e., in the "on" state), and at other times they do not apply energy or material to an underlying surface (i.e., in the "off" state). This control of the outlets may be exercised before the scanning project begins operation, so as to select the pattern to be applied, or outlets may be controlled during operation, such as to change a pattern during operation of the scanning projector.

In other embodiments, outlets 74 may be controlled in groups of two or more. Scanning projectors 70 may also have a combination of individually controlled outlets, group controlled outlets, and outlets in a fixed state. As a result, the energy or materials applied by the scanning projector may be selectively turned on and off and selectively applied. In this way, a single pass of a scanning projector can form a complete pattern, without the need to perform subsequent exposure steps. Alternatively, subsequent passes of the scanning projector may also be performed, such as to provide additional exposure of energy or materials, to more precisely define an exposure pattern, or for other purposes.

The outlets 74 in the scanning projector 70 may be in the form of one or more removable "scanning masks" 80 which form part of the scanning projector 70. Removable scanning masks 80 offer the advantage of allowing multiple patterns of openings or elements to be interchangeably used with the single scanning projector 70. Removable scanning masks 80 also allow for defective masks to be replaced while the underlying scanning projector 70 can be reused. Alternatively, the scanning projector 70 may be implemented without removable scanning masks 80. For example, the outlets 74 may be integrated into the scanning projector 70. In the case of outlets 74 integrated into a scanning projector 70, the portion or portions of the scanning projector 70 forming the outlets 74 may by considered to be non-removable scanning masks 80.

Accordingly, the outlets 74 and the scanning projectors 70 may be implemented in a variety of ways. As a result, the discussions and examples provided herein which are directed to a scanning mask 80, may be implemented as either removable scanning masks or non-removable scanning masks (e.g., an integral portion of a scanning projector which includes the outlets). Similarly, the discussions and examples which are directed to removable scanning masks may also be implemented as non-removable scanning masks (e.g., outlets integral in the scanning projector), and the discussions and examples which are directed to non-removable scanning masks may also be implemented with removable scanning masks. Those and other variations of the present invention are possible.

The scanning projector 70 may include or be connected to devices to facilitate the operation of the scanning projector. For example, the scanning projector may include a memory, a controller, a processor, a design insertion control unit, and other devices. These devices may be used, for example, for storing instructions and patterns, for determining how to form desired patterns, for executing instructions, for controlling the outlets, and for other operations. The design insertion control unit, for example, may be used to modify the pattern to be formed by the scanning projector in response to feedback or other information, such as the detection of defects on the surface of a wafer. In one embodiment, the design insertion control unit tracks the progress of the scanning projector, receives information indicative of a defect on a wafer, and provides new instructions to the scanning projector for compensating for the defect. For example, the pattern may be changed in the area of the defect in order to compensate for the defect. In addition, the number, composition, location, and other characteristics of redundant features may be modified in response to the defects. For example, if the number of defects is less than expected, then certain redundant features may be eliminated or replaced with different features. Similarly, if the number of defects are more than expected, then additional redundant features may be added. Those and other functions are possible. The various devices associated with the scanning projector may be located within the scanning projector or they may be located outside of the scanning projector, such as in a separate controller.

According to one embodiment of the present invention, the scanning projector or an associated controller may be programmed with desired parameters, such as widths and spacings of the energy outlets, the pattern to be formed on the photoresist, and other parameters. After the photoresist is deposited and the scanning projector or controller is programmed, the scanning projector forms the desired pattern by moving relative to the wafer or other target. Thereafter, a new wafer or other target may be processed with the same program, or the scanning projector or controller may be programmed with other parameters. For example, the same wafer may be rotated and processed again, with the same or a different pattern.

Scanning Projector

Embodiment Number 1

Figure 55:
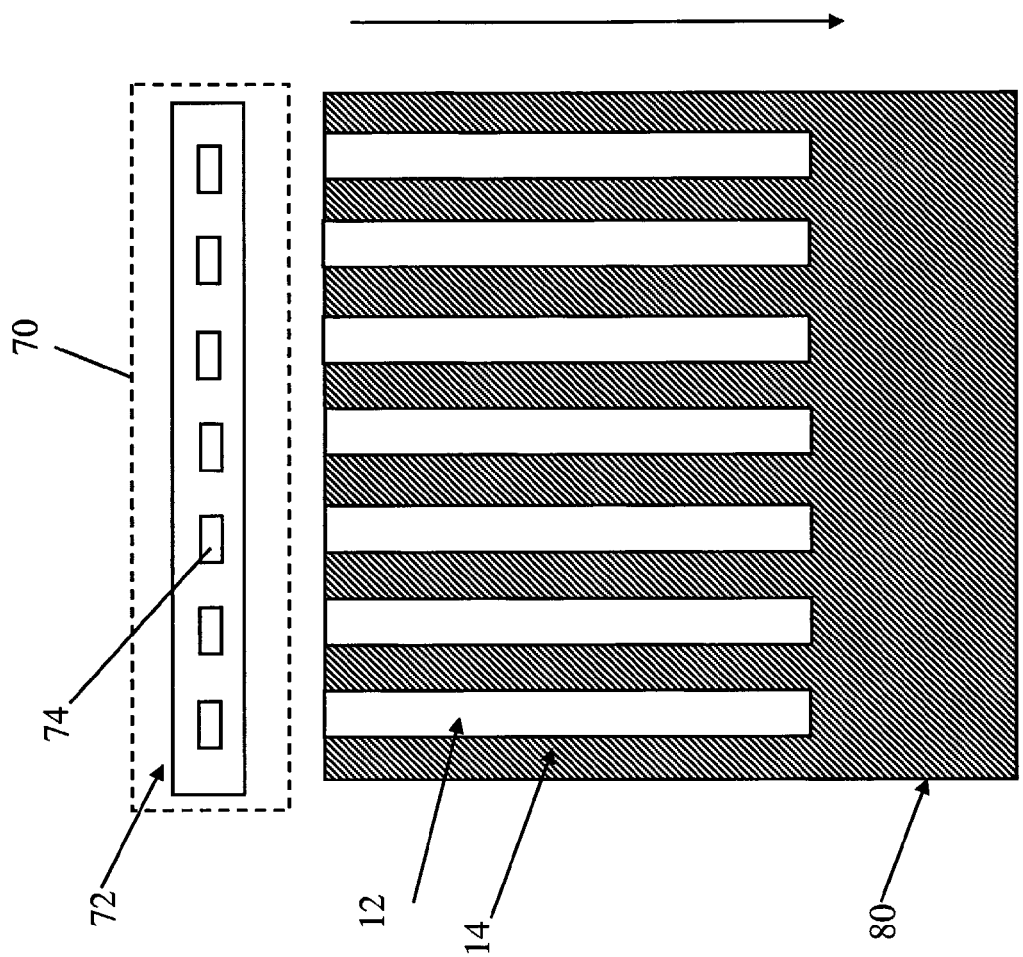
Figure 56:
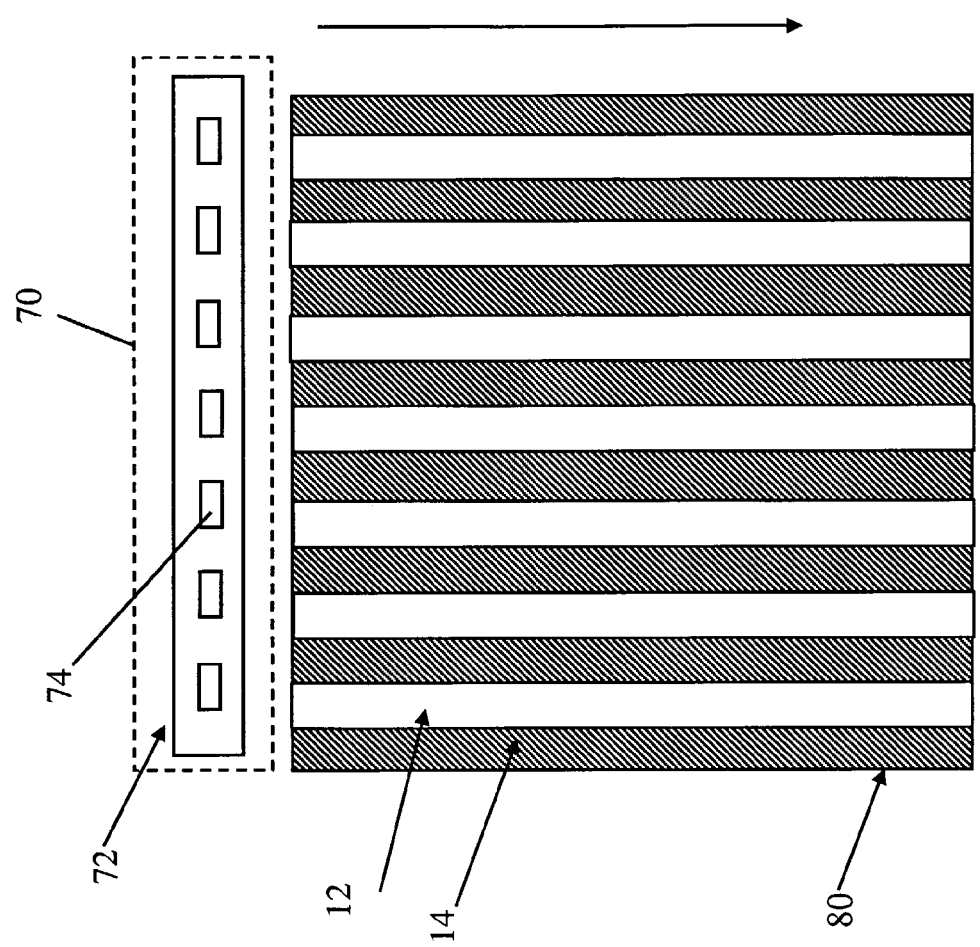
Figure 57:
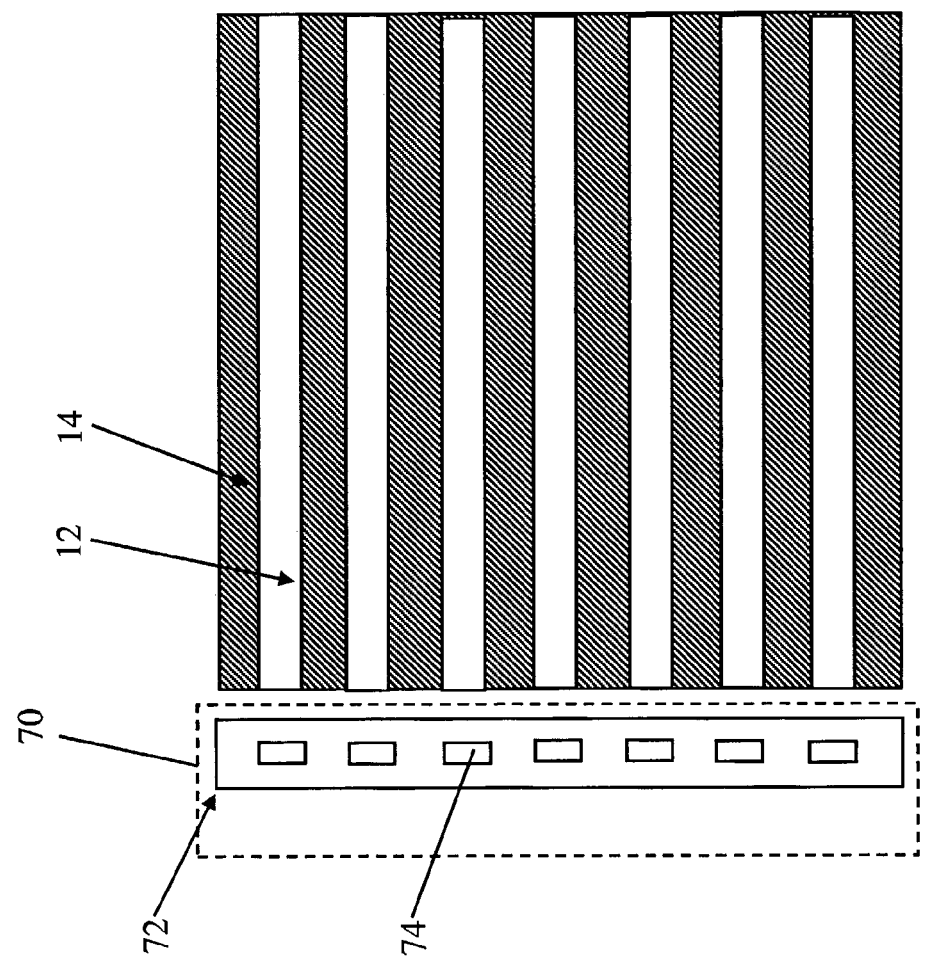
Figure 58:
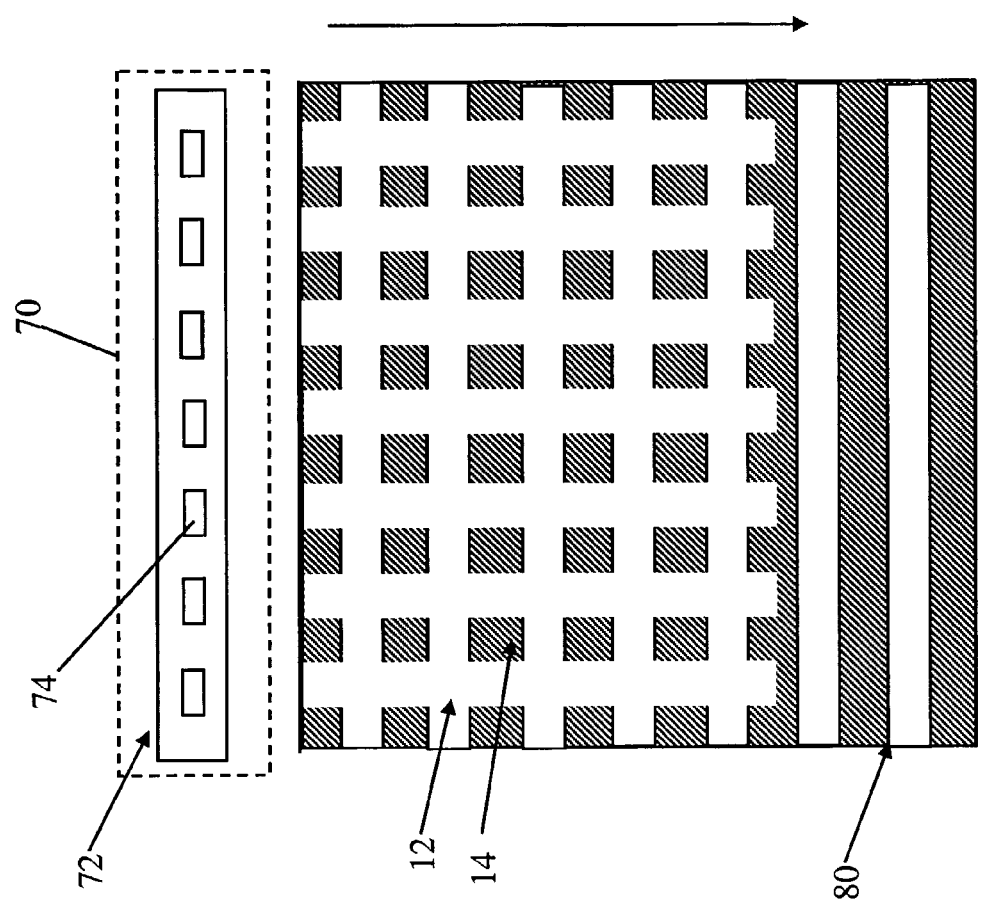
Figure 59:
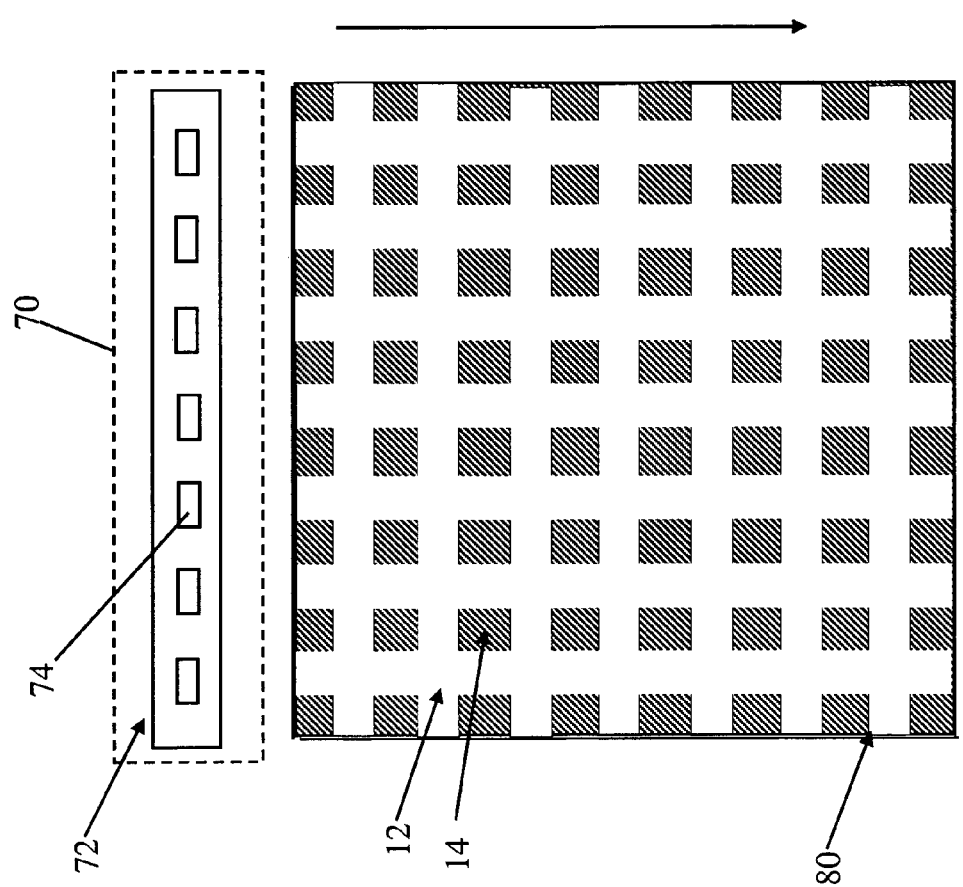

FIGS. 51-54 illustrate a scanning projector 70 moving across a surface 80, such as a semiconductor coated with photoresist. As the scanning projector 70 moves across the surface 80, it selectively exposes portions of the photoresist, thereby forming a pattern of parallel lines of exposed 12 and unexposed 14 photoresist. The scanning projector 70 may be used to form the B-patterns described above. For example, the horizontal B-pattern may be formed as illustrated in FIGS. 51-54. The vertical B-pattern may be formed by rotating either the scanning projector 70 or the surface 80 by ninety degrees and repeating the process as illustrated in FIGS. 55 and 56. The orthogonal B-pattern may be formed by operating the scanning projector 70 twice in paths orthogonal to each other as illustrated in FIGS. 57-59. As a result, many different patterns can be created with a single mask 72 used in accordance with the scanner 70 of the present invention. Many more patterns can be created with the use of additional masks 72 or with the use of alternative embodiments of the invention as will be described in more detail hereinbelow.

Figure 60:
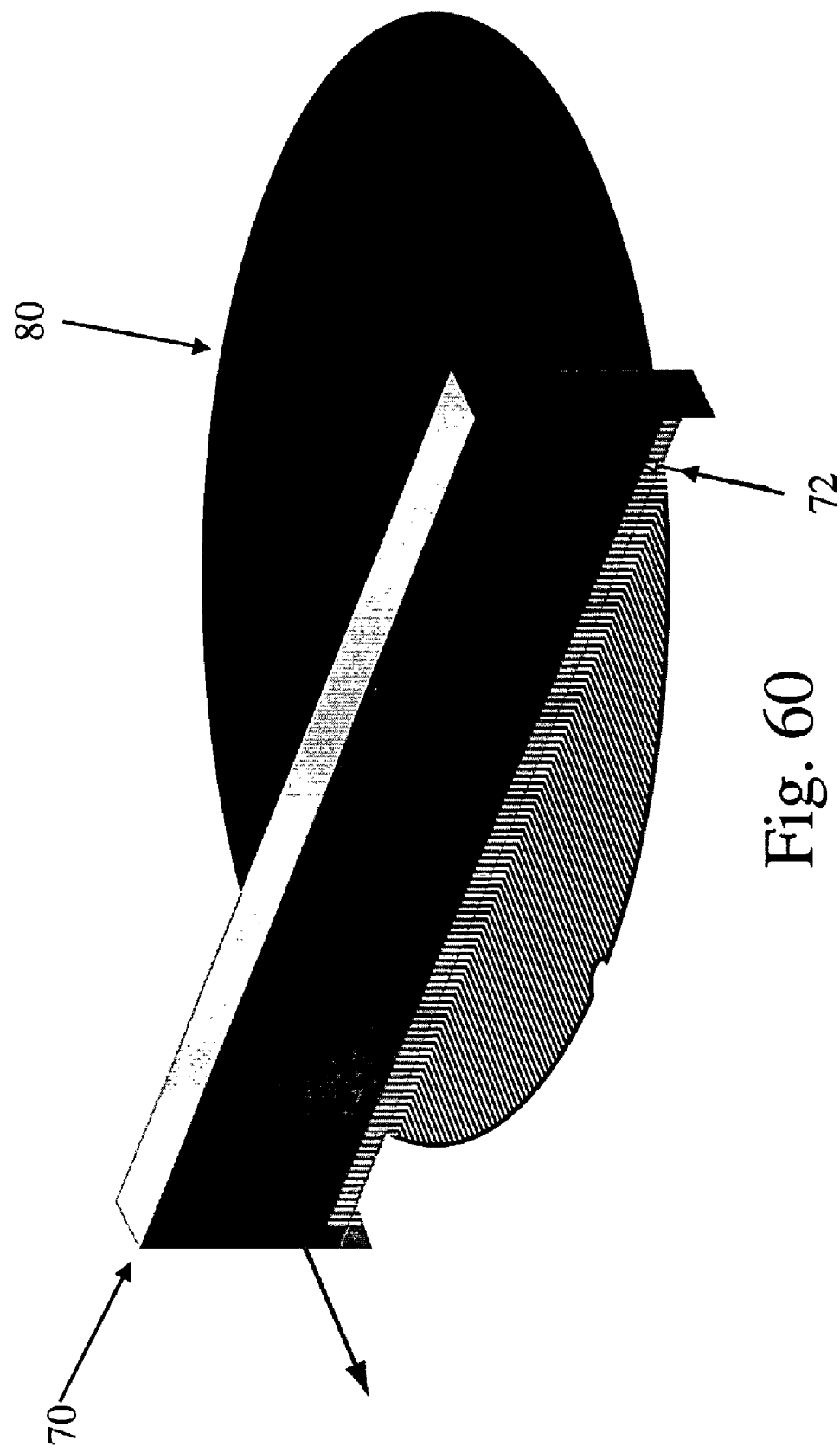
FIGS. 60 and 61 illustrate a scanning projector being used with a semiconductor wafer.
Figure 61:
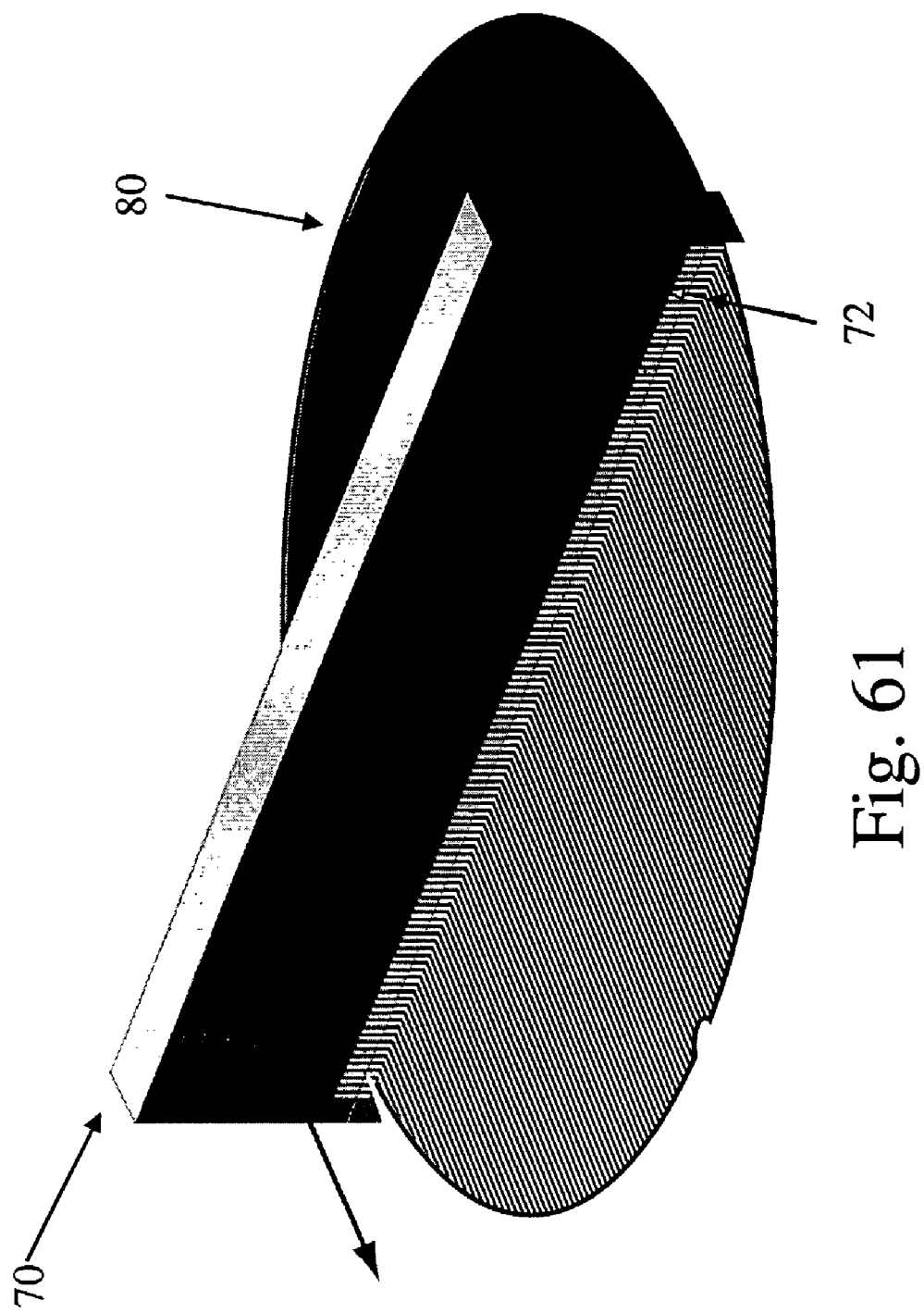

FIGS. 60 and 61 illustrate a scanning projector 70 being used with a semiconductor wafer 80. In the illustrated embodiment, the scanning projector 70 moves across the semiconductor wafer 80 and projects a pattern onto a photoresist layer on the surface of the wafer. Semiconductor wafers typically contain many identical chips or die. Accordingly, the scanning projector 70 may be used to produce the same exposure patterns on each chip or die, although different exposure patterns may also be produced. The scanning projector 70 may pass over a wafer one or more times, in the same or in different directions and orientations. The scanning projector 70 can be used to produce, for example, one or more different B-patterns. For example, a scanning projector 70 having a mask 72 including a set of discrete, spaced energy outlets 74 and producing an alternating exposure pattern will produce an exposure pattern of parallel lines as it moves across the wafer 80. This can be used, for example, to form the vertical B-pattern or the horizontal B-pattern, depending on the relative orientation of the wafer 80 and the scanning projector 70. Other B-patterns may also be formed. Furthermore, scanning projectors 70 may include multiple sets of energy outlets 74 which can produce multiple exposures of the photoresist with a single pass of the scanning projector 70.

Figure 62:
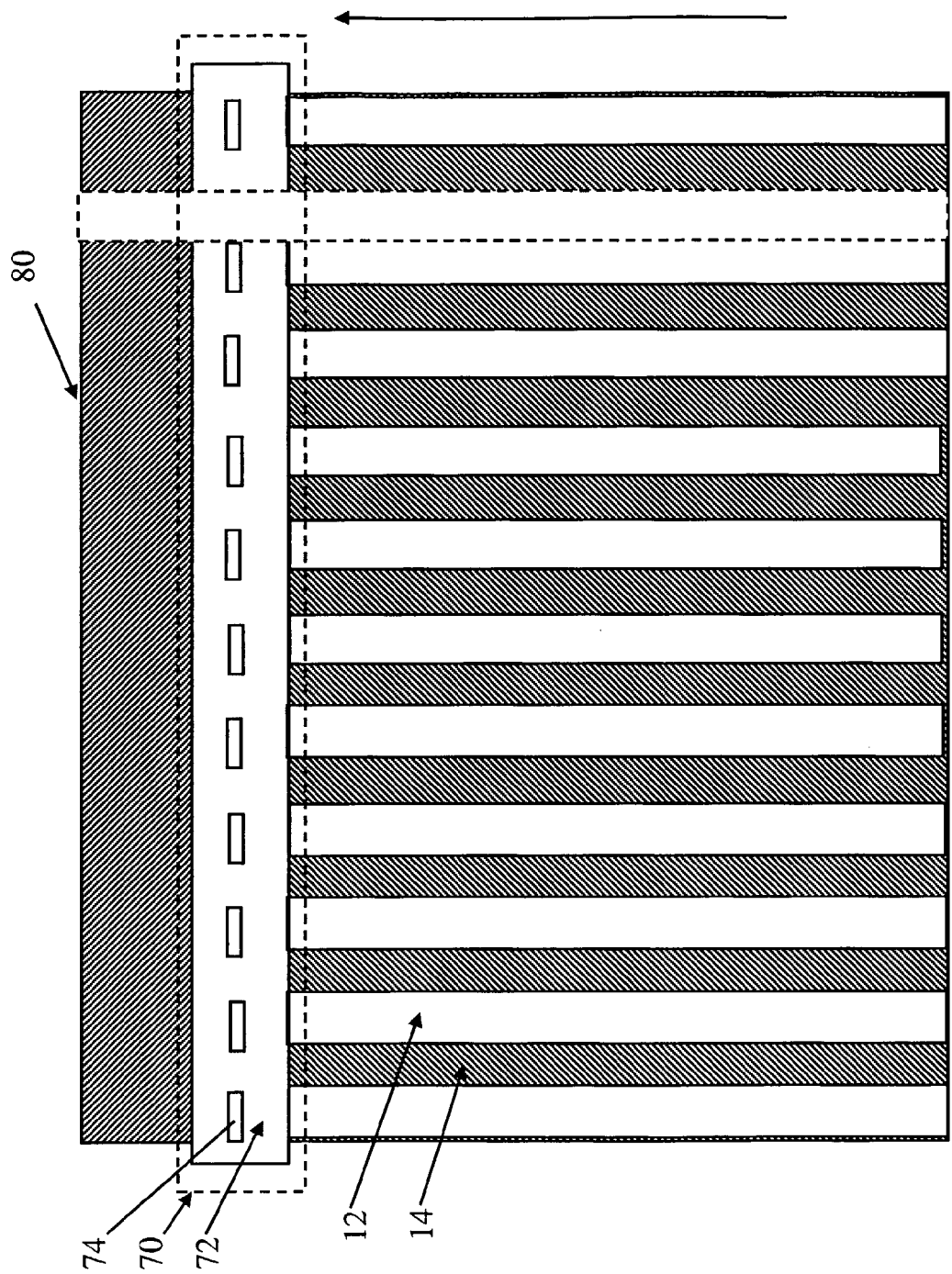
FIG. 62 illustrates the scanning projector and exposed and unexposed photoresist.

FIG. 62 further illustrates the scanning projector 70 described above and shows exposed and unexposed photoresist 12, 14 and the pattern formed by the scanning projector 70 as it moves relative to a semiconductor wafer 80. The scanning projector 70 includes a series of discrete, spaced energy outlets 74 which form an alternating exposure pattern. As the scanning projector 70 moves across a surface, this alternating pattern formed by the energy outlets 74 turns into a pattern of parallel lines which are alternatively exposed and unexposed 12, 14, as illustrated in FIG. 62. The scanning projector 70 can be used, for example, to form vertical 1, horizontal 1, and orthogonal 1 B-patterns. Other B-patterns, such as vertical 2, horizontal 2, and orthogonal 2 B-patterns, as well as modified B-patterns, may be formed by modifying the projection scanner 70 or through other means. For example, the use of larger energy outlets 74 may be used to create a broader pattern. Alternatively, an additional set of energy outlets 74 may be fitted to the scanning projector 70, such as in the form of a different scanning mask 72 or an additional scanning mask, to provide additional exposure as the scanning projector 70 passes over the surface 80. In yet another embodiment, the same surface 80 may be scanned multiple times with scanning projectors 70 producing different exposures with each scan to produce the desired pattern.

Figure 63:
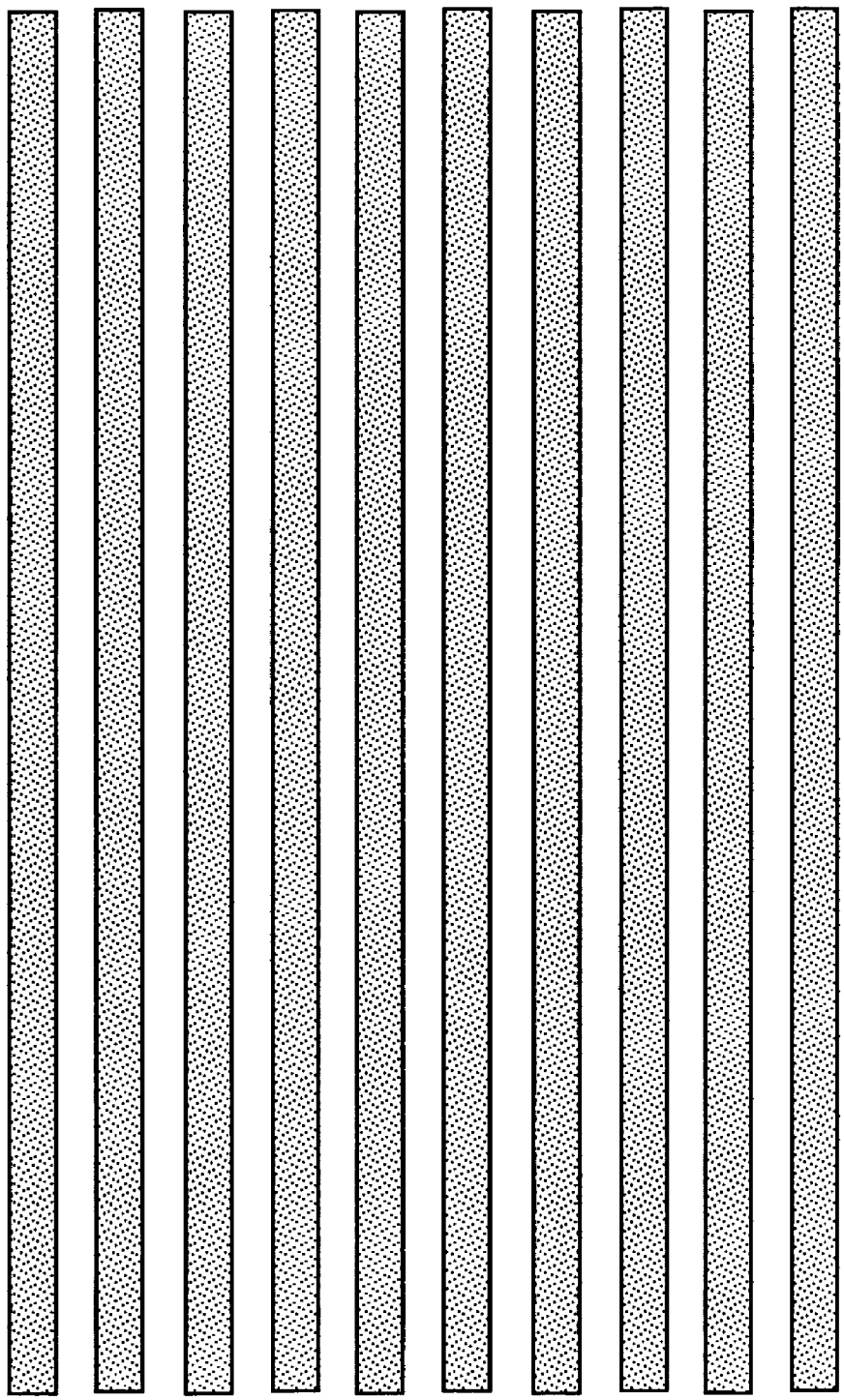
FIG. 63 illustrates the horizontal 1 B-pattern.
Figure 64:
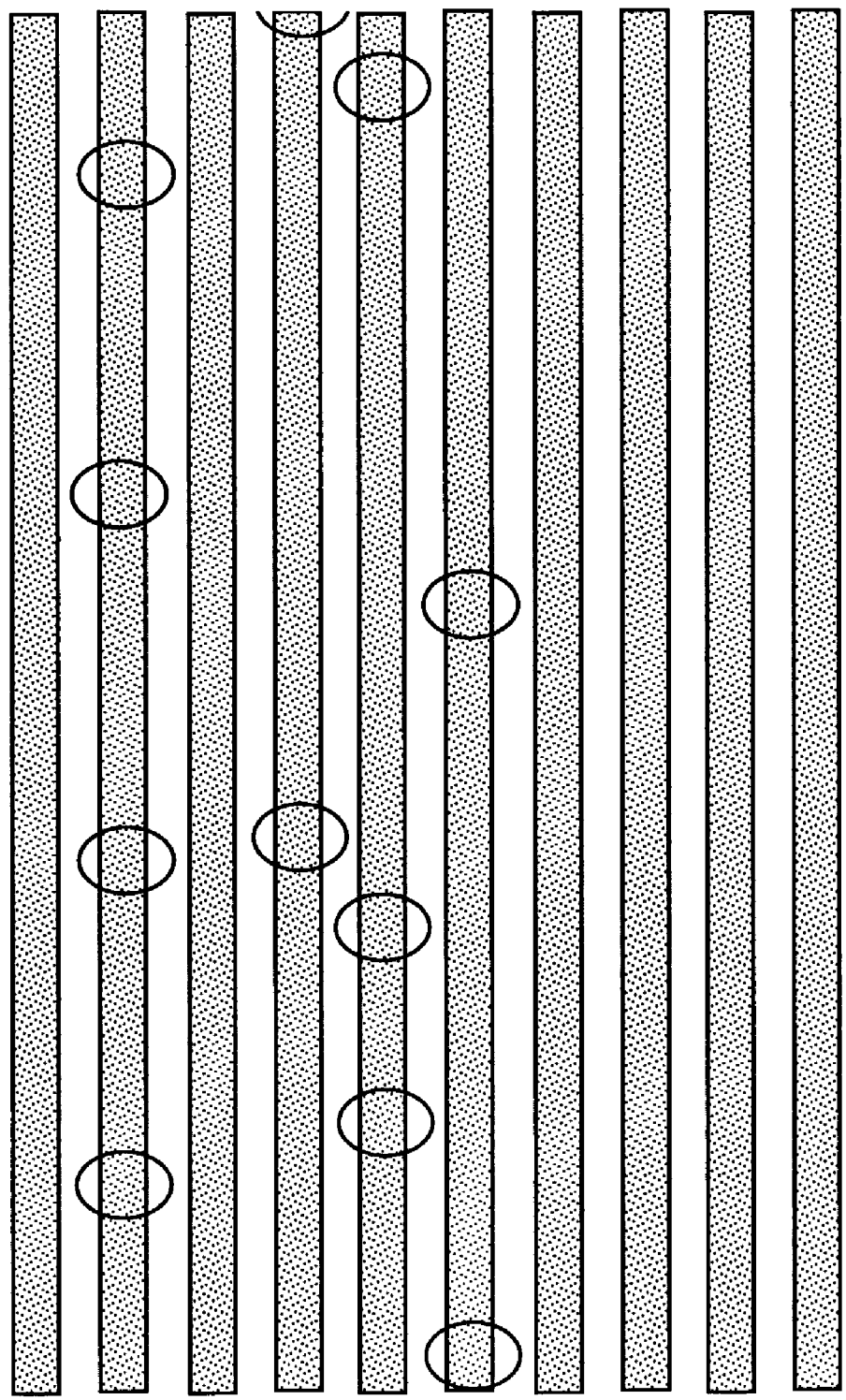
FIG. 64 illustrates the modification mask used with the metal 2 layer of example number 2.

FIG. 63 illustrates the horizontal 1 B-pattern, which may be formed with the scanning projector 70 just described. FIG. 64 illustrates the modification pattern used with the metal 2 layer of example number 2 described hereinabove. The modification pattern may be used to modify the horizontal 1 B-pattern of FIG. 63, and may be formed, for example, with a modification mask as described hereinabove. Alternatively, the modification patterns may be formed with the scanning projector, as will be described hereinbelow.

Scanning Projector

Embodiment Number 2

Figure 65:
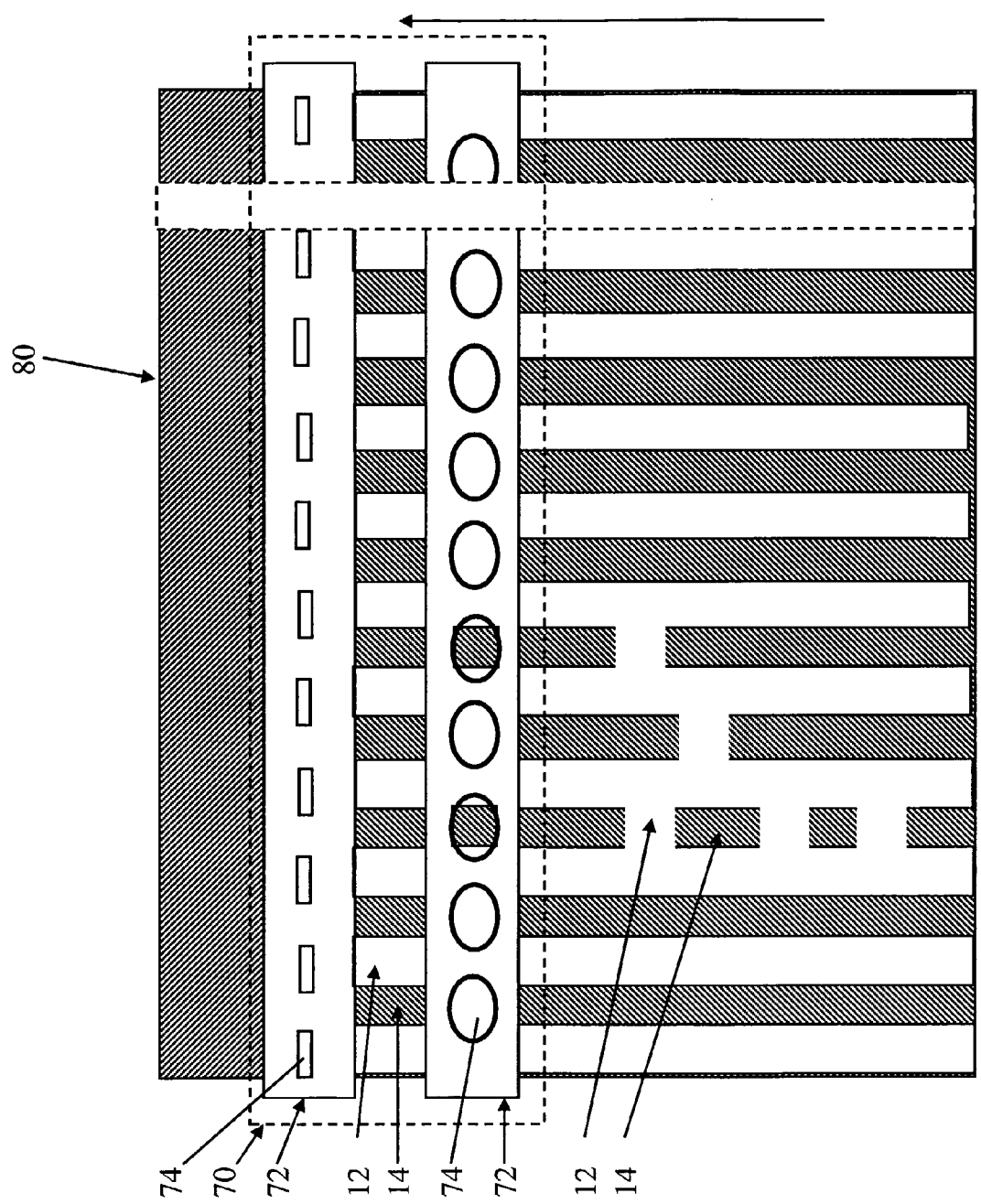
FIG. 65 illustrates another embodiment of the scanning projector.

FIG. 65 illustrates another embodiment of the scanning projector 70 which uses two masks 72 and two rows of outlets 74 which can be used to form, for example, the metal 2 pattern in example number 2. In this embodiment of the scanning projector 70, a first row of outlets 74 form a B-pattern, such as the vertical 1 B-pattern or the horizontal 1 B-pattern. This may be accomplished, for example, with fixed-pitch, high-precision, scanning comb or mask 72 forming pattern energy outlets 74. A second row of energy outlets 74 are oriented to pass over the unexposed 14 portions of the surface 80. The second row of energy outlets 74 are "switched" to selectively expose the photoresist and to modify the B-pattern formed by the first row of energy outlets 74. Like the "modification" patterns described hereinabove, the second row of energy outlets 74 may be of a relatively inexpensive variety.

As a result, this embodiment allows both the formation of the B-pattern and the modification of the B-pattern to be performed by the scanning projector 70 in the same pass across the wafer 80. As a result, multiple exposures are performed by the scanning projector 70 in the same pass across the wafer 80. A scanning projector 70 may also include more than two rows, thereby allowing more than two exposures in a single pass across the wafer 80.

Scanning Projector

Embodiment Number 3

Figure 66:
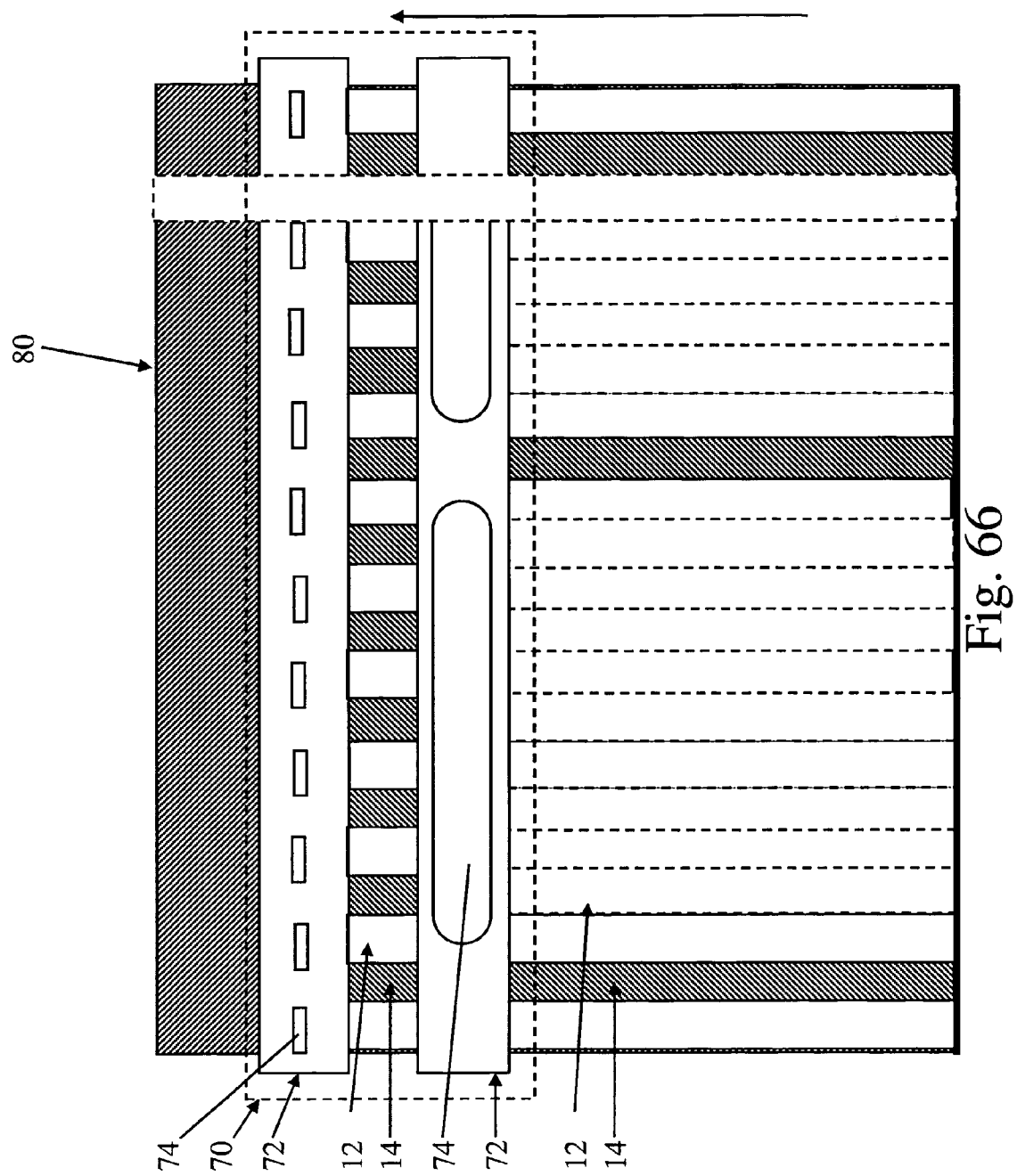
FIG. 66 illustrates another embodiment of the scanning projector.
Figure 67:
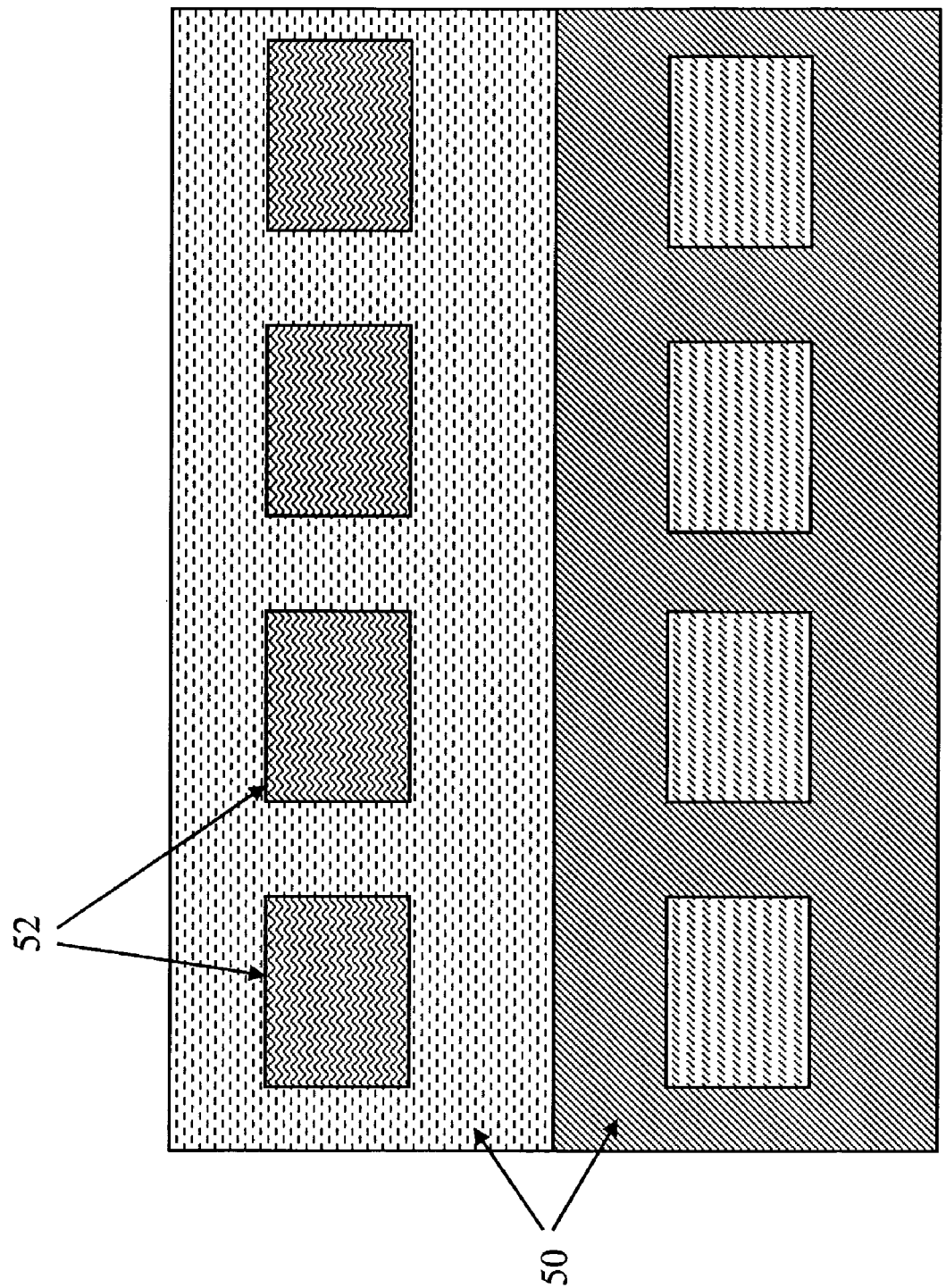
Figure 69:
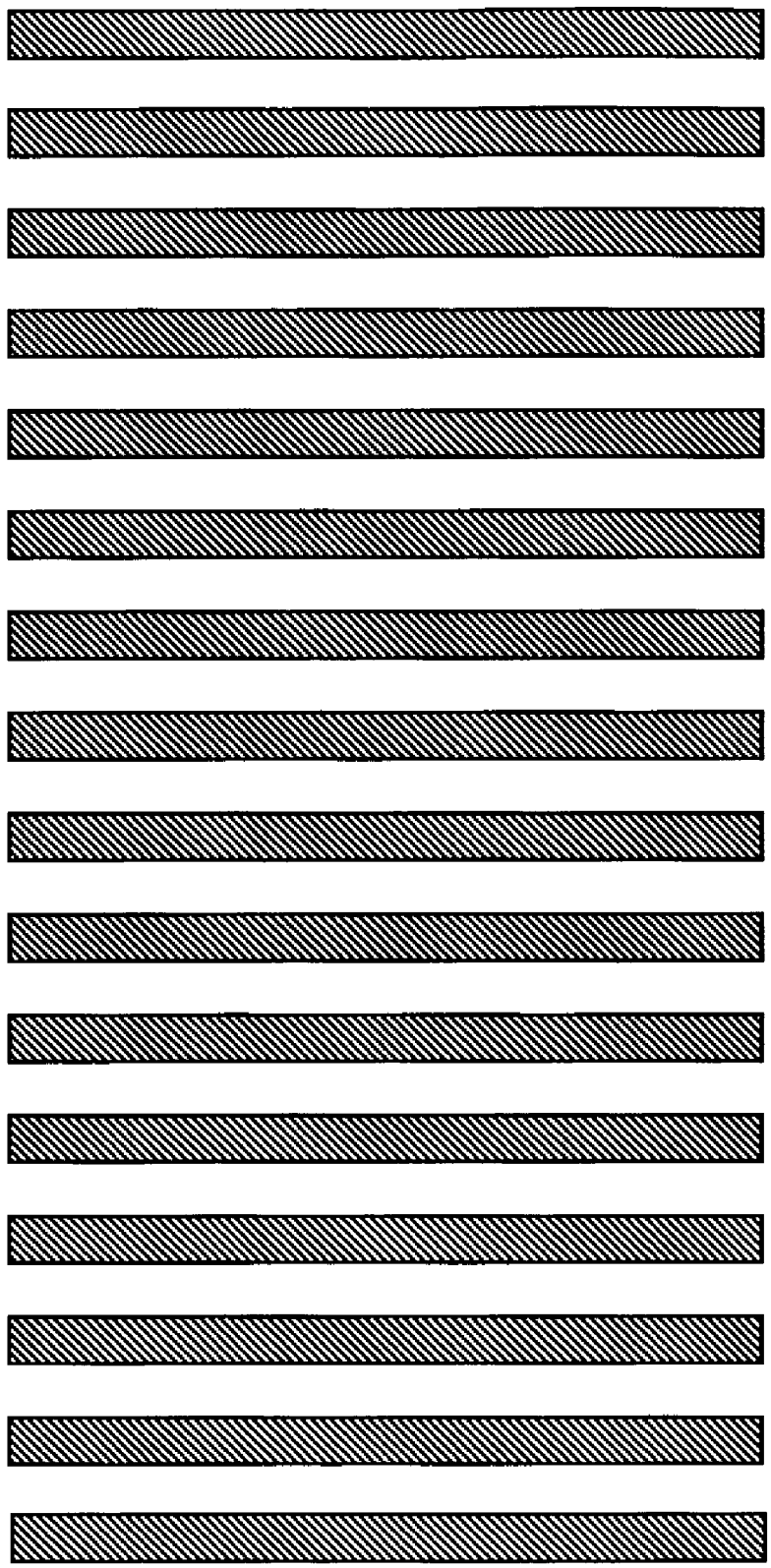
FIG. 69 illustrates a vertical 1 B-pattern.
Figure 70:
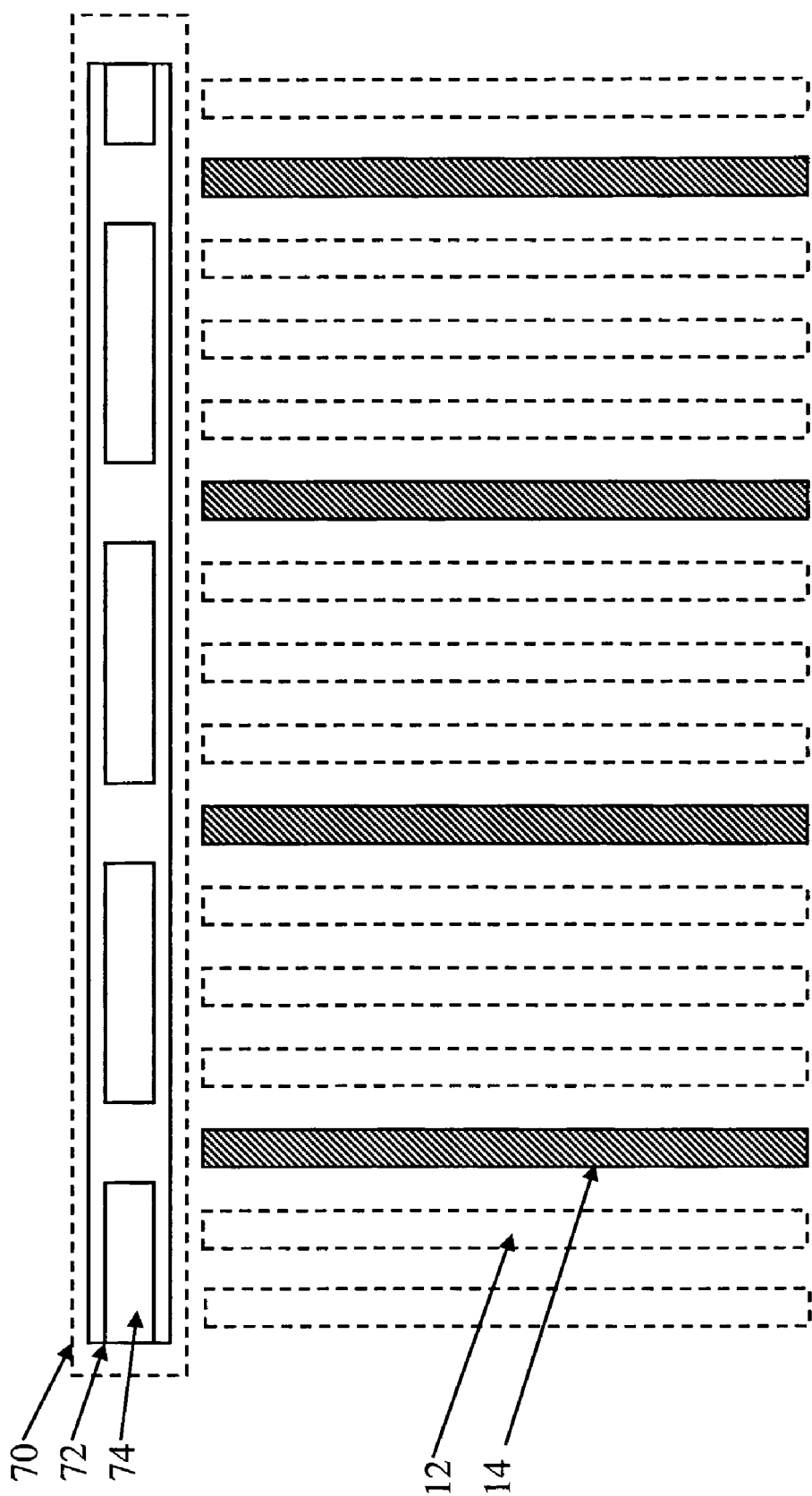
FIG. 70 illustrates a second scan of the of the scanning projector illustrated in FIG. 66 with a different second row of energy outlets.
Figure 71:
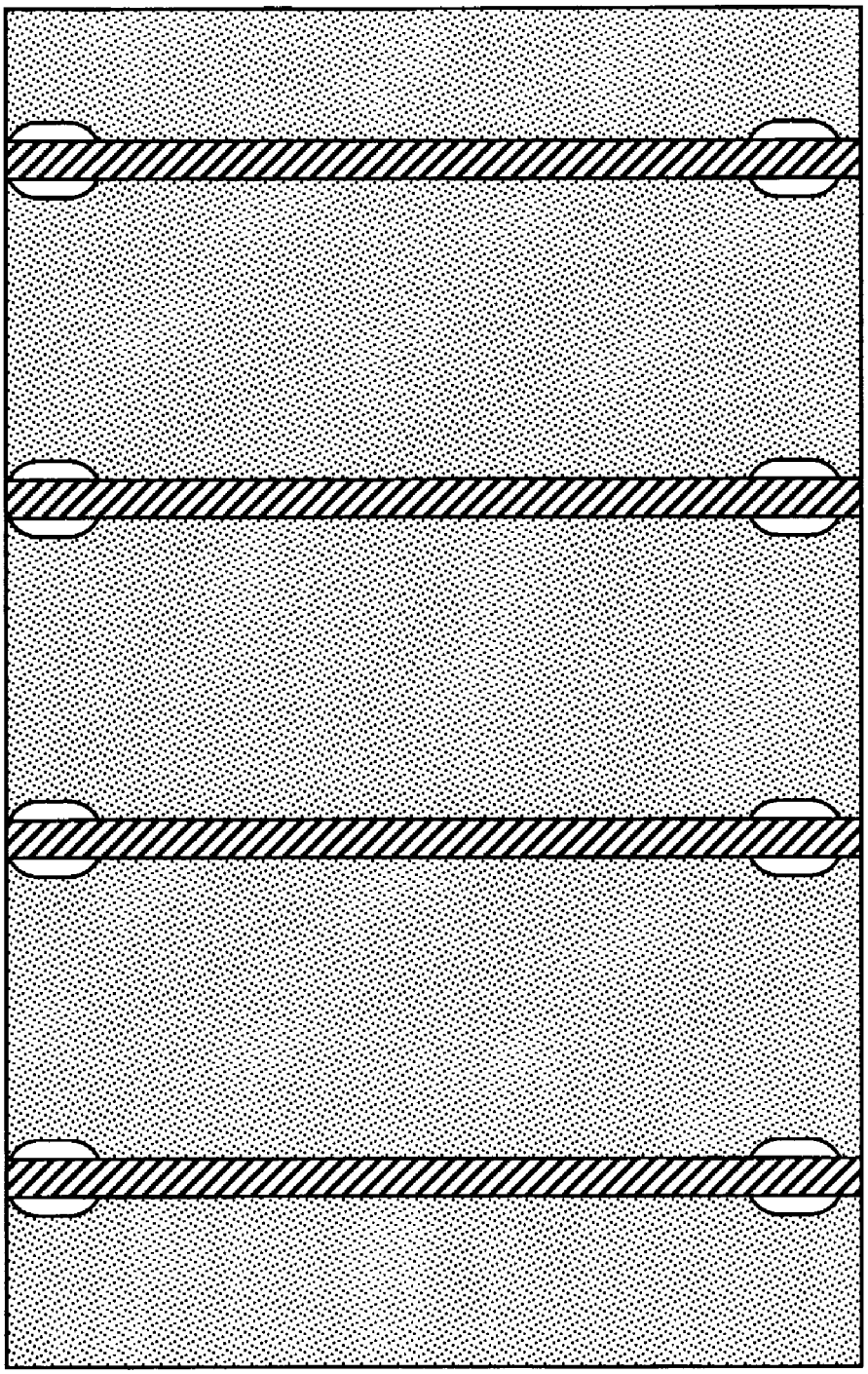
FIG. 71 illustrates a modification mask.

FIG. 66 illustrates another embodiment of the scanning projector 70. In that embodiment, a second row of energy outlets 74 uses a variable pitch design by which broader patterns may be formed, such as vertical 2, horizontal 2, and orthogonal 2 B-patterns. The variable pitch design of the second row of energy outlets 74 may be, for example, replaceable scanning masks 72 for the second row of energy outlets, electronically switchable energy outlets 74, or other designs. FIGS. 67 and 68 illustrate patterns from example number 2 which may be formed with the embodiment of the scanning projector 70 illustrated in FIG. 66. FIG. 67 illustrates the wells and active areas and FIG. 68 illustrates the polysilicon pattern. FIG. 69 illustrates the "vertical 1" B-pattern and FIG. 70 illustrates the second scan in polysilicon which may, for example, use the scanning projector 70 illustrated in FIG. 66 with the second row of energy outlets 74 utilizing the scanning mask 72 shown at the top of the image. FIG. 71 illustrates the "modification" mask 72 for the polysilicon pattern and FIG. 72 illustrates the desired polysilicon pattern that may be formed. Thus, the scanning projector 70 illustrated in FIG. 66 may be used to produce the "vertical 2", "horizontal 2", and "orthogonal 2" B-patterns.

Figure 73:
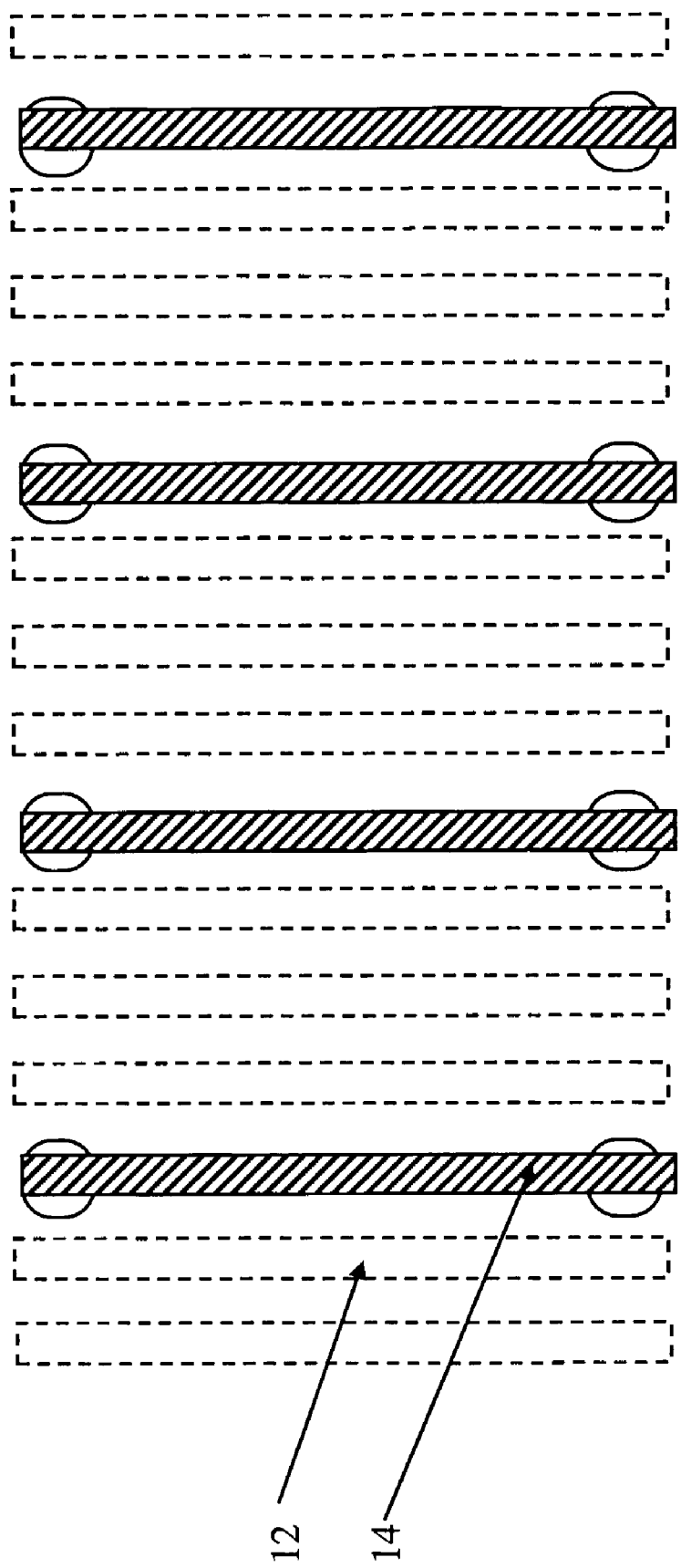
FIG. 73 illustrates a "dashed" single pass scan.

FIG. 73 illustrates a "dashed" single pass scan that may be produced with the scanner 70 to form the polysilicon from example number 2 hereinabove. Alternatively, the scanner 70 may be used to form the B-pattern and a conventional mask may be used to perform the modification of the B-pattern.

Scanning Projector

Embodiment Number 4

Figure 74:
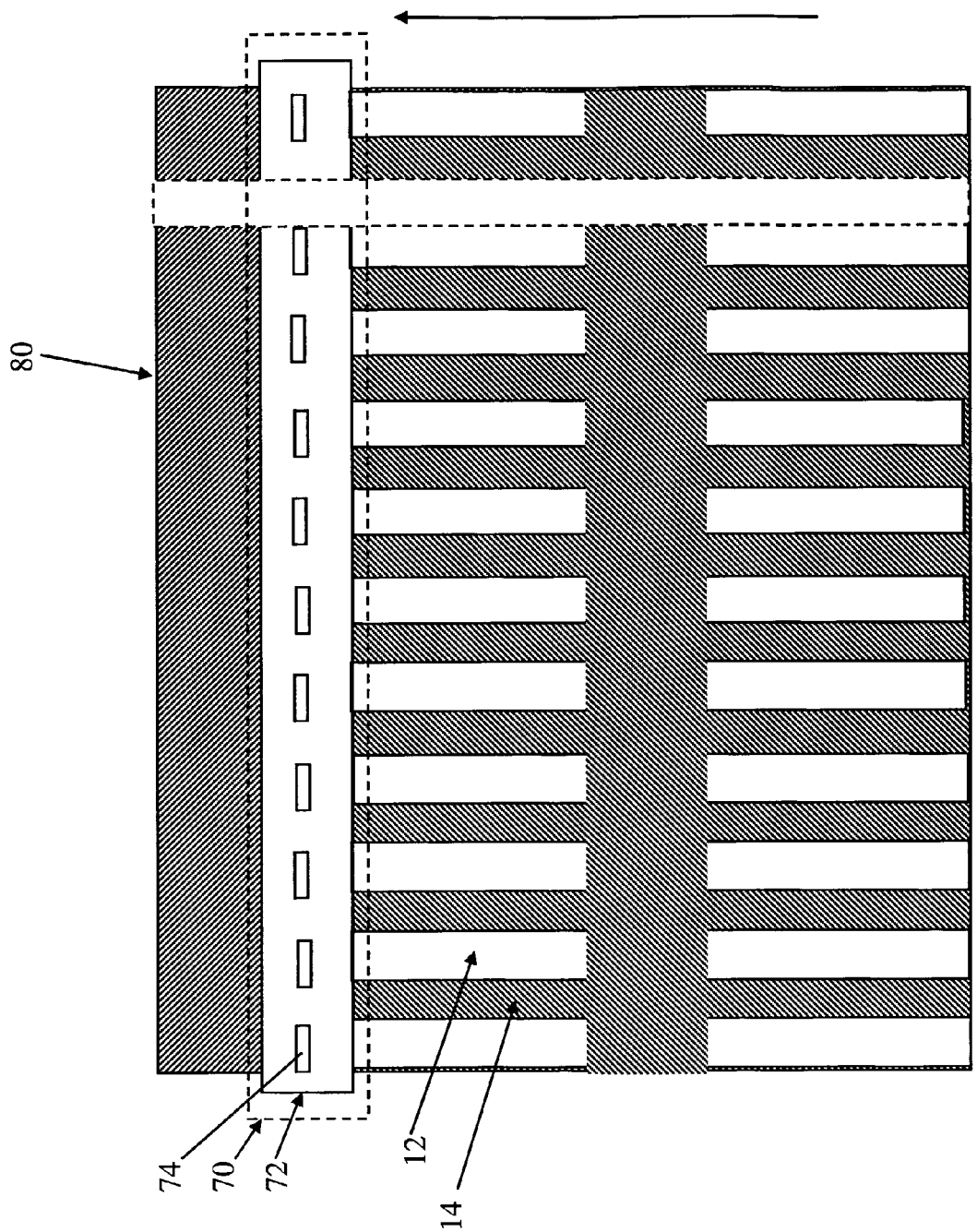
FIG. 74 illustrates another embodiment of the scanning projector.
Figure 76:
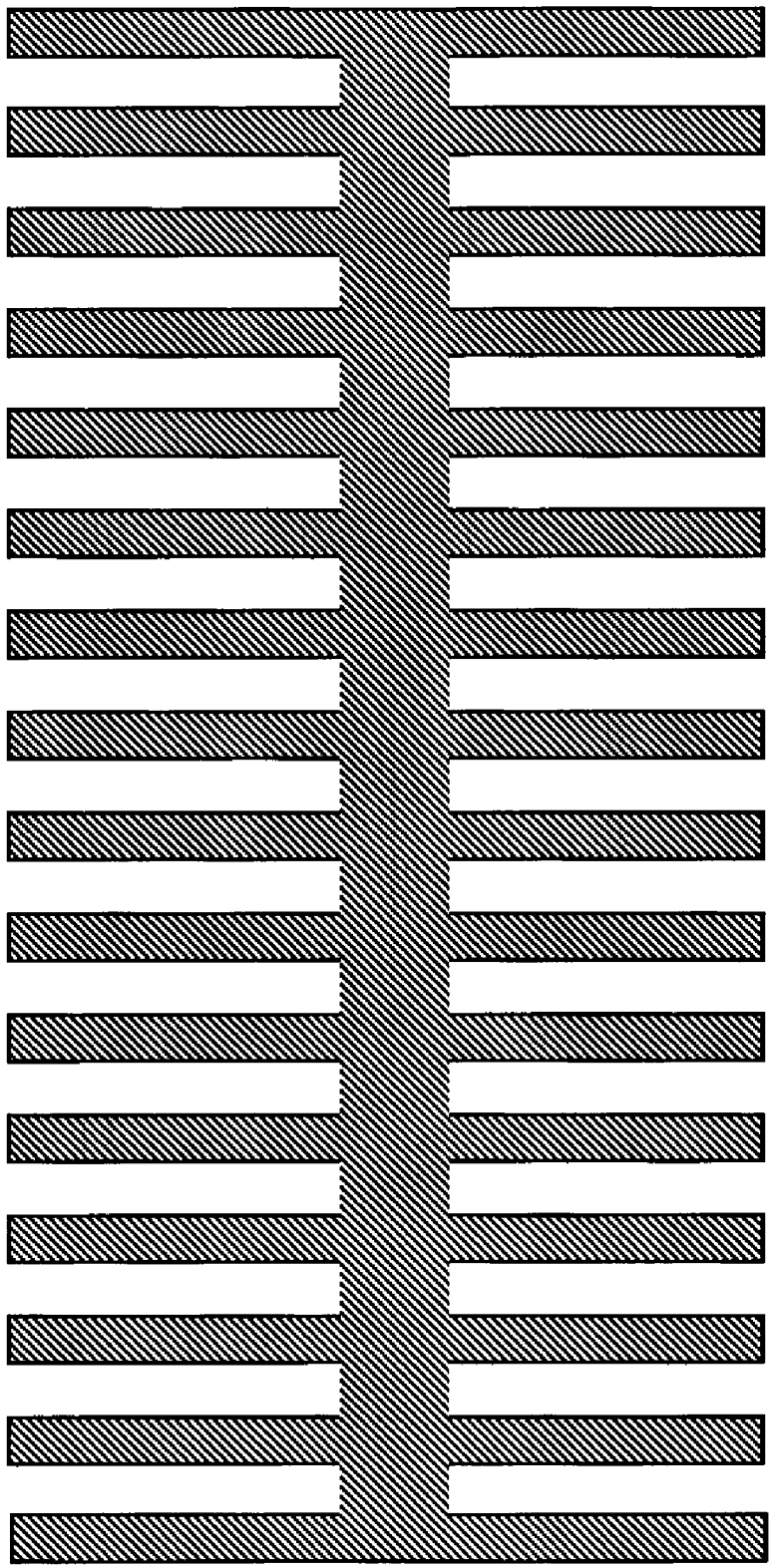
FIG. 76 illustrates one example of a pattern that may be formed after a first pass of the scanning projector illustrated in FIG. 74.
Figure 77:
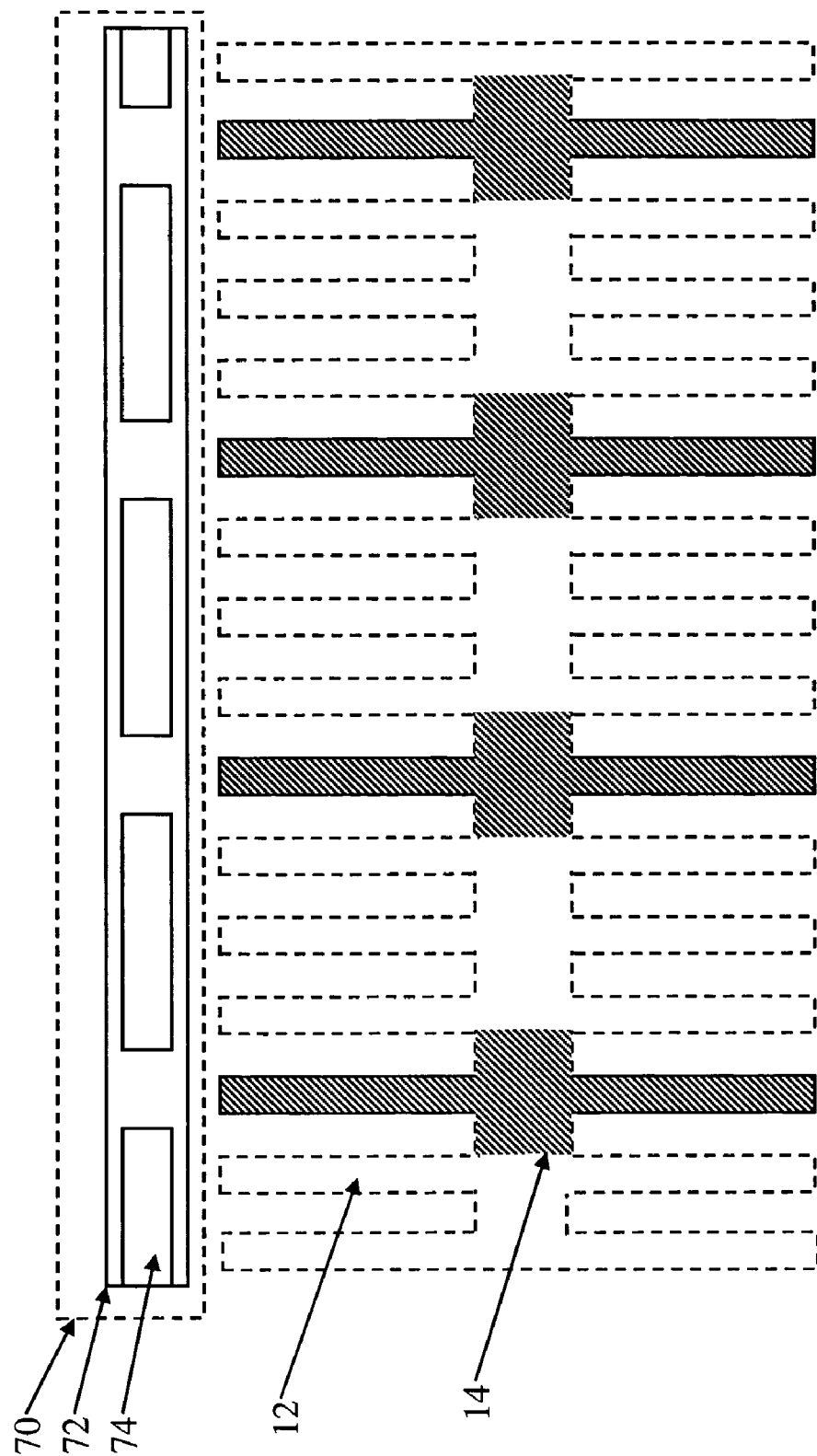
FIG. 77 illustrates one example of a pattern that may be formed after a second pass of the scanning projector illustrated in FIG. 74.

FIG. 74 illustrates another embodiment of the scanning projector 70 having a single row of energy outlets 74 which can be switched on and off. FIG. 75 illustrates one example of a polysilicon pattern that may be formed with the scanning projector 70. FIG. 76 illustrates a pattern that may be formed after a first pass of the scanning projector 70. FIG. 77 illustrates a pattern that may be formed after a second pass using the scanning mask 72 shown near the top of the image. The scanning mask 72 may be used in a second pass of a scanning projector 70, or the scanning mask may be inserted in conjunction with a second row of energy outlets 74 which are not currently shown in the embodiment of FIG. 74.

Scanning Projector

Additional Embodiments

Figure 78:
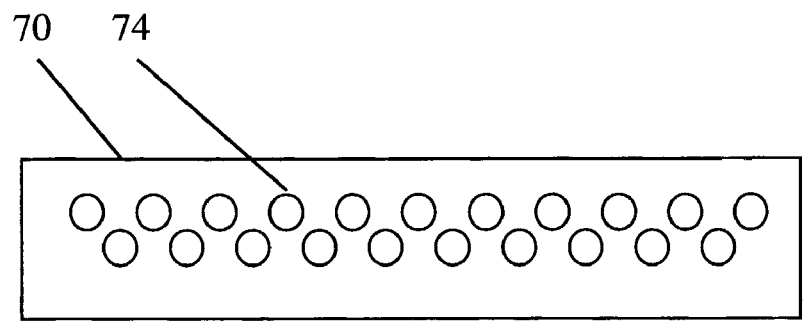
FIGS. 78-82 illustrate embodiments of scanning projectors.

FIG. 78 illustrates another embodiment of a scanning projector 70 for use with a scanning projector 70 according to the present invention. Although FIG. 78 will be described in terms of a scanning projector 70, it may also represent a mask 72 used by a scanning projector 70. The scanning projector illustrated in FIG. 78 has outlets 74 arranged in two rows. The outlets 74 in the lower row (i.e., the outlets towards the bottom of the figure) are offset from the outlets 74 in the upper row (i.e., the outlets towards the top of the figure). As a result, each outlet 74 will take a different path as the scanning projector 70 moves relative to a wafer 80 and, therefore, each outlet 74 can apply energy over different parts of a wafer 80. In this embodiment, the outlets 74 in each row are spaced apart by approximately the diameter of an outlet 74, and the two rows of outlets 74 are offset from each other by approximately the diameter of an outlet 74. As a result, the second row of outlets 74 fill the gaps in the first row of outlets 74 as the scanning projector 70 moves across a wafer 80.

In the embodiment illustrated in FIG. 78, as well as in other embodiments described herein, the outlets 74 are relatively close to each other. As a result, fabrication performed using such scanning projectors 70 may suffer from interference between adjacent energy outlets 74 which may degrade the quality of an image formed in the photoresist or other materials. In some applications, the interference and degradation of image quality may be acceptable, while in other applications it may be desirable to reduce or eliminate the interference. Such reduction or elimination of interference may be achieved, for example, by adding additional features such as serifs, mousebites, hammerheads, and scattering bars. Such interference may also be reduced or eliminated by adding additional distance between adjacent outlets 74, or by not utilizing certain outlets 74, so as to increase the distance between active outlets 74.

Figure 79:
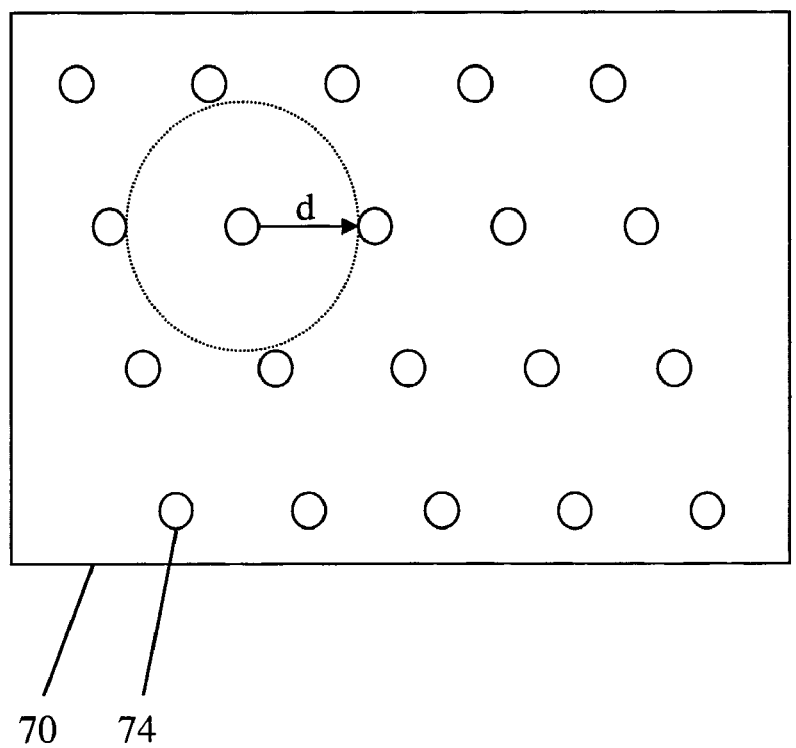

FIG. 79 illustrates an embodiment of a scanning projector 70 which can be used, for example, when it is desired to reduce interference. In that embodiment, the outlets 74 are spaced apart from each other by a distance "d" so as to reduce interference. The precise value of "d" will depend on the particular application and the extent to which interference is to be reduced. In FIG. 79, the value of "d" is approximately four times the diameter of the outlets 74. In another embodiment described herein, the outlets 74 are separated from each other by approximately eight times the diameter of the outlet 74. Different spacings may also be used.

The size, spacing, and other characteristics of the mask 72 and scanning projector 70 may differ from the size, spacing, and other characteristics of the image formed on the surface 80. For example, a lens or other devices may be used to focus, reduce, enlarge, or otherwise change the pattern of energy or material as it travels from the mask 72 or scanning projector 70 to the surface 80. As a result, characteristics of an image formed on a surface 80 will not necessarily be the same as corresponding features of the mask 72 or scanning projector 70 used to form the image. Therefore, when the present invention describes characteristics such as the diameter and spacing between outlets of the mask 72 or scanning projector 70, those characteristics may be different from the characteristics of the image formed by that mask 72 or scanning projector 70. Similarly, when characteristics of an image formed on a surface 80 are discussed, those characteristics will not necessarily be the same as the corresponding characteristics of the mask 72 or scanning projector 70 used to form the image.

Because of the separation of the outlets 74, more than two rows of outlets 74 may be used to provide desired coverage. In the embodiment illustrated in FIG. 79, four rows of outlets 74 are provided, with each row being offset from the adjacent rows. As a result, each row of outlets 74 provides for different coverage.

The rows of outlets 74 may be offset from each other by the diameter of the outlets 74, or by more or less distance than the diameter of the outlets 74. For example, in FIG. 79 the outlets 74 in each row are separated by four times the diameter of the outlet 74, and each row of outlets 74 is offset by the diameter of the outlets 74, so that four rows of outlets 74 will allow for full coverage. In another embodiment, for example, the outlets 74 in each row are separated by eight times the diameter of the outlet 74, and each row of outlets 74 is offset by the diameter of the outlets 74, so that eight rows of outlets 74 will allow for full coverage. In other embodiments, additional rows may be provided, for example, to allow for redundant coverage, or to allow for desired coverage when the scanning projector 70 is rotated, as described in more detail hereinbelow. In other embodiments, full coverage may not be desired. In other embodiments, the rows of outlets 74 are offset by less than the diameter of the outlets 74, thereby allowing for the creation of features smaller than the diameter of an outlet and otherwise providing for more precision in the lithographic process. In general, the smaller the offset between rows, the more rows are required.

Figure 80:
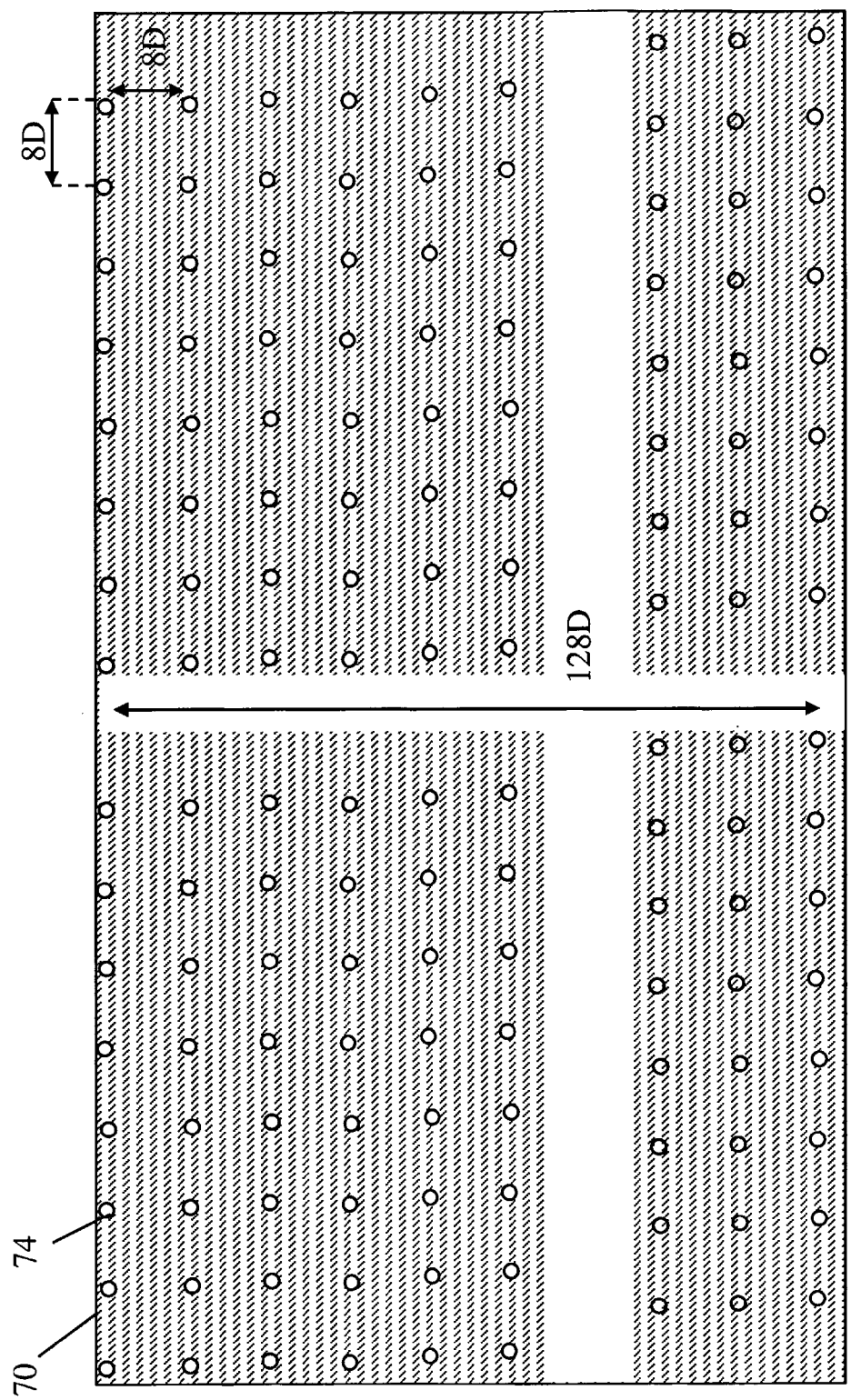

FIG. 80 illustrates an embodiment of a scanning projector 70 having 16 rows. The outlets 74 within each row are offset from each other by eight times the diameter of the outlets, and each row is offset from adjacent rows by one half the diameter of the outlets. In this embodiment, there are sixteen rows, spanning a distance of 128 times the diameter of the outlets 74.

Figure 81:
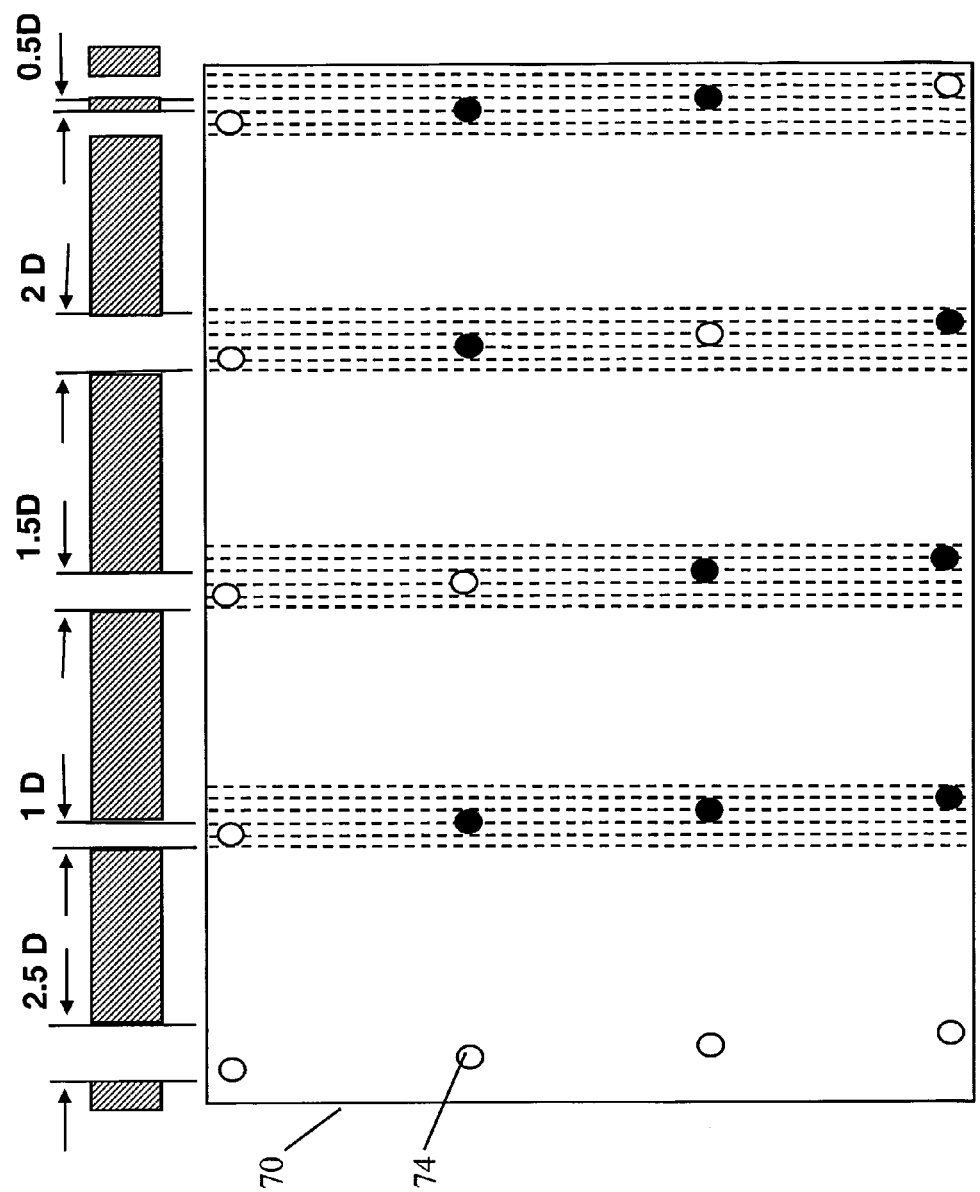

FIG. 81 illustrates a portion of the scanning projector 70 illustrated in FIG. 80. FIG. 81 illustrates five columns and four rows of outlets 74, although additional columns and rows are present in the scanning projector 70 illustrated in FIG. 80.

If all four outlets 74 illustrated in the leftmost column are "on", then an exposure of 2.5 times the outlet diameter is provided as the scanning projector 70 moves across a surface 80. If only one of the outlets is "on", as illustrated in the second column from the left, then an exposure of one outlet 74 diameter is provided. If two adjacent outlets in a column are "on", as illustrated in the middle column, then an exposure of 1.5 times the diameter of the outlet 74 is provided. If two outlets 74 in the same column and offset from each other by one outlet diameter are "on", as illustrated in the second column from the right, an exposure of two times the outlet diameter is achieved. Finally, the rightmost column illustrates two outlets 74 in the "on" state and offset by 1.5 times the diameter of the outlet. This produces two lines of exposure, each the diameter of the outlets 74, with an unexposed portion between two lines of exposure. The unexposed portion has a width one-half the diameter of the outlets. As a result, the scanning projector 70 illustrated in FIG. 81 allows for lithographic features as small as one-half the diameter of the outlets 74, and also allows for larger features in increments of one-half the diameter of the outlets. Smaller and larger lithographic features may be obtained by rotating the scanning projector 70, as described in more detail hereinbelow. Different spacings and orientations of features may also be achieved with different spacings and orientations of the outlets 74.

The shape of the outlets 74 can affect the quality of the exposure. For example, when circular outlets 74 are used, such as those illustrated in FIG. 81, the exposure on the underlying surface 80 will not be uniform. In particular, exposure from the middle of the outlet 74 will be greater than exposure at the edges of the outlet. As a result, it may be advantageous in some applications to provide for multiple exposures of the same pattern. For example, the scanning projector 70 may include two or more rows of outlets 74 that are not offset from each other so as to provide for multiple exposure of the same parts of a pattern. In other embodiments, such as those in which the outlets 74 are rectangular, more uniform exposure will be provided. However, rectangular outlets 74 will create different exposure shapes if the scanning projector 70 is rotated relative to the surface 80 being scanned. In contrast, circular outlets 74 will maintain the same exposure shape regardless of rotation relative to the surface 80. Rotation of the scanning projector 70 is discussed in more detail hereinbelow.

Similarly, the scanning velocity, or the relative velocity between the scanning projector 70 and the surface 80 to be scanned, can also affect the quality of the exposure. For example, a relatively fast scan will generally provide a less thorough exposure than a slower scan. This is because the energy emitted by an energy source is distributed over an area which is determined, at least in part, by the relative velocity between the scanning projector 70 and the surface 80. The greater the velocity, the lower the energy density per unit area at the surface 80. As a result, the depth to which a layer of photoresist (or some other material) is exposed will be less for a fast scan than for a slower scan. Accordingly, the shape of the outlets 74, the scanning velocity, and other factors can affect the quality of the exposure being created by the scanning projector 70.

Figure 82:
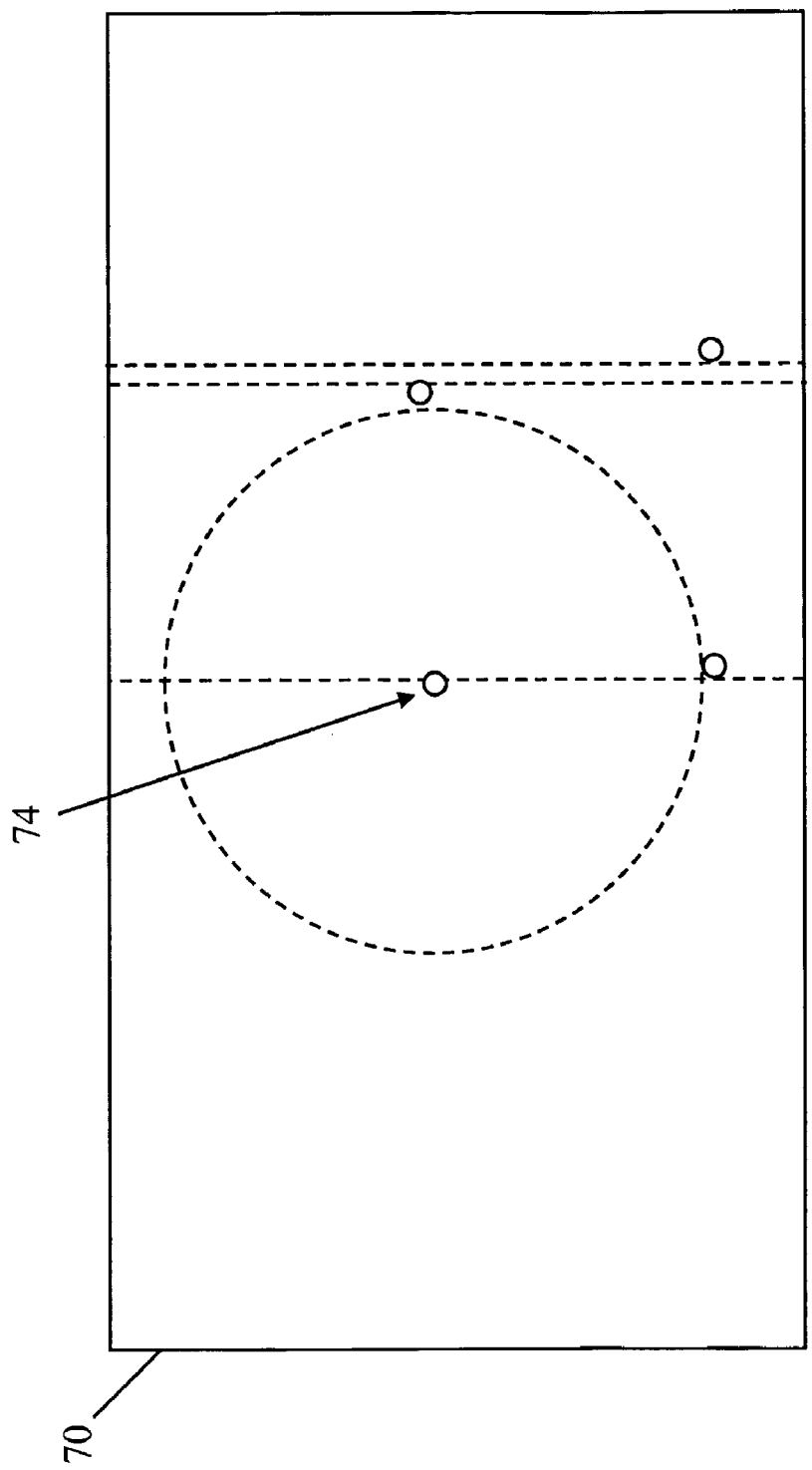

FIG. 82 illustrates another embodiment of outlets 74 on a scanning projector 70. FIG. 82 also illustrates the spacing between the outlets 74 and the offset between rows. In particular, the two left-most outlets 74 are offset from each other by the diameter of the outlets 74, while the two right-most outlets 74 are offset from each other by more than the diameter of the outlets 74, thereby leaving a gap between those outlets. FIG. 82 only illustrates four outlets 74, arranged in two rows. However, additional outlets 74, additional rows and columns, and different spacings are also possible.

Figure 83:
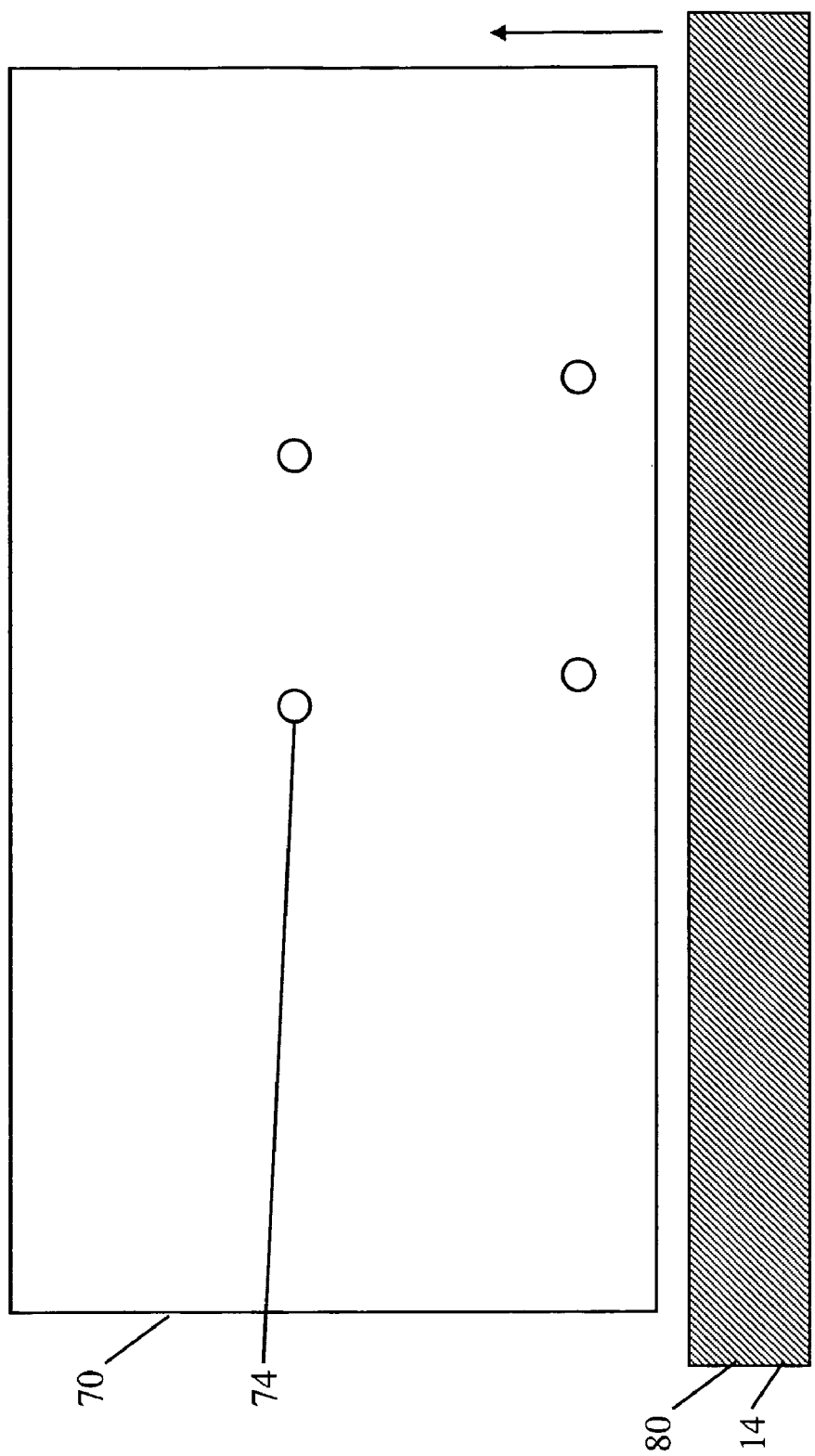
FIGS. 83-89 illustrate the use of a scanning projector to form a pattern on a surface.

FIGS. 83-89 illustrate an example of a scanning projector 70 moving relative to a surface and exposing a pattern on that surface 80. In FIG. 83, all four outlets 74 are "on", and the surface 80 is moving from the bottom of the figure to the top of the figure relative to the scanning projector 70.

Figure 84:
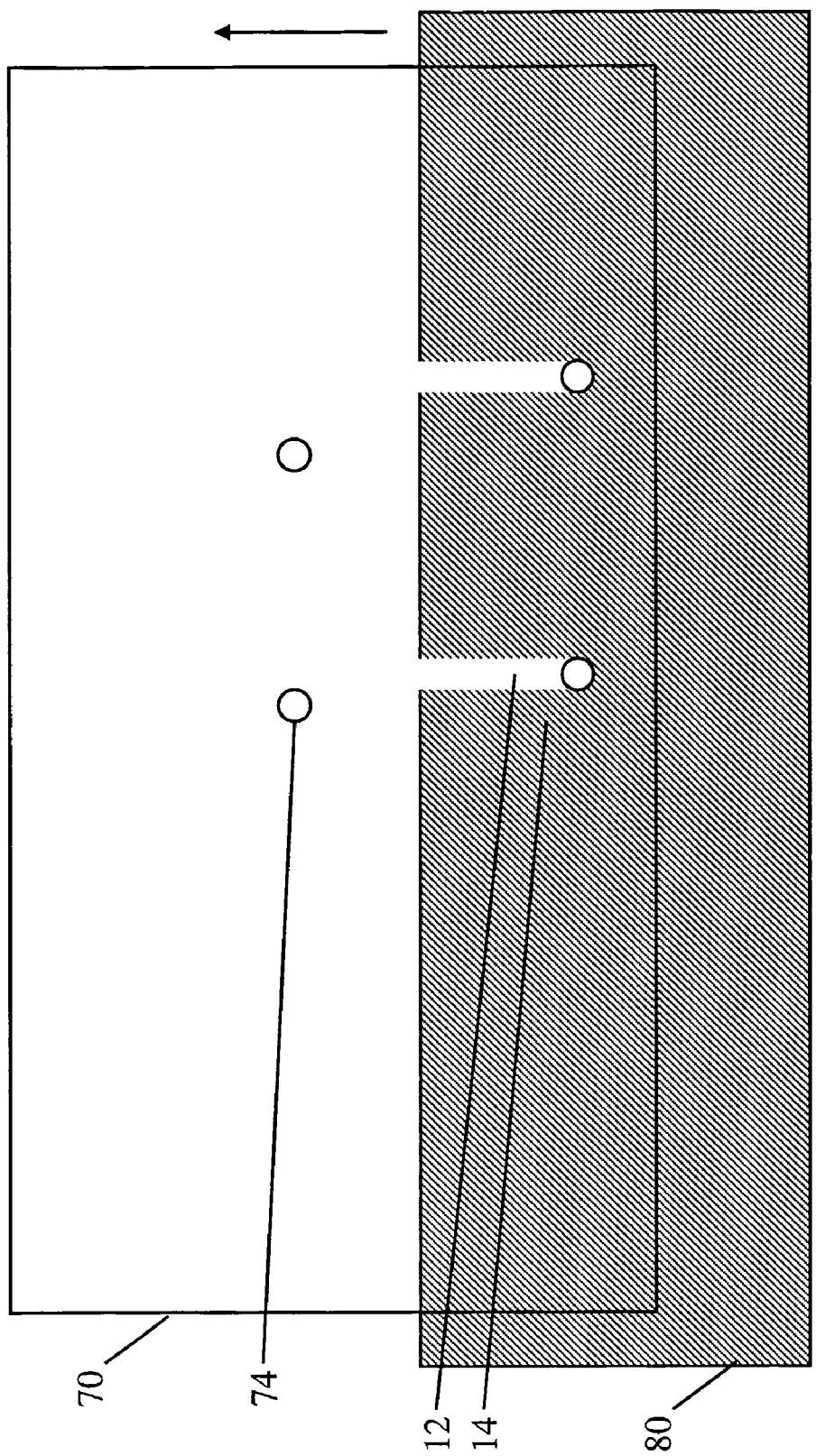

In FIG. 84, the surface 80 begins to pass the scanning projector 70 and two of the outlets 74 begin to expose linear patterns on the surface 80. In this figure, the surface 80 has not yet reached the other two outlets 74, so those outlets 74 have not yet begun to expose a pattern on the surface 80.

Figure 85:
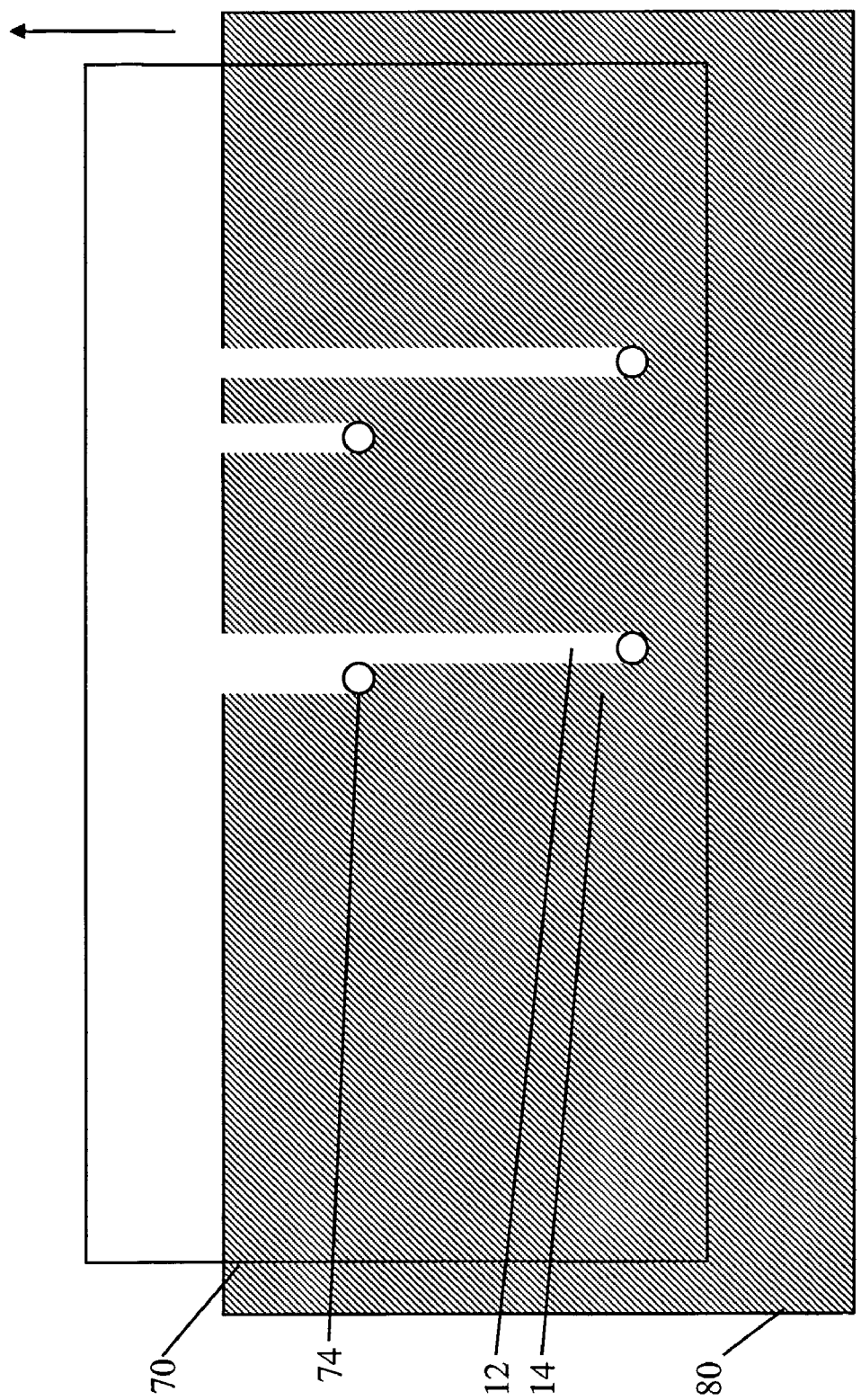

In FIG. 85, the surface 80 is being exposed by all four outlets 74, forming a pattern including a line twice the width of the outlets 74 (formed by the two left-most outlets, which are offset from each other by the diameter of the outlets), and two other lines separated by an unexposed portion (formed by the two right-most outlets).

Figure 86:
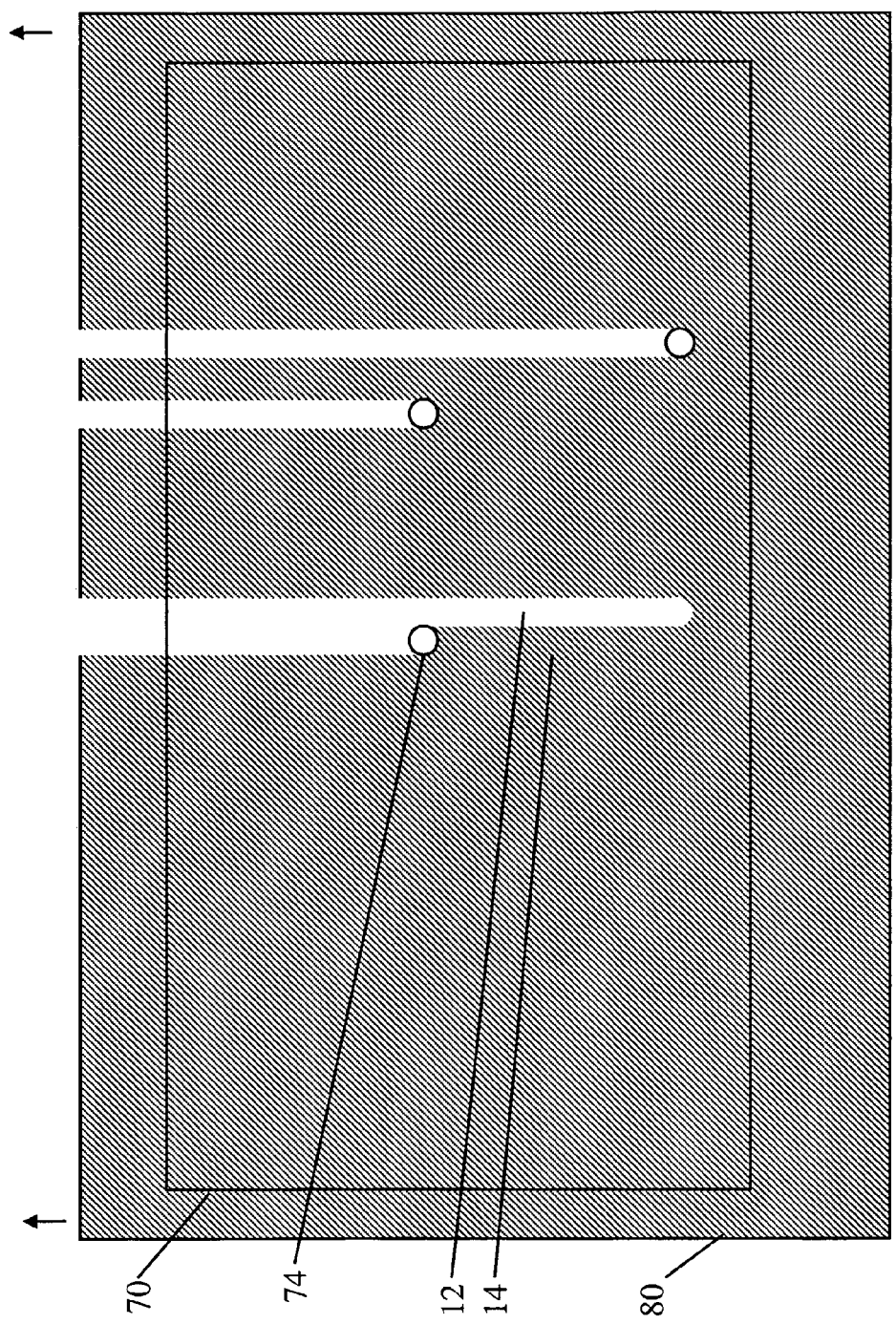

In FIG. 86, the bottom left outlet is tuned off as the surface 80 continues to move relative to the scanning projector 70. As a result, a different pattern is now being exposed onto the surface 80.

Figure 87:
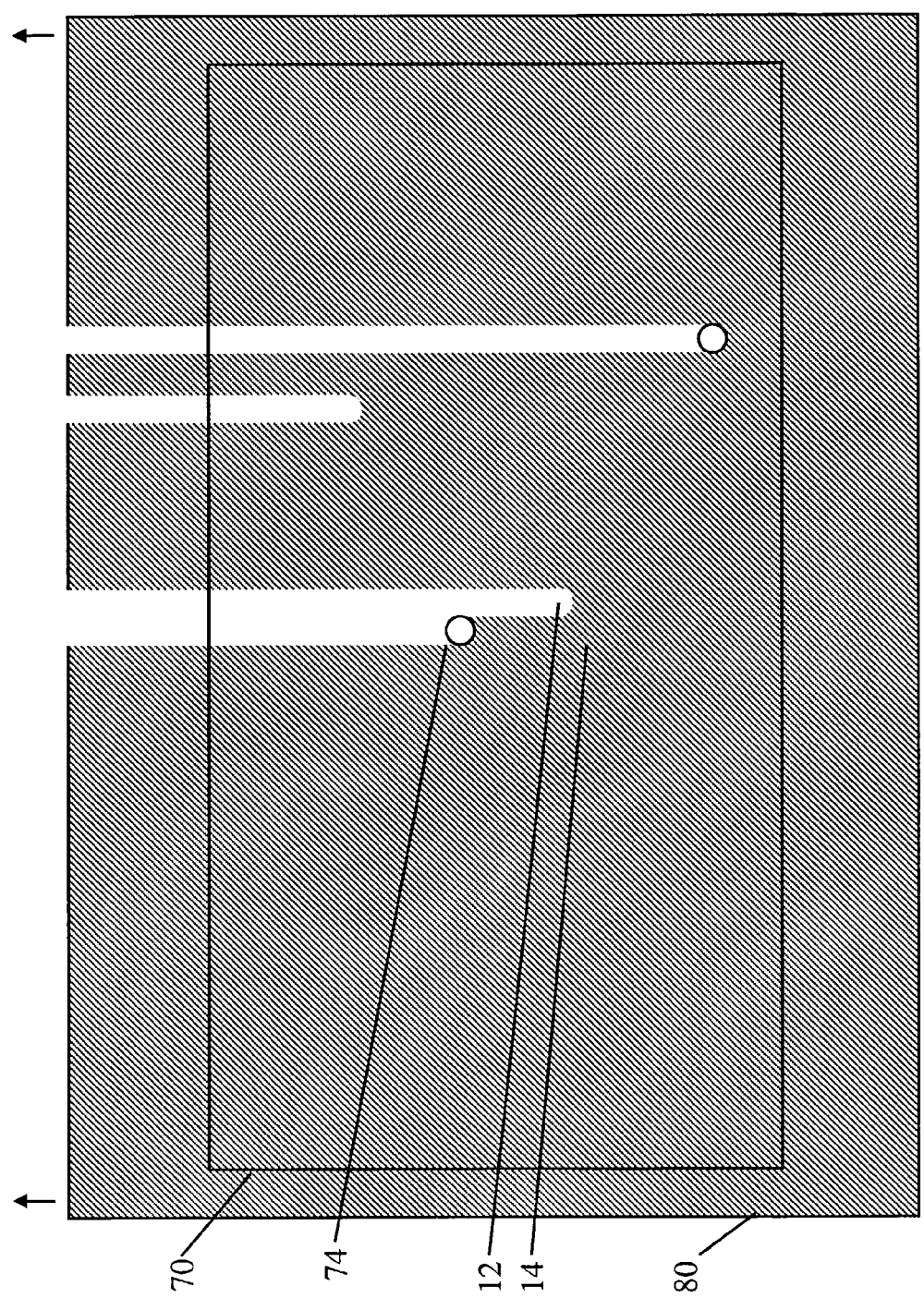

In FIG. 87, the effect of turning off the bottom left outlet 74 is seen. In addition, the top right outlet 74 has been turned off, further changing the pattern being exposed onto the surface 80.

Figure 88:
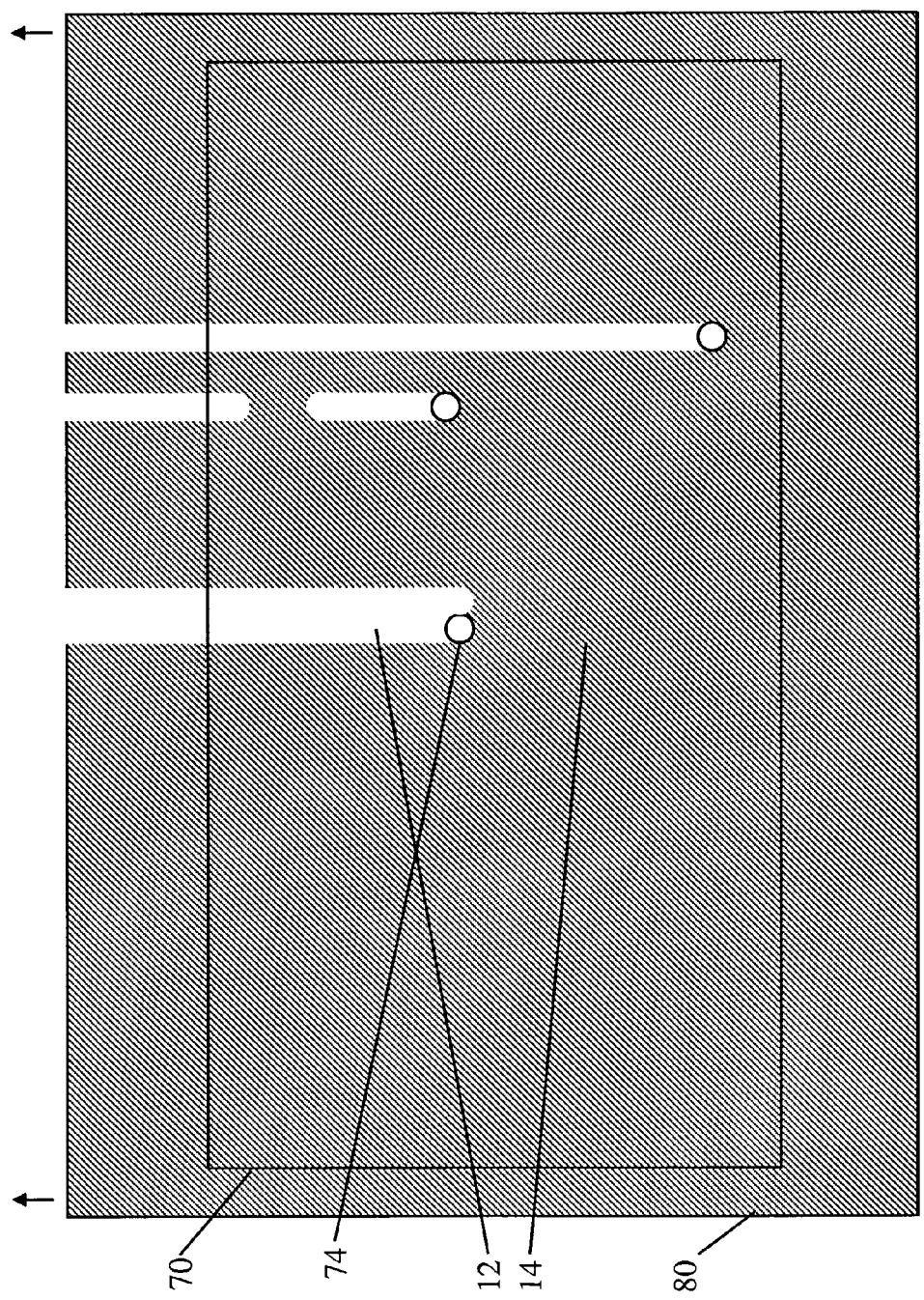

In FIG. 88, the top right outlet 74 has been turned on, changing the pattern again and continuing the linear pattern after an unexposed portion was formed when the top right outlet 74 was turned off in FIG. 87.

Figure 89:
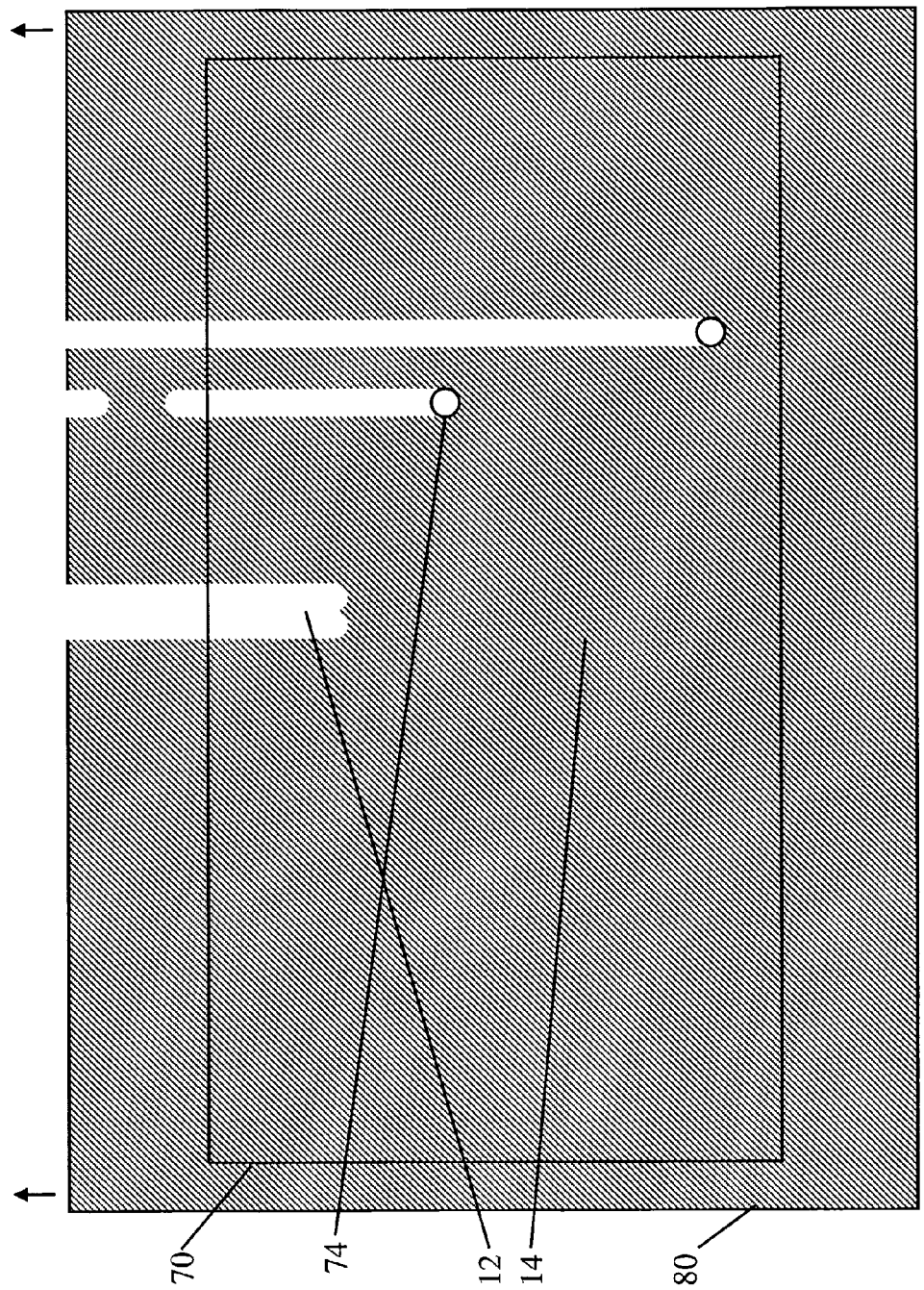

In FIG. 89, the top left outlet 74 has been turned off at a point on the surface 80 corresponding with the end of the pattern formed by the bottom left outlet. As a result, the linear pattern having a width of twice the outlet 74 diameter is terminated on the surface 80. The pattern formed by the right most outlets 74 continues to be formed on the surface 80.

FIGS. 83-89 illustrate several examples of the patterns that can be formed with the present invention, including exposure patterns having different widths and spacings, and discontinuities in lines. In addition, different patterns may also be formed, and additional outlets 74 may be used. Furthermore, more than one scan of the surface 80 by the scanning projector 70 may be performed.

Figure 90:
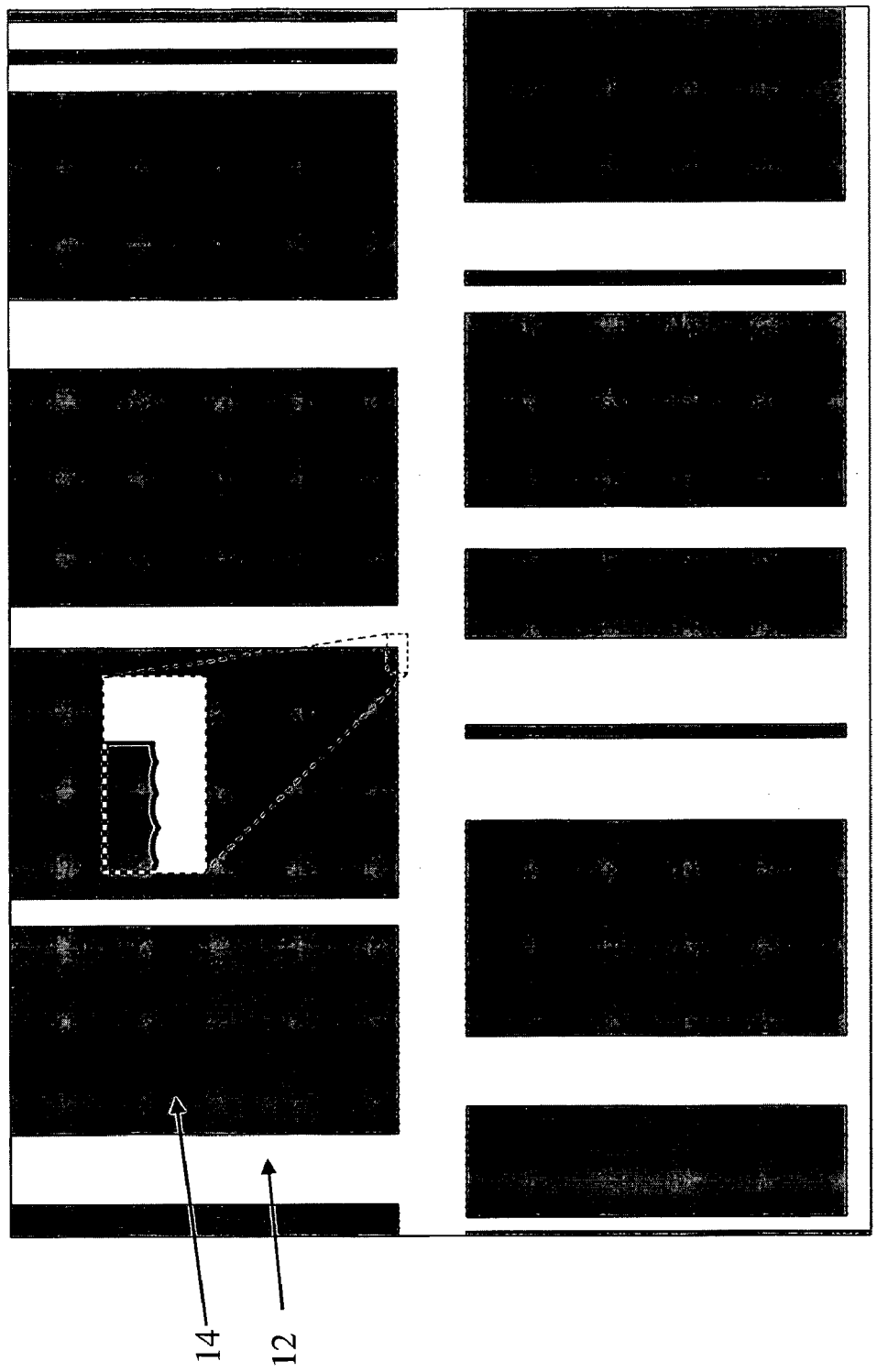
FIG. 90 illustrates several examples of patterns that may be formed with the present invention.

FIG. 90 illustrates some of the patterns that may be formed with a scanning projector 70 according to the present invention. Many other patterns may also be formed. A detailed view of one corner of one part of the pattern is shown in the inset of FIG. 90. That inset shows that certain edges formed with scanning projectors 70 having circular outlets 74 will be uneven after a first pass across the surface 80. In some embodiments, the edges may be smoothed via a second pass at a different angle (e.g., 90 degrees) across the surface 80. Alternatively, by using differently shaped outlets 74, such as rectangular outlets, the edges may be made smoother after only one pass.

Figure 91:
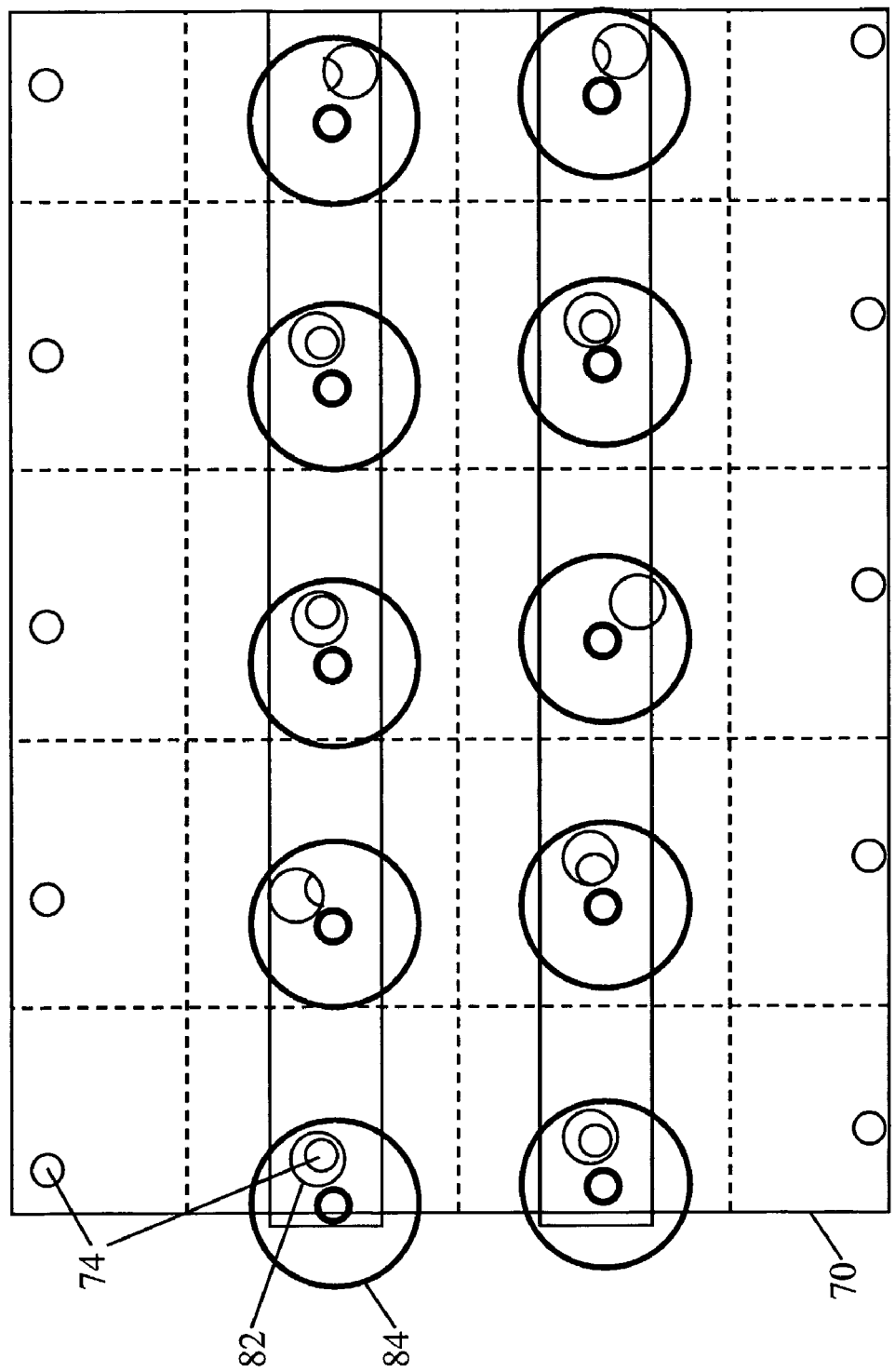
FIGS. 91-93 illustrate embodiments of scanning projectors.

FIG. 91 illustrates one embodiment of a scanning projector 70 and shows how the energy from the outlets 74 may be controlled. In that embodiment, moveable shutters 84, each having an opening 82, are used to cover and uncover the outlets 74. The shutters 84 may be controlled individually or in groups and may be constructed using, for example, MEMS technology or other technology. The outlets 74 may, for example, include individual energy sources such as lasers, light emitting diodes, x-ray sources, electron beam sources, or other energy sources. The individual energy sources may be "always on" to simplify construction of the device, and the shutters 84 used to control when the energy is provided to the wafer. Alternatively, the outlets 74 may be openings through which energy provided from one or more shared energy sources may pass. In addition, the outlets may be material outlets which are controlled by the shutters 84.

Figure 92:
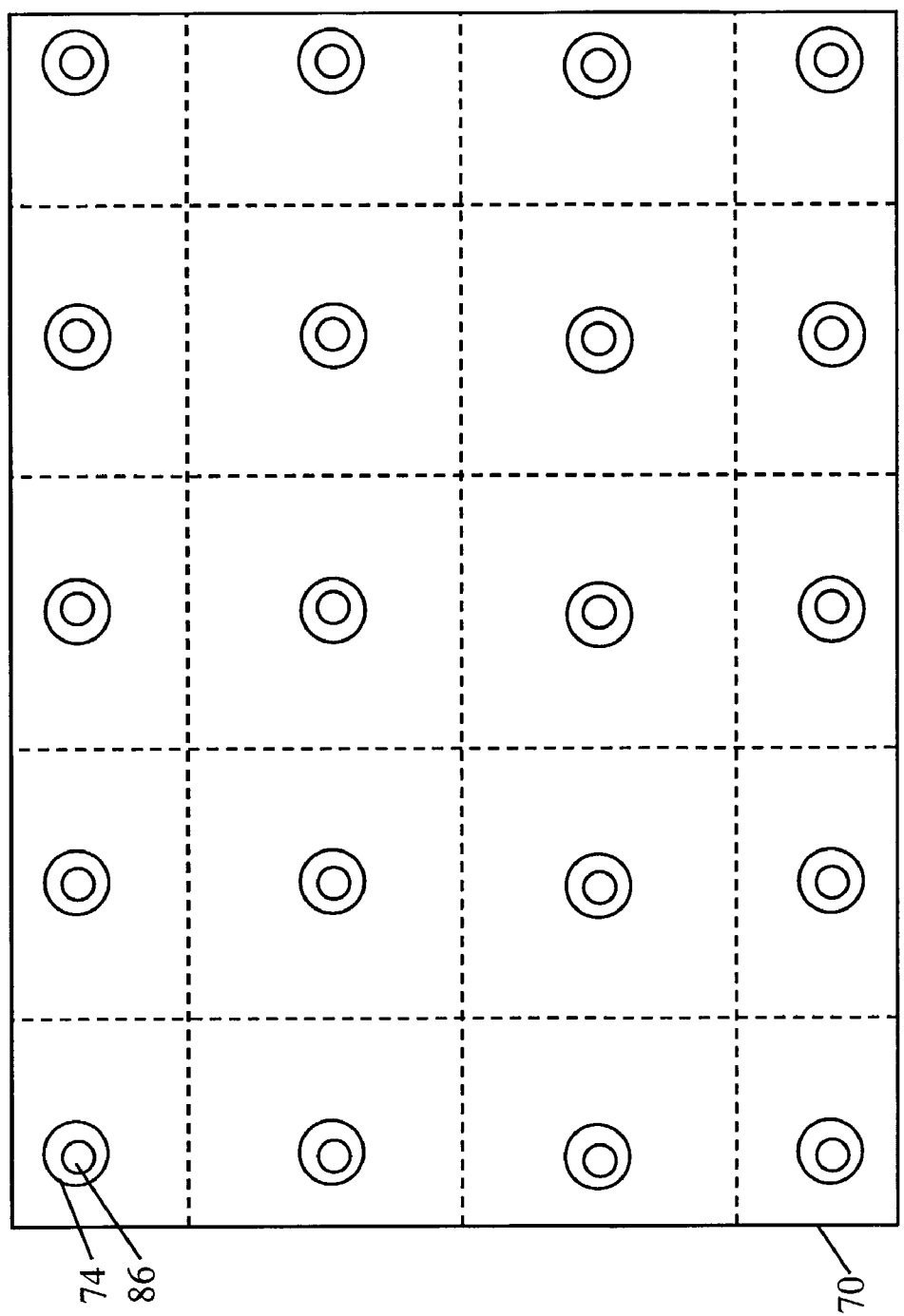

FIG. 92 illustrates another embodiment of a scanning projector according to the present invention. In that embodiment, discrete energy sources 86 are located in the outlets 74 and may be controlled, for example, individually or in groups. The energy sources 86 may be, for example, lasers or other energy sources.

Figure 93:
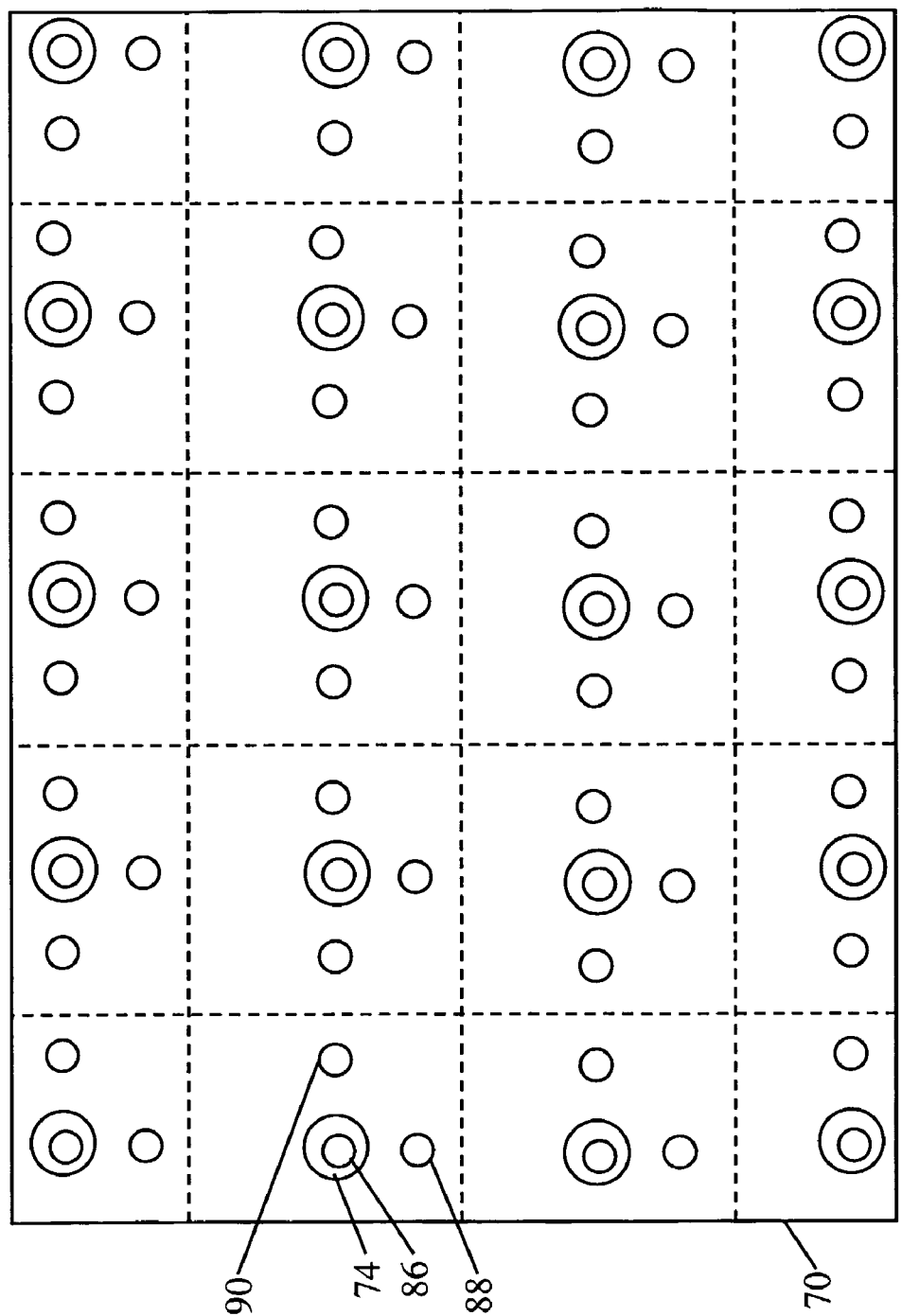

FIG. 93 illustrates another embodiment of a scanning projector including individual energy sources 86 in the outlets 74 and including sensors 88. The sensors 88 may be used to sense information regarding the process and the wafer 80 being processed. For example, the sensors 88 may sense energy reflected from the wafer 80 and that information may be used to detect defects or imperfections in the wafer 80. For example, defects or imperfections in a surface 80 will cause energy to be reflected or scattered in ways which are different than energy which is incident on a surface 80 which does not include such defects or imperfections. As a result, defects can be detected from the reflected energy. The sensors 88 may detect reflected energy from the energy sources 86 or energy outlets 74. Alternatively, a separate energy source 90 may be provided for use with the sensors 88. One or more sensors 88 and energy sources 90 may be provided with each energy outlet 74. Alternatively, two or more energy outlets 74 may share one or more energy sources 90 and sensors 88. In one embodiment, when a defect is detected the scanning projector 70 performs an alternative process on or around the defect to compensate for or reduce the likelihood of the defect or imperfection causing a failure in the device being processed. In another example, defects can be tracked so that, if a process encounters less defects or imperfections than expected, some or all redundancies in individual dies or on wafers may be omitted or replaced with more useful features or devices. Likewise, if more defects are detect than are expected, certain changes in the process may be implemented to compensate for this unexpected event. Other uses for this information are also possible, allowing for more flexible production, higher yield, and greater efficiencies. In other embodiments, the scanning projector 70 may include energy sources and sensors to detect defects or other features of the surface 80, and this information may be used to control material outlets which deposit material on the surface 80.

Figure 94:
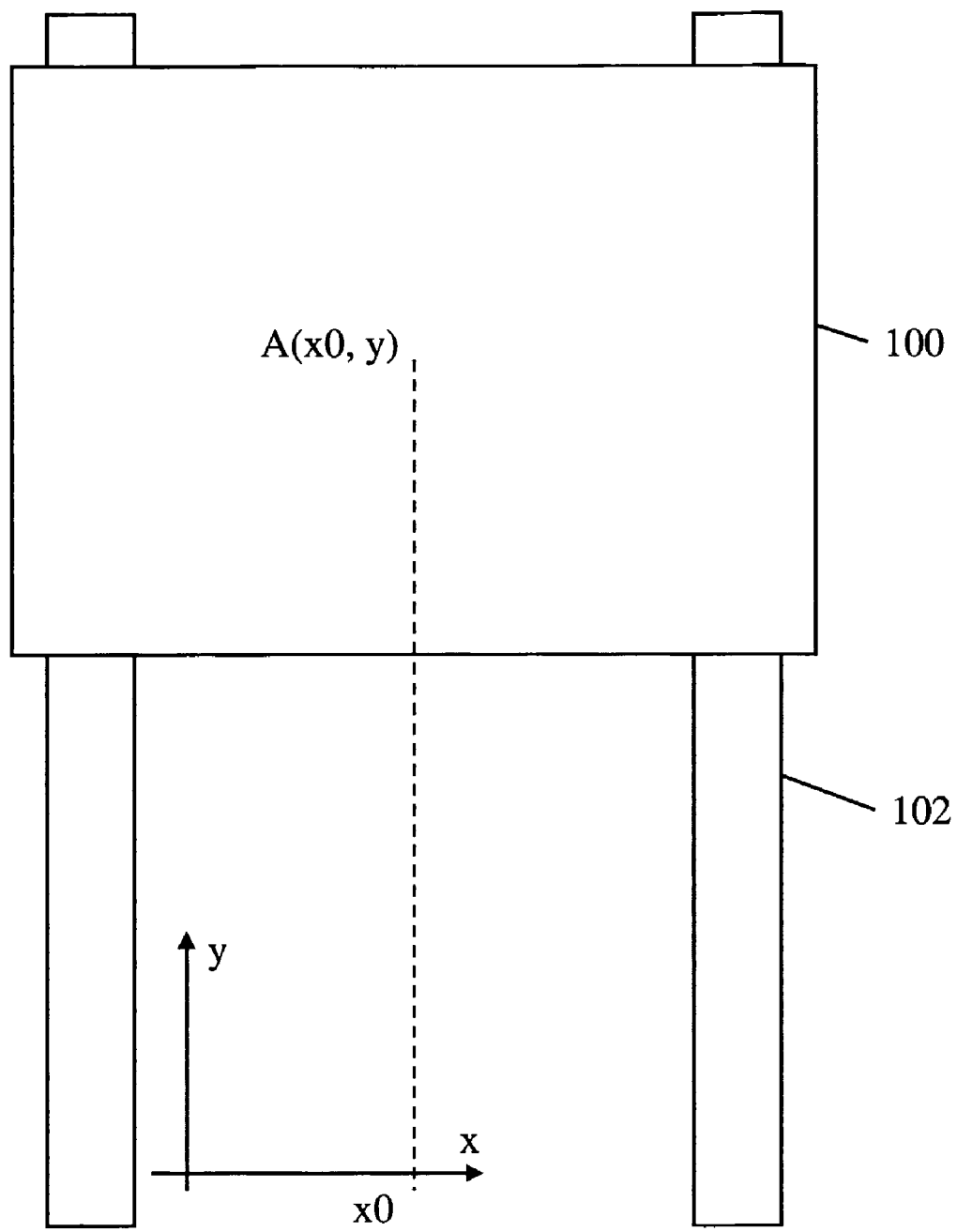
FIGS. 94-97 illustrate embodiments of devices which may be used with scanning projectors to form patterns on a surface.

FIG. 94 illustrates a device which can be used with a scanning projector. The device includes a platform 1 for supporting or holding a semiconductor wafer 4 or other item to be processed with a scanning projector. The platform 1 may, for example, support a wafer from below so that the platform 1 and wafer 4 pass below the scanning projector (not shown). Alternatively, the platform 1 may support the wafer 4 from above, such as with one or more vacuum attachments, magnetic attachments, or adhesive attachments, so that the wafer faces down and the scanning projector (not shown) passes under the wafer 4 during processing. Other variations are also possible, such as the platform 1 supporting the wafer 4 from the side or holding the wafer in a vertical or other non-horizontal orientation.

In the illustrated embodiment, the platform 1 is moveable on the supports 2. Although two supports 2 are illustrated, more or less supports 2 may be used. The supports 2 may be above, below, beside, or otherwise oriented with regard to the platform 1. Alternatively, the platform 1 may be independent of the supports 2, in which case one or more supports 2 may be connected to and used to move a scanning projector (not shown). The supports 2 may be mechanically connected to the platform 1 or a scanning projector (not shown), or the supports 2 may be connected in other ways, such as via magnetic levitation or otherwise so as to move at least one of the platform 1 and a scanning projector (not shown) relative to the other. In some embodiments, both the platform 1 and the scanning projector may be moved.

A center point 3 of the platform 1 is illustrated as A(x0,y). In this embodiment, the platform 1 moves along the supports 2 in the y-axis, but does not move in the x-axis. In other embodiments, the platform 1 may move in the x-axis and may or may not move in the y-axis. Although not shown, a scanning projector (not shown) may be located along the supports 2 so as to process the wafer as it passes. The scanning projector (not shown) may be stationary, or it may move along the x-axis, such as to facilitate alignment. In other embodiments, the scanning projector (not shown) may also move in the y-axis.

Figure 95:
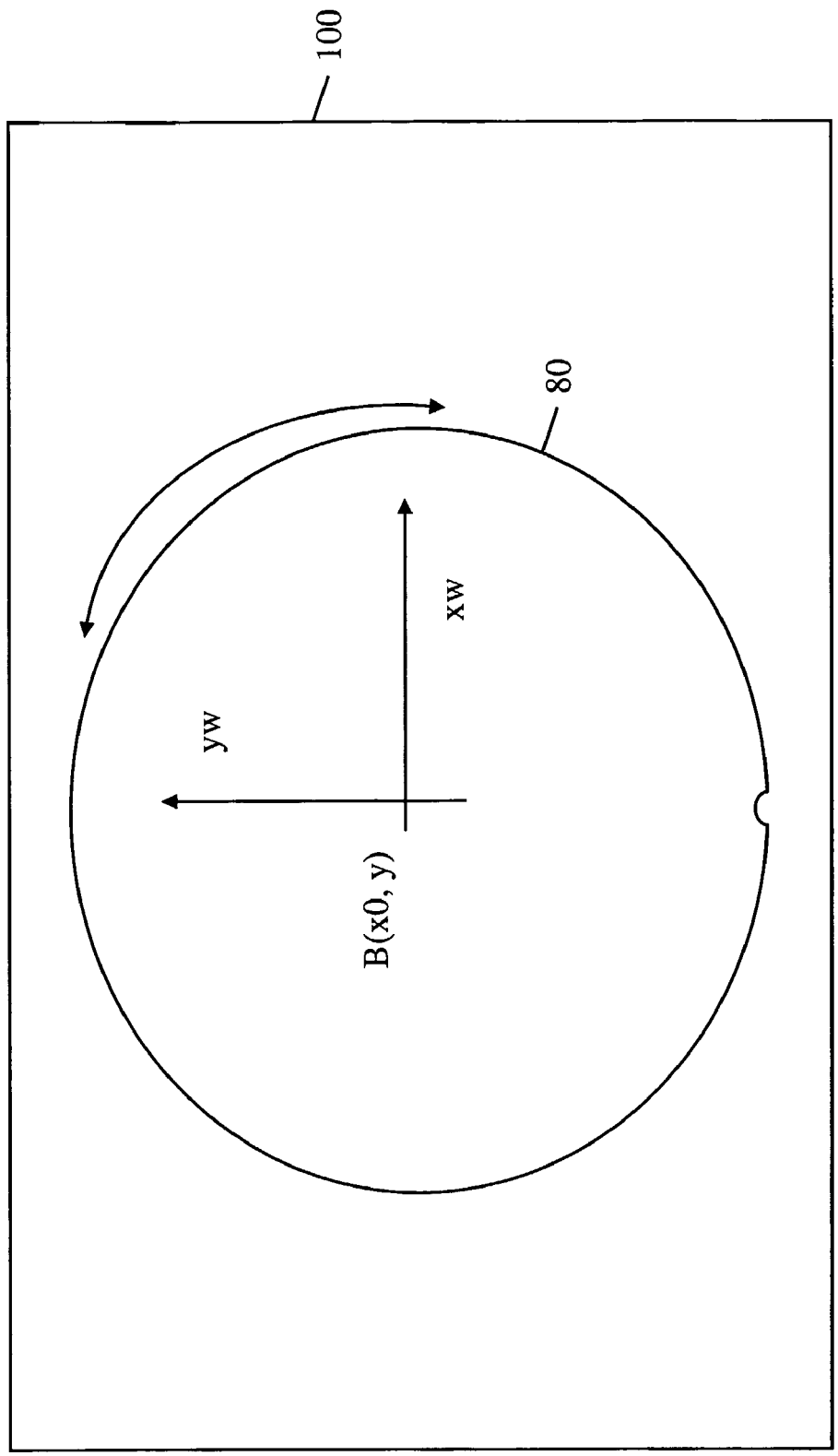

FIG. 95 illustrates a platform 100 supporting a wafer 80. The center of the wafer 80 is illustrated as B(x0,y). In this embodiment, the wafer 80 may be rotated around its center point. The rotation may be accomplished, for example, by rotation of the platform 100, or by rotation of the wafer 80 independent of the platform 100, such as through the use of a separate rotatable platform (not shown) between the wafer 80 and the platform 100, or through other devices. In some embodiments, the wafer 80 may be rotated between zero and 90 degrees, while in other embodiments limits on rotation of the wafer 80 may be more or less than 90 degrees. The wafer 80 is illustrated as including an index mark 104. The index mark 104 may be, for example, a notch as is customarily used with semiconductor wafers to indicate crystalline orientation, or a different mark such as a flat edge or other indication of orientation relative to the wafer 80.

Figure 96:
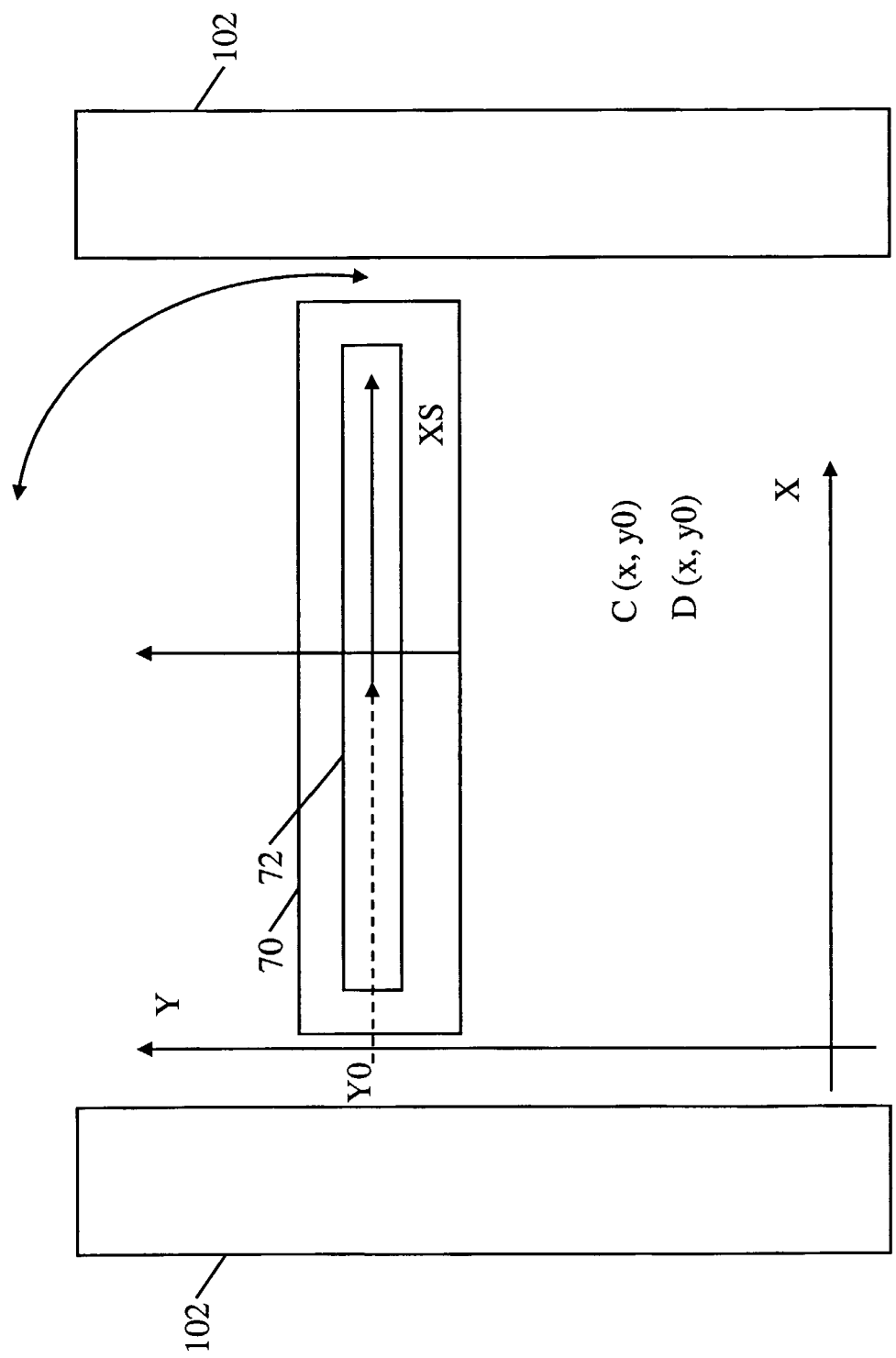

FIG. 96 illustrates a scanning projector 70 and scanning mask 72 oriented relative to the supports 102. The center of the scanning projector 70 is labeled C(x,y0), and the center of the scanning mask 72 is labeled D(x,y0). In this embodiment, the scanning projector 70 is stationary along the y-axis, although it may move along the x axis, such as for aligning the scanning projector 70 with the wafer 80 (not shown) and platform 102 (not shown). In addition, the scanning projector 70 may rotate around its center point.

Figure 97:
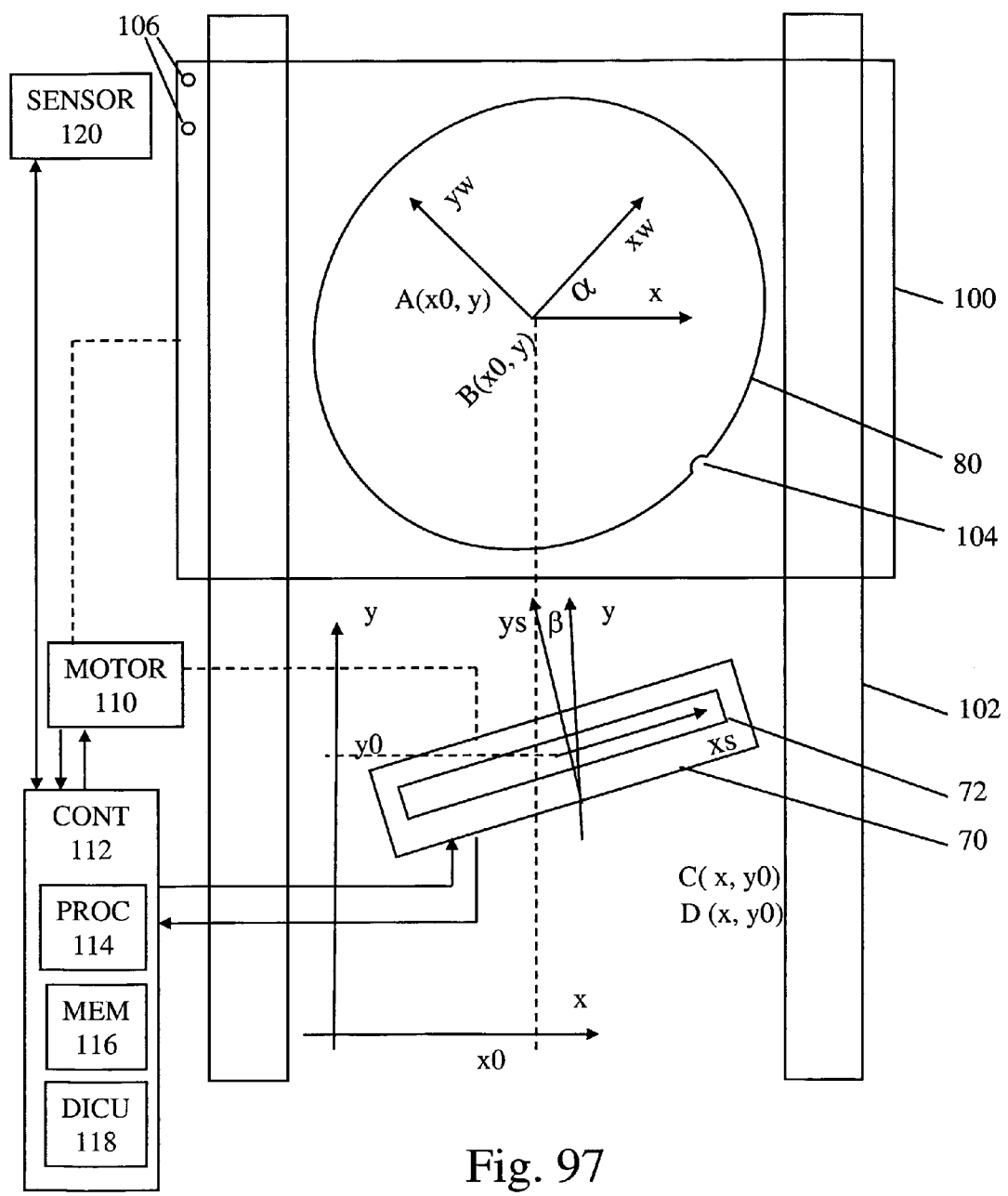

FIG. 97 illustrates a scanning projector 70 in combination with the platform 100, supports 102, and wafer 80. In this embodiment, the platform 100 moves along the supports 102, thereby moving the wafer 80 relative to the scanning projector 70. The scanning projector 70, in addition to moving side to side along the x-axis, such as for better alignment with the wafer 80 and platform 100, may also rotate. In addition, the illustrated embodiment also allows for movement of the mask 72 relative to the scanning projector 70. The scanning projector 70 and the mask 72 may be moved before or during the processing of the wafer 80, such as to better align the scanning projector 70 and mask 72 with the wafer 80, to compensate for non-linear or misaligned features on the wafer 80, or for other purposes.

The illustrated embodiment shows the scanning projector 70 rotating about its center point C(x,y0) by an amount beta $\beta$. The rotation may be used, for example, to vary the spacing of outlets 74 within a row and to vary the offset between rows of outlets 74. This figure also illustrates rotation of the wafer 80 by an amount alpha $\alpha$. Although the scanning projector 70 is illustrated as rotating around its center point, the scanning projector 70 may also be made to rotate around a point other than its center point, such as one end of the scanning projector 70. Similarly, the wafer 80 and wafer support 100 may also rotate around a point other than their center points.

The scanning projector 70 may also be used in connection with other devices. FIG. 97 illustrates a motor 110 and a controller 112. The motor 110 may move the scanning projector 70 or the platform 100. In other embodiments, more than one motor 110 may be used, such as one to move the scanning projector 70, one to move the platform 100, and motors to perform other operations, such as to rotate the platform 100, to rotate the scanning projector 70, motors to move the platform 100 and scanning projector 79 along the x-axis, motors to move the scanning mask 72 relative to the scanning projector 70, and other functions. In the illustrated embodiment, the controller 112 includes a processor 114, memory 116, and a design instruction control unit 118. Although these devices are shown as being separate from the scanning projector 70, they may alternatively be integrated into the scanning projector 70 or integrated into one or more other devices. For example, several controllers 112, memory units 116, and processors 114 may exist, and they may be located in the same or different locations. For example, a controller 112 may be located in the scanning projector 70, another may be located in the platform 100, another may be located in one or more motors 110, and another may located in another location. They may perform different tasks or they may share tasks. In addition, the controllers 112 may contain the same or different components. For example, not all controllers 112 might contain the design instruction control unit 118. The controller 112 may receives feedback, such as from the scanning projector 70, the platform, or from other devices, such as from one or more sensors 120 used to determine the location of the scanning projector 70 and the platform 100, such as by detecting reference points or an alignment index 106 on the scanning projector 70, the platform 100, or some other device associated therewith. The sensors 120 may be located, for example, on the platform (100) or the projector (70), or on one or more items associated therewith so as to allow relative position between the platform (100) and the projector (70) to be determined. The controller 112 may also provide control signals to other devices, such as control signals to the motor 110, control signals to the outlets 74 in the scanning projector 70, etc.

Figure 98:
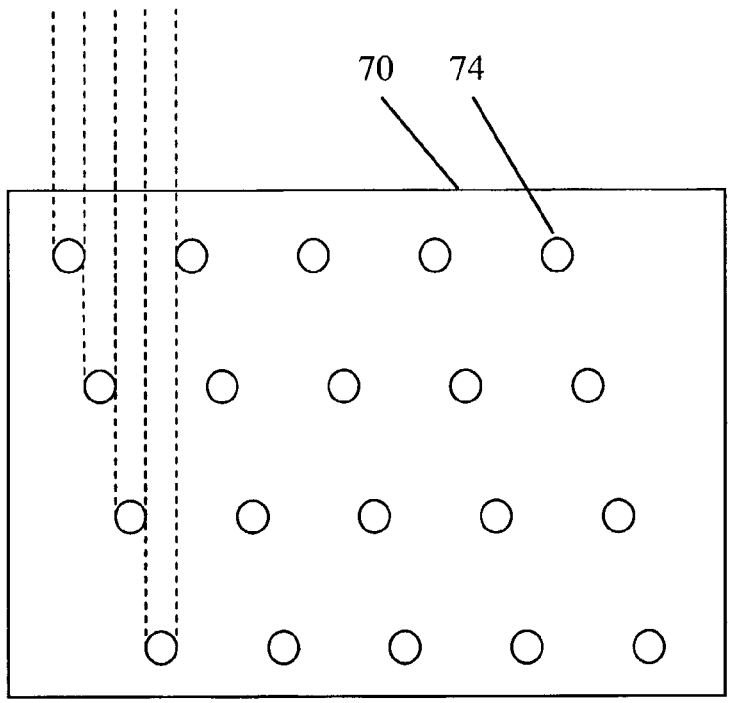
FIGS. 98-100 illustrate scanning projectors.
Figure 99:
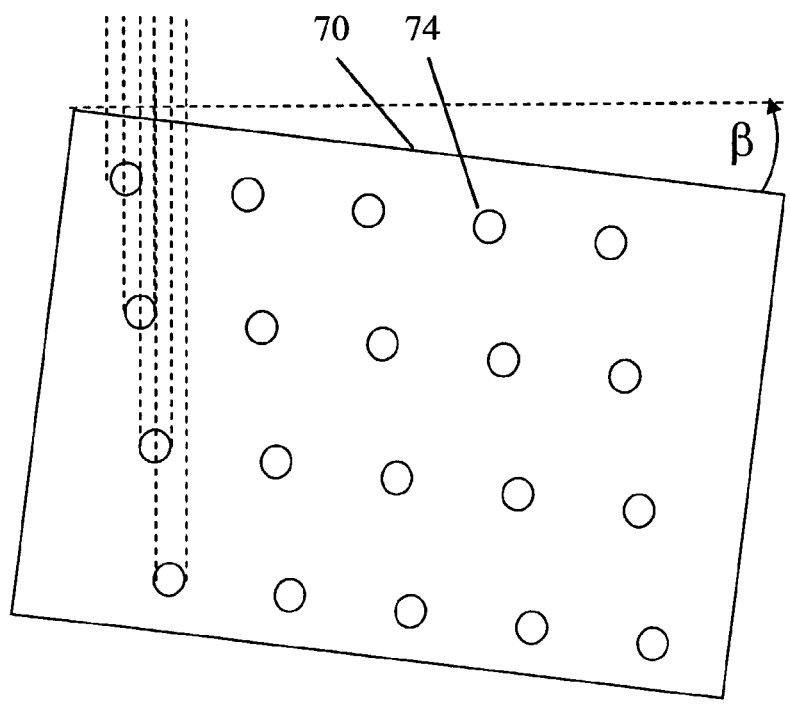

FIGS. 98 and 99 illustrate an example of how rotating a scanning projector 70 effectively changes the spacing between outlets 74 within a row and changes the offsets between rows of outlets 74, thereby allowing for variable widths of the lithographic features created by the scanning projector 70. FIG. 98 illustrates a scanning projector 70 with outlets 74 offset by the diameter of the outlets 74. When oriented in the non-rotated state, or β=0, the scanning projector 70 can create lithographic features with a resolution of one outlet diameter, as illustrated by the dashed lines. FIG. 99 illustrates the same scanning projector 70 rotated slightly (i.e., β>0). As a result, the rotated scanning projector 70 now has an effective offset between the rows of one half the diameter of an outlet 74. By rotating scanning projectors 70, the effective offset can be changed, allowing for a wide range of exposed and unexposed widths to be created.

Methods of Operating the Scanning Projector

The scanning projector and associated devices may be operated according to many methods. The methods may be, for example, embodied as hardware, software, firmware, or in other forms and combinations thereof. Regardless of how the methods are embodied, they may be stored in the scanning projector, such as in hardware or memory devices therein, or in another device, or stored using two or more devices. In one embodiment, the scanning projector may be operated as follows:

(a) deposit a layer of photoresist on a wafer;
(b) load a pattern (e.g., a B-pattern) or instructions for forming a pattern into a memory for the scanning projector;
(c) scan the wafer with the pattern stored in memory;
(d) rotate the wafer (e.g., 90 degrees or some other amount);
(e) load a new pattern into the memory for the scanning projector; and
(f) scan the rotated wafer with the new pattern stored in memory.

Many variations of the method are possible. For example, a material other than photoresist may be exposed, more than one pattern may be loaded into the memory at the same time, the memory may be located outside of the scanning projector, the scanning projector may perform more or less than two scans, and the wafer may not be rotated.

Another method of operating the scanning projector is as follows:

(a) deposit a layer of photoresist on a wafer;
(b) load a pattern (e.g., a B-pattern) or instructions for forming a pattern into a memory for the scanning projector;
(c) scan the wafer with the pattern stored in memory;
(d) interrupt the scan according to instructions dictated by design insertion control unit;
(d) rotate the wafer (e.g., 90 degrees or some other amount);
(e) load a new pattern into the memory for the scanning projector;
(f) scan the rotated wafer with the new pattern stored in memory; and
(g) interrupt the scan according to instructions dictated by design insertion control unit.

As stated above, many variations of operating the scanning projector and associated devices are possible. Another method of operating the scanning projector is as follows:

(a) deposit a layer of photoresist on a wafer;
(b) load a pattern (e.g., a B-pattern) or instructions for forming a pattern into a memory for the scanning projector;
(c) scan the wafer with the pattern stored in memory;
(d) periodically or continually read reflected or scattered energy (e.g., capture data at each scanning increment);
(e) if the reflected energy is within acceptable parameters, continue scanning and reading reflected energy and then proceed to step (g);
(f) each time the reflected energy is not within acceptable parameters (e.g., a defect is detected):
  (i) identify the coordinates of the defect;
  (ii) modify the pattern in response to the defect (e.g., the design insertion control unit may analyze the defect and send a signal indicative of a modification of the pattern);
  (iii) continue scanning and with the modified pattern;
(g) rotate the wafer (e.g., 90 degrees or some other amount);
(h) load a new pattern into the memory for the scanning projector;
(i) scan the wafer with the new pattern stored in memory;
(j) periodically or continually read reflected or scattered energy (e.g., capture data at each scanning increment);

(k) if the reflected energy is within acceptable parameters, continue scanning and reading reflected energy and then proceed to step (m);

(l) each time the reflected energy is not within acceptable parameters (e.g., a defect is detected):
  (i) identify coordinates of the defect;
  (ii) modify the pattern in response to the defect (e.g., the design insertion control unit may analyze the defect and send a signal indicative of a modification of the pattern);
  (iii) continue scanning with the modified pattern;

(m) complete scan.

As described herein, many variations are possible with the present invention and the methods described herein. Adding, deleting, and modifying steps in the methods presented herein are possible with the present invention.

Figure 100:
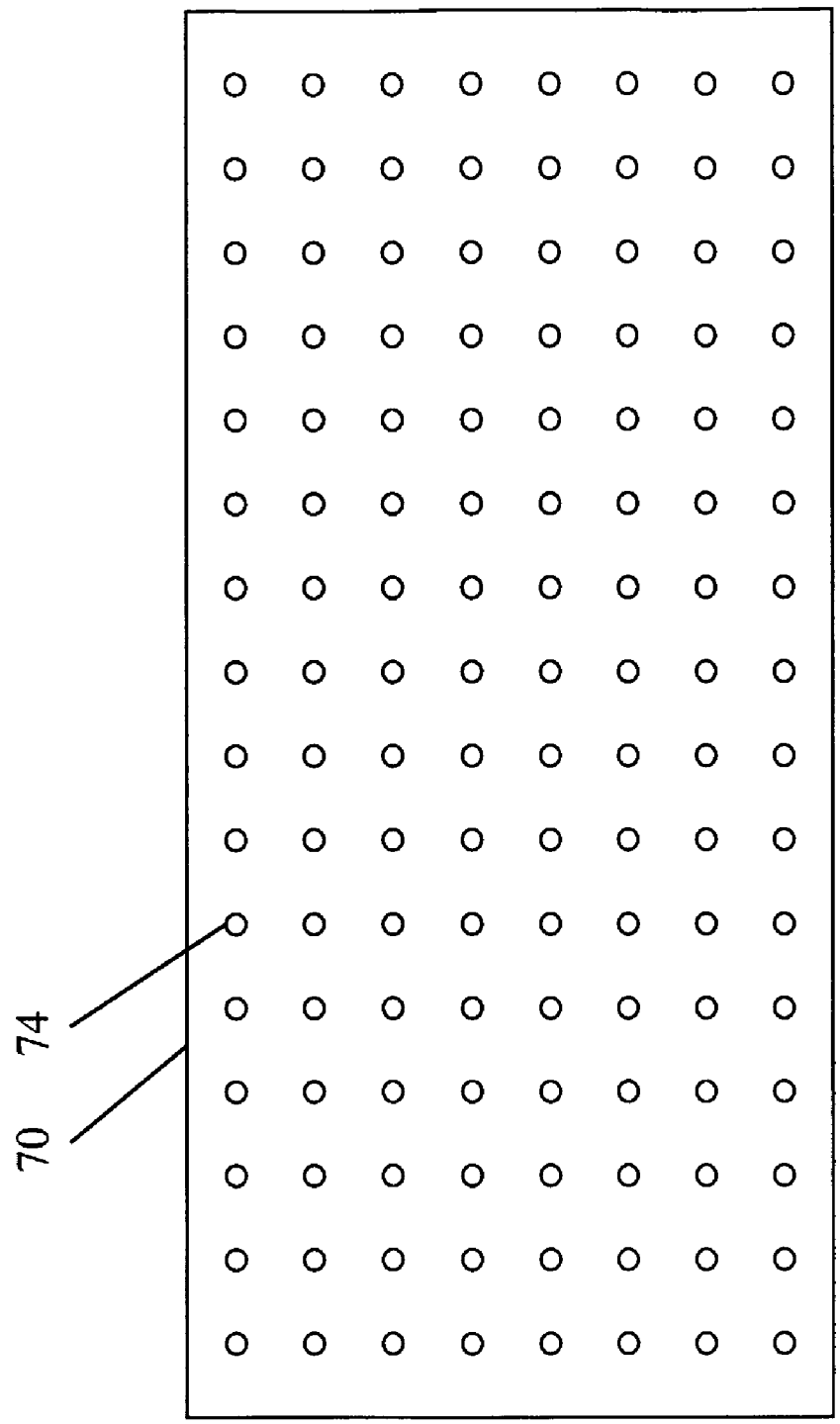

FIG. 100 illustrates another embodiment of a scanning projector which includes an array of outlets. In this embodiment, the outlets are not offset from row to row. However, if the scanning projector is rotated, as described above, an offset can be created to meet whatever needs arise. Furthermore, the outlets illustrated in FIG. 100 are relatively closely spaced. However, this embodiment includes redundant outlets so that, in the event greater spacing between optical outlets is desired, only outlets with sufficient spacing may be used to reduce interference. For example, only certain outlets may be used so that no active outlet is closer than a predetermined distance (e.g., eight outlet diameters) from any other active outlet. Furthermore, more or less outlets than those illustrated in this Figure may be used.

Alignment Index

Figure 101:
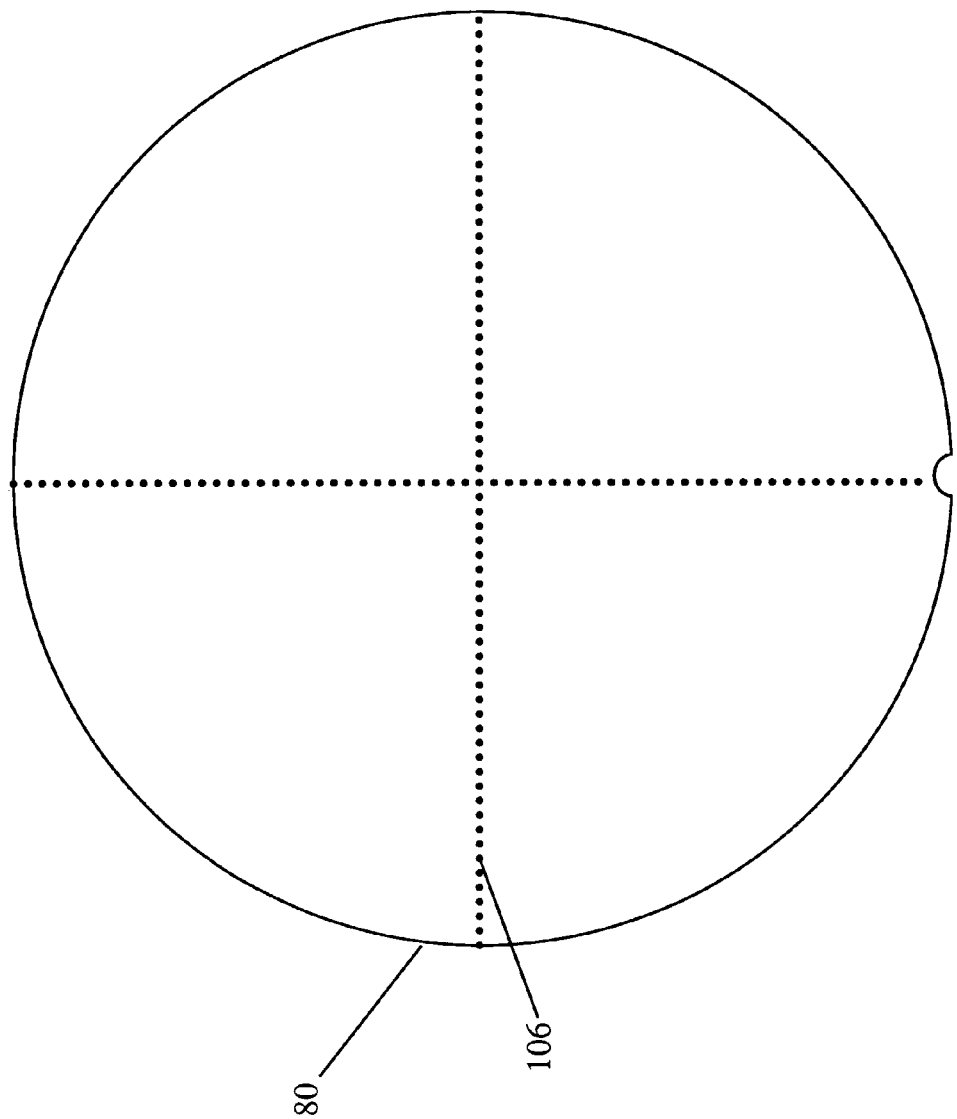
FIGS. 101-102 illustrate one embodiment of alignment indexes.

FIG. 101 illustrates one embodiment for aligning a scanning projector with a wafer. In that embodiment, the wafer includes an alignment index or reference points 106 in the form of two lines perpendicular to each other on the surface of the wafer. The two perpendicular lines forming the alignment index 106 allow for determining position in two-dimensional space on the wafer.

Figure 102:
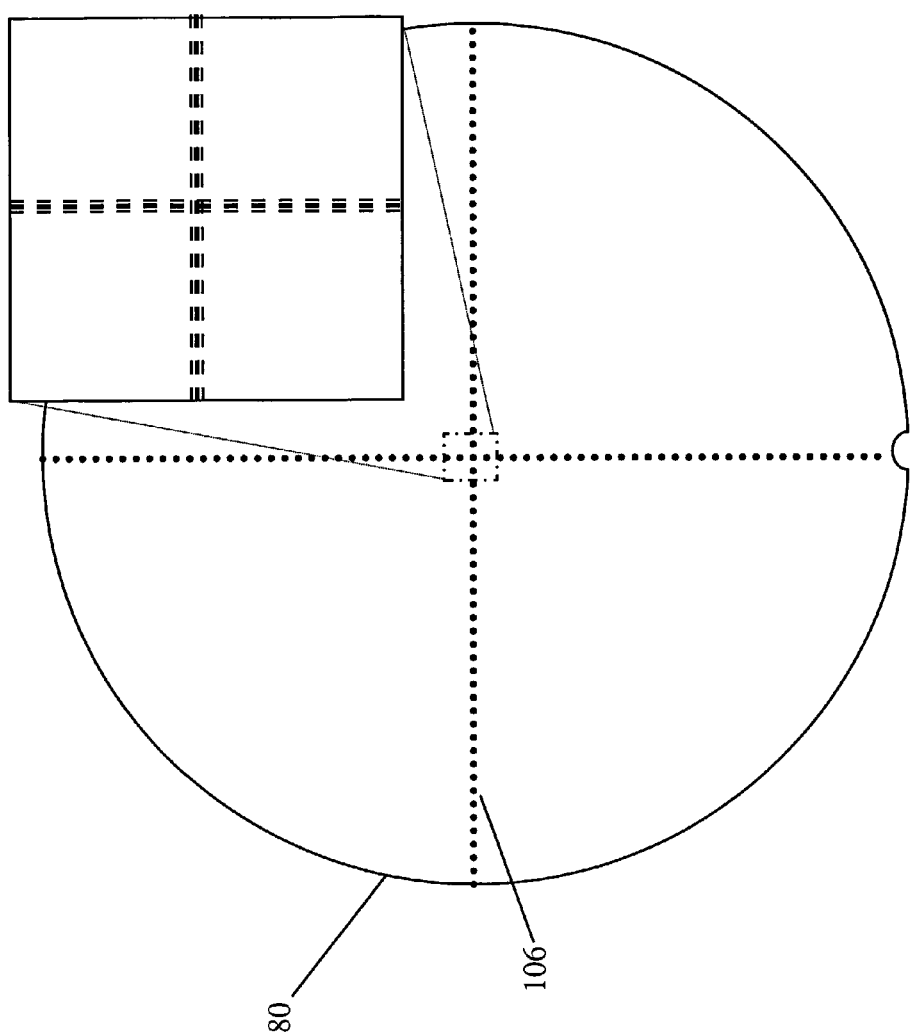

FIG. 102 illustrates a more detailed view of a portion of one embodiment of the alignment index 106 according to the present invention. That embodiment of the alignment index 106 consists of rectangular features arranged linearly. The rectangular features may be of known dimensions and arranged at regular intervals to allow for a location on the wafer to determined reliably with reference to the index. In other words, a scanning projector 70 or other device may count the rectangular features of the alignment index 106 as it moves relative to the wafer in order to determine location on the wafer. In addition, velocity relative to the wafer may also be determined by observing the motion of the rectangular features of the alignment index 106.

The alignment index 106 may be formed, for example, with conventional semiconductor fabrication processes, such as by using a mask to form a desired pattern in a layer of photoresist, etching the desired pattern into the wafer, and removing the photoresist. Other processes may also be used, such as mechanically imprinting the pattern, or through other methods. Other forms of the index 106 may also be used, such as by using more or less than two lines, arranging the index in different orientations, and using different features to form the index. For example, in place of rectangles, the alignment index 106 may be formed with different features such as circles, lines, triangles, other shapes or forms, or combinations of shapes or forms. For example, several different shapes may be used in the index 106 to represent certain information or to provide a check for the scanning projector 70. In one embodiment, every fifth index mark 106 is different from the rest of the index marks 106 to allow the scanning projector to correct an indexing error. Likewise, the features in the alignment index 106 may be of uniform size and spacing, or they may have variable size and spacing.

In another embodiment, a relatively small number of alignment marks 106 may be used. For example, two reference points or alignment marks 106 may be used to orient the scanning projector 70 and/or the platform 100 relative to each other or relative to another reference. In one embodiment, two or more alignment marks 106 are located at locations other than on the wafer or target 80, such as on the platform 100, on the projector 70, or on other locations. The alignment marks 106 are monitored to determine the relative location of the scanning projector 70 and/or the platform 100. For example, two or more marks 106 may be located on the platform 100 and monitored by one or more sensors (120) as the scanning projector 70 moves. By calculating the scanning projector's 70 location relative to the alignment marks 106, the scanning projector's 70 location relative to the platform 100 and target 80 can also be determined.

Database.

Figure 103:
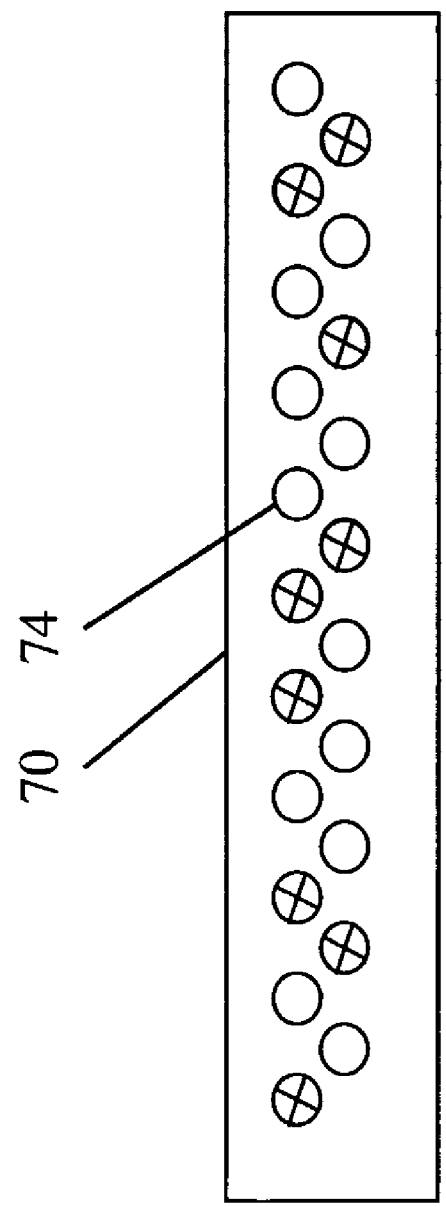
FIG. 103 illustrates a scanning projector in the context of database management.

The present invention is also applicable to improved database management and information storage for fabrication processes. In one embodiment, a particular pattern for a wafer or other surface is stored as data indicating whether particular outlets on a scanning projector are "on" or "off" as the scanning projector moves across the wafer or surface. For example, each outlet may be represented by a bit of data, with a "1" value indicating that the particular outlet is "on", and a "0" value indicating that the particular outlet is "off". FIG. 103 illustrates one such example. In that case, the outlets marked with an "x" are "off", while the other outlets are "on". A corresponding string of bits representing this state of the scanning projector at a particular location is illustrated below the outlets.

As a result, all of the outlets in a scanning projector may be represented by a string of "1"s and "0" for each point across the wafer or surface. In one embodiment, values for each outlet are recorded for each index point of the alignment index discussed above. In other embodiments, the values of each outlet are recorded according to other indexing methods.

In another embodiment, the database does not record data for each location on the wafer or surface, but rather identifies a particular B-pattern 10 and identifies the coordinates at which the B-pattern 10 is "broken" or modified. From this information, the entire pattern can be determined. It is not required, in this embodiment, to record information about all of the remaining portions of the B-pattern. Because of the known nature of the B-patterns 10, it is enough to know which B-pattern 10 is used and where that pattern is modified.

In another embodiment, the database records the transitions of the outlets between the on state and the off state. For example, for each outlet the database may record a series of alignment index numbers that represents when a particular outlet changes from one state to the other state (e.g., from "on" to "off", or from "off" to "on"). Such a database would be particularly efficient with respect to patterns having long pattern elements, such as long metal and polysilicon runs.

CONCLUSION

Although the present invention has been described in terms of several embodiments, many variations are possible with the present invention. For example, the spacing, offset, shape, size, orientation, geometry, and other characteristics of the outlets may vary from that illustrated herein. In addition, characteristics may be the same for all outlets, or they may vary. Furthermore, the present invention may be implemented using convention semiconductor fabrication techniques, such as using a mask which is larger than the target area, and using a lens to focus the mask onto the smaller target area.

In addition, the examples provided hereinabove create several basic cells through the use of a small set of B-patterns 10. Finding the appropriate set of B-patterns 10 which is sufficient to layout an economically attractive integrated circuit or other device will vary based on the particular application. More or less B-patterns 10 may be used, and the B-patterns 10 may be the same or different from those described herein.

Although the present invention has generally been described in terms of integrated circuits, integrated circuit fabrication, and lithography, the present invention is applicable to other devices, technologies, forms of fabrication, and processes. For example, the present invention is also applicable to technologies and processes related to micro-electro-mechanical systems, liquid crystal display, and other non-semiconductor and non-integrated circuit applications.

The examples provided herein are illustrative and not limiting, and other variations and modifications of the present invention are contemplated, such as by using different processing steps and materials. For example, the present invention was generally described in the context of using positive photoresist materials, although the present invention may also be used with negative photoresist materials and other materials. Furthermore, the features of the invention may be combined and varied, even if those combinations and variations are not specifically disclosed herein. Those and other variations and modifications of the present invention are within the spirit and scope of the present invention, and it is intended that the foregoing specification and the following claims cover such modifications and variations.

The invention claimed is:

1. An apparatus for forming an energy pattern on a target forming part of an integrated circuit, comprising:
   one or more sources of energy;
   a plurality of energy outlets for directing said one or more sources of energy to said target;
   a platform, facing said energy outlets, for mounting said target;
   a controller, for controlling said one or more sources of energy, said energy outlets, and the movement of said energy outlets with respect to said platform; and
   a mask, mounted over said energy outlets, said mask containing a shutter covering each of said energy outlets, each of said shutters being independently controlled to be open or closed by said controller;
   wherein said platform and said energy outlets are linearly and rotatably moveable with respect to each other; and
   wherein energy projected from each individual energy outlet can be controlled by said controller.

2. The apparatus of claim 1 further comprising a plurality of sensors for sensing light reflected from said target, said controller using said sensors to detect defects in said target.

3. The apparatus of claim 1 wherein said energy outlets are approximately circular in shape.

4. The apparatus of claim 3 wherein said energy outlets are arranged in an array.

5. The apparatus of claim 4 herein said energy outlets in said array of energy outlets are arranged in aligned rows and columns.

6. The apparatus of claim 5 wherein said columns ad rows are spaced from each other to reduce interference between adjacent energy outlets to a desired level.

7. The apparatus of claim 4 wherein said energy outlets in said array of energy outlets are arranged in offset rows.

8. The apparatus of claim 7 wherein each row of energy outlets is offset from adjacent rows by a distance equal to the radius of the energy outlets.

9. The apparatus of claim 1 further comprising one or more sensors for sensing a plurality of index marks on the surface of said target.

10. The apparatus of claim 9 wherein said controller uses said plurality of index marks to determine the relative position of the target and said energy outlets.

11. The apparatus of claim 1 where said controller controls said energy outlets such that no two energy outlets spaced which would cause interference with each other are turned on at the same time.

12. The apparatus of claim 11 wherein said target and said array of energy outlets can be rotated relative to each other to achieve features in said energy pattern being spaced closer together than the radius of said energy outlets.

13. A method for projecting a desired energy pattern on a target, comprising the steps of:
   positioning an array of energy outlets with respect to a target;
   independently controlling individual energy outlets in said array of energy outlets to turn on or off by opening or closing a shutter associated with each of said energy outlets;
   controlling the relative linear and rotational movement of said target and said plurality of energy outlets as said energy outlets are turned on and off; and
   sensing the position of said target with respect to said energy outlets by reading a plurality of index marks on said target to determine when to turn each of said energy outlets on or off to achieve said desired energy pattern.

14. The method of claim 13 further comprising the steps of:
   programming a controller with said desired energy pattern to be projected into said target; and
   decomposing said desired energy pattern into a series of linear and rotational movements and switching of said energy outlets on and off to achieve said desired energy pattern.

15. The method of claim 14 wherein said series of movements and switching of said energy outlets are determined such that no two energy outlets which would cause interference with each other are simultaneously turned on.

16. The method of claim 13 further comprising the steps of:
   using a plurality of sensors mounted in close proximity to said energy outlets, sensing light reflected from said target; and
   determining if a high probability of a defect exists, based on said sensed reflections.

17. The method of claim 16 further comprising the step of re-programming said series of movements and switching of energy outlets to avoid said defects while still achieving the functionality of said desired energy pattern.

18. The method of claim 16 further comprising the steps of:
   determining if less than the number of expected defects is detected; and
   re-programming said series of movements and switching of energy outlets to omit redundancies in said energy pattern in favor of adding additional features or devices.

19. The method of claim 16 further comprising the steps of:
   determining if more than the number of expected defects is detected; and
   re-programming said series of movements and switching to compensate for said excess defects.

20. The method of claim 13 wherein said step of controlling the relative rotational movement of said energy outlets and said target allows for the creation of features in said energy pattern that are smaller than the radius of said energy outlets.

* * * * *